United States Patent
Stefanopoulou et al.

(10) Patent No.: US 11,355,824 B2
(45) Date of Patent: Jun. 7, 2022

(54) DETECTION OF AN INTERNAL SHORT CIRCUIT IN A BATTERY

(71) Applicant: The Regents of The University of Michigan, Ann Arbor, MI (US)

(72) Inventors: Anna G. Stefanopoulou, Ann Arbor, MI (US); Jason B. Siegel, Ann Arbor, MI (US); Sravan Pannala, Ann Arbor, MI (US); Gregory B. Less, Ypsilanti, MI (US); Ting Cai, Ann Arbor, MI (US); Mingxuan Zhang, Beijing (CN)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 238 days.

(21) Appl. No.: 16/410,714

(22) Filed: May 13, 2019

(65) Prior Publication Data
US 2020/0313152 A1    Oct. 1, 2020

Related U.S. Application Data

(60) Provisional application No. 62/670,313, filed on May 11, 2018.

(51) Int. Cl.
*H01M 50/578* (2021.01)
*G01R 31/52* (2020.01)
(Continued)

(52) U.S. Cl.
CPC .......... *H01M 50/578* (2021.01); *B60L 58/12* (2019.02); *G01R 31/3648* (2013.01);
(Continued)

(58) Field of Classification Search
CPC .......... H01M 50/578; H01M 10/0525; H01M 10/4257; H01M 10/486
See application file for complete search history.

(56) References Cited

U.S. PATENT DOCUMENTS 8,120,325 B2    2/2012    Wolf et al.
9,142,829 B2    9/2015    Keyser et al.
(Continued)

FOREIGN PATENT DOCUMENTS

WO    WO 2017/087807    *   5/2017
WO    2017140382 A1    8/2017

OTHER PUBLICATIONS

Abada, et al., Safety Focused Modeling of Lithium-Ion Batteries: A Review, Journal of Power Sources, 2016, 306:178-192.
(Continued)

*Primary Examiner* — Olatunji A Godo
(74) *Attorney, Agent, or Firm* — Quarles & Brady LLP

(57) ABSTRACT

An electrical device comprises a battery cell; a pressure sensor for measuring swelling forces of the battery cell, optionally with voltage, temperature and current sensors, and a battery management system including a controller. The controller executes a program to: (i) determine a reference swelling force corresponding to a reference electrical signal received from the pressure sensor at an earlier reference time, (ii) determine a second swelling force corresponding to a second electrical signal received from the pressure sensor at a later second time, and (iii) determine whether a risk of internal short circuit of the battery cell exists by comparing a reference level of the reference electrical signal and a signal representative of the second electrical signal. When the signal representative of the second electrical signal exceeds the reference level of the reference electrical signal by a threshold amount, a risk of internal short circuit of the cell exists.

20 Claims, 26 Drawing Sheets

(51) Int. Cl.
  H01M 10/42    (2006.01)
  H01M 10/48    (2006.01)
  G01R 31/3842  (2019.01)
  B60L 58/12    (2019.01)
  H01M 10/0525  (2010.01)
  G01R 31/36    (2020.01)
(52) U.S. Cl.
  CPC ......... *G01R 31/3842* (2019.01); *G01R 31/52* (2020.01); *H01M 10/0525* (2013.01); *H01M 10/4257* (2013.01); *H01M 10/486* (2013.01); *H01M 2010/4271* (2013.01)

(56) References Cited

U.S. PATENT DOCUMENTS

| | | | |
|---|---|---|---|
| 9,231,416 | B2 | 1/2016 | Kim et al. |
| 9,356,325 | B1 | 5/2016 | Poirier |
| 9,444,088 | B2 | 9/2016 | Yang et al. |
| 9,869,726 | B2 | 1/2018 | Zumstein et al. |
| 2013/0093383 | A1 | 4/2013 | Kim et al. |
| 2013/0323554 | A1* | 12/2013 | Heubner ............... H01M 10/48 429/91 |
| 2014/0042961 | A1* | 2/2014 | Lan ..................... H01M 10/425 320/107 |
| 2015/0188198 | A1* | 7/2015 | Bonhomme .......... H01M 10/48 429/61 |
| 2016/0064972 | A1* | 3/2016 | Stefanopoulou ..... G01R 31/387 320/116 |
| 2017/0365840 | A1 | 12/2017 | Fan et al. |
| 2018/0062401 | A1 | 3/2018 | Quiambao et al. |

OTHER PUBLICATIONS

Cai, et al., Modeling Li-Ion Battery Thermal Runaway Using a Three Section Thermal Model, In ASME 2018 Dynamic Systems and Control Conference, DSCC2018-9086, pp V002T28A003-1 through V002T28A003-9.
Coman, et al., A Lumped Model of Venting During Thermal Runaway in a Cylindrical Lithium Cobalt Oxide Lithium-Ion Cell, Journal of Power Sources, 2016, 307:56-62.
Coman, et al., Modelling Li-Ion Cell Thermal Runaway Triggered by an Internal Short Circuit Device Using an Efficiency Factor and Arrhenius Formulations, Journal of The Electrochemical Society, 2017, 164(4):A587-A593.
Dong, et al., Numerical Modeling and Analysis of the Thermal Behavior of NCM Lithium-Ion Batteries Subjected to Very High C-Rate Discharge/Charge Operations, International Journal of Heat and Mass Transfer, 2018, 117:261-272.
Feng, et al., Thermal Runaway Features of Large Format Prismatic Lithium Ion Battery Using Extended Volume Accelerating Rate Calorimetry, Journal of Power Sources, 2014, 255:294-301.
Feng, et al., Online Internal Short Circuit Detection fora Large Format Lithium Ion Battery, Applied Energy, 2016, 161:168-180.
Feng, et al., Thermal Runaway Mechanism of Lithium Ion Battery for Electric Vehicles: A Review, Energy Storage Materials, 2018, 10:246-267.
Finegan, et al., Characterising Thermal Runaway Within Lithium-Ion Cells By Inducing and Monitoring Internal Short Circuits, Energy & Environmental Science, 2017, 10:1377-1388.
Guo, et al., Mechanism of the Entire Overdischarge Process and Overdischarge-Induced Internal Short Circuit in Lithium-Ion Batteries, Scientific Reports, 2016, 6:30248, 9 pages.
Hatchard, et al., Thermal Model of Cylindrical and Prismatic Lithium-Ion Cells, Journal of the Electrochemical Society, 2001, 148(7):A755-A761.
Keyser, et al., Development of a Novel Test Method for On-Demand Internal Short Circuit in a Li-Ion Cell, Large Lithium Ion Battery Technology and Application Symposium—Advanced Automotive Battery Conference, Jan. 25-28, 2011, 26 pages.
Kim, et al., A Three-Dimensional Thermal Abuse Model for Lithium-Ion Cells, Journal of Power Sources, 2007, 170(2):476-489.
Kim, et al., Fail-Safe Design for Large Capacity Lithium-Ion Battery Systems, Journal of Power Sources, 2012, 210: 243-253.
Kim, et al., Investigation on Internal Short Circuits of Lithium Polymer Batteries with a Ceramic-Coated Separator During Nail Penetration, Journal of Power Sources, 2015, 289:41-49.
Knobloch, et al., Fabrication of Multimeasurand Sensor for Monitoring of a Li-Ion Battery, Journal of Electronic Packaging, 2018, 140:031002-1-031002-8.
Lammer, et al., Holistic Methodology for Characterisation of the Thermally Induced Failure of Commercially Available 18650 Lithium Ion Cells, RSC Advances, 2017, 7(39):24425-24429.
Lin, et al., Online Parameterization of Lumped Thermal Dynamics in Cylindrical Lithium Ion Batteries for Core Temperature Estimation and Health Monitoring, IEEE Transactions on Control Systems Technology, 2012, 21(5):1745-1755.
Mohan, et al., A Phenomenological Model of Bulk Force in a Li-Ion Battery Pack and Its Application to State of Charge Estimation, Journal of the Electrochemical Society, 2014, 161(14):A2222-A2231.
Pannala, et al., Mechanical Measurements for Eady Detection of Thermal Runaway Induced by an Internal Short Circuit, Abstract MA Jan. 2018, p. 368, The Electrochemical Society, 2018.
Ping, et al., Thermal Behaviour Analysis of Lithium-Ion Battery at Elevated Temperature Using Deconvolution Method, Applied Energy, 2014, 129:261-273.
Ren, et al., Model-Based Thermal Runaway Prediction of Lithium-Ion Batteries from Kinetics Analysis of Cell Components, Applied Energy, 2018, 228:633-644.
Rheinfeld, et al., Quasi-Isothermal External Short Circuit Tests Applied to Lithium-Ion Cells: Part I. Measurements, Journal of The Electrochemical Society, 2018, 165(14):A3427-A3448.
Richard, et al., Accelerating Rate Calorimetry Study on the Thermal Stability of Lithium Intercalated Graphite in Electrolyte. II. Modeling the Results and Predicting Differential Scanning Calorimeter Curves, Journal of The Electrochemical Society, 1999, 146(6):2078-2084.
Spotnitz, et al., Abuse Behavior of High-Power, Lithium-Ion Cells, Journal of Power Sources, 2003, 113(1):81-100.
Yang, et al., Investigations of the Exothermic Reactions of Natural Graphite Anode for Li-Ion Batteries During Thermal Runaway, Journal of the Electrochemical Society, 2005, 152(1):A73-A79.
Yang, et al., Temperature-Dependent Lithium-Ion Diffusion and Activation Energy of Li1.2 Co0.13Ni0.13Mn0.54O2 Thin-Film Cathode at Nanoscale by Using Electrochemical Strain Microscopy, ACS Applied Materials & Interfaces, 2017, 9(16):13999-14005.
Zhang, et al., Coupled Mechanical-Electrical-Thermal Modeling for Short-Circuit Prediction in a Lithium-Ion Cell Under Mechanical Abuse, Journal of Power Sources, 2015, 290:102-113.
Zhang, et al., Fusing Phenomenon of Lithium-Ion Battery Internal Short Circuit, Journal of The Electrochemical Society, 2017, 164(12):A2738-A2745.
Zhang, et al., Internal Short Circuit Trigger Method for Lithium-Ion Battery Based on Shape Memory Alloy, Journal of the Electrochemical Society, 2017, 164(13):A3038-A3044.

* cited by examiner

DETECTION OF AN INTERNAL SHORT CIRCUIT IN A BATTERY

CROSS-REFERENCES TO RELATED APPLICATIONS

This application claims priority to U.S. Provisional Patent Application No. 62/670,313, titled "Detection of an Internal Short Circuit in a Battery" and filed on May 11, 2018, the entirety of which is incorporated herein by reference.

STATEMENT REGARDING FEDERALLY SPONSORED RESEARCH

This invention was made with government support under DE-AR0000269 awarded by the U.S. Department of Energy and under W56HZV-14-2-0001 awarded by the U.S. Army/TARDEC. The government has certain rights in the invention.

BACKGROUND OF THE INVENTION

1. Field of the Invention

This invention relates to an electrical device including a battery cell and a battery management system that detects the risk or existence of an internal short circuit and/or gas generation due to over-charging or thermal abuse in a battery cell, at least in part, on a pressure reading from a pressure sensor adjacent or contacting the battery cell.

2. Description of the Related Art

Vehicles are used to facilitate modern transportation. Different energy sources (e.g., hydrocarbon fuel, battery systems, capacitance systems, compressed air systems) can be used to generate the power needed to facilitate movement of the vehicle. Electric vehicles, also referred to as all-electric vehicles, include a battery system and utilize electric power for the entirety of their motive power. A plug in power source is needed for electric vehicles for charging.

Hybrid vehicles and plug-in hybrid electric vehicles include both an internal combustion engine and a battery system. The battery is capable of being charged from a plug-in power source. Additionally, the internal combustion engine can turn a generator, that supplies a current to an electric motor to move the vehicle.

Large lithium ion batteries are commonly used in all-electric vehicles and hybrid electric vehicles. Lithium ion batteries are significantly reactive and need electronic battery management systems to keep the battery within a safe operating window. Lithium ion batteries expand as they are charged and contract as they are discharged. These changes in volume and length are caused by the absorption and release processes of lithium ions in the active materials of the electrodes. The absorption of the lithium ions into the carbon material causes the material to expand.

Lithium intercalation and de-intercalation result in the volumetric changes in both electrodes of a lithium-ion battery cell. At the anode, carbon particles can swell by as much as 12% during lithium intercalation, and the resulting stress can be large. Commercial battery packs involve numerous cells assembled to occupy a fixed space and held in mild compression to resist changes in volume associated with lithium intercalation and de-intercalation. A small compression prevents de-lamination and associated deterioration of electronic conductivity of the electrodes. A battery pack 30 can be assembled as shown in FIG. 1. Space between the cells 34 is maintained via a plastic spacer with dimples to preserve the airflow channels and still provide a means for compressing the cells 34 which are located between compression bars 38 and end-plates 32. Cell expansion during charging is exerted against the end-plates 32. Alternatively, a compliant rubber pad can be used between the cells instead of a plastic spacer. The battery cell expansion may also be inferred by measuring the compression of the rubber pad.

In lithium ion batteries, the growth in energy density increases the risk and severity of failures due to internal short-circuiting necessitating more stringent safety requirements. Thermal runaway of lithium ion batteries is a critical safety issue. Lithium ion batteries employ a separator between the anode and the cathode to electrically separate the anode and the cathode from one another while allowing lithium ions to pass through. When the battery passes electrons through an external circuit, the permeability of the separator to lithium ions enables the battery to close the circuit. Short circuiting the separator by providing a conductive path across it allows the battery to discharge rapidly. A short circuit across the separator can result from improper charging and discharging, or cell manufacturing defects. More particularly, improper charging can lead to the deposition of metallic lithium dendrites on the surface of the anode and these dendrites grow to penetrate the separator so as to provide a conductive path for electrons from the anode to the cathode. The lower resistance of these conductive paths allows for rapid discharge and the generation of significant joule heat. Overheating and thermal runaway can result.

An internal short circuit causes self-heating of the battery and its temperature to rise. At elevated temperatures, above 130° C., side reactions, including a breakdown of the solid electrolyte interface layer, will occur. These reactions produce additional heat. The rates of these reactions are accelerated by increased temperature (positive feedback) and could lead to thermal runaway. Common hazards of battery thermal runaway include offgas, smoke, fire, and even explosion. During a thermal runaway event, the two major heat sources are joule heating from the internal short circuit and battery side reactions. The relative heat generation and heat transfer rates determine the resulting battery temperature. Earlier studies have used lumped thermal models to describe battery temperature during thermal runaway. The lumped thermal model assumes a uniform temperature distribution and one temperature state to represent the whole cell. This assumption may be valid in some cases. However, in the case of a local internal short circuit, the ohmic heat generation will be concentrated in a small area, causing a large spatial temperature gradient.

Thus, what is needed is an improved battery management system that provides for high confidence detection of gas generation and/or an internal short circuit in a battery cell.

SUMMARY OF THE INVENTION

A battery management system for high confidence detection of gas generation and/or an internal short circuit in batteries, such as lithium ion batteries, has been developed by using mechanical measurements. It was found through experiments that force measurements obtained using one or more pressure sensors that convert a level of pressure into an electrical signal, such as load sensors outside a battery pack having one or more cells, or one or more strain sensors attached on the surface of an electrode of a battery cell, exhibit a distinct increase in measured electrical output of the pressure sensor at the same time with the occurrence of an internal short circuit. The electrical signals from these pressure sensor(s) can alone, or in combination with other battery measurements (e.g., voltage, temperature, current), increase the confidence level of gas generation and/or internal short circuit detection before the battery cell ruptures and well before any significant increase in the measured battery cell surface temperature. Reducing the probability of detecting a false positive is important due to the extreme measures that sometimes are needed to contain the damage of a damaged battery cell from spreading to other battery cells in the battery pack. Such extreme measures may include ejecting the cell or flooding the entire battery pack with an inert material.

In one aspect, this disclosure provides an electrical device comprising a battery cell; a pressure sensor for measuring swelling forces of the battery cell, and a battery management system including a controller in electrical communication with the pressure sensor. The pressure sensor converts levels of pressure from the battery cell into electrical signals having a value corresponding to one of the levels of pressure. Each of the levels of pressure corresponds to a swelling force of the battery cell sensed by the pressure sensor. The controller is configured to execute a program stored in the controller to: (i) determine a reference swelling force corresponding to a reference electrical signal received from the pressure sensor at a reference time, (ii) determine a second swelling force corresponding to a second electrical signal received from the pressure sensor at a second time, wherein the second time is later than the reference time, and (iii) determine whether a risk of internal short circuit of the battery cell exists by comparing a reference level of the reference electrical signal and a signal representative of the second electrical signal. When the signal representative of the second electrical signal exceeds the reference level of the reference electrical signal by a threshold amount, a risk of internal short circuit of the battery cell exists.

In another aspect, this disclosure provides an electrical device comprising a battery cell, a pressure sensor for measuring swelling forces of the battery cell, and a battery management system including a controller in electrical communication with the pressure sensor. The pressure sensor converts levels of pressure from the battery cell into electrical signals having a value corresponding to one of the levels of pressure. Each of the levels of pressure correspond to a swelling force of the battery cell sensed by the pressure sensor. The controller is configured to execute a program stored in the controller to: (i) receive the electrical signals from the pressure sensor, (ii) compare a swelling force corresponding to each electrical signal received from the pressure sensor to a characteristic curve of measured or model predicted swelling forces of a reference battery cell of equal capacity and chemistry to the battery cell, wherein the measured or model predicted swelling forces range from a first swelling force whenever the reference battery cell is at a first state of charge to a second swelling force whenever the reference battery cell is at a second state of charge, and (iii) determine a risk of internal short circuit of the battery cell based on the comparison of each electrical signal received from the pressure sensor to the characteristic curve. A determination of risk of internal short circuit of the battery cell can be made based on the controller receiving an electrical signal indicating that a swelling force of the battery cell exceeds a measured or model predicted swelling force on the characteristic curve of measured or model predicted swelling forces of the reference battery cell (e.g., based on measured temperature and estimated state of charge).

In another aspect, this disclosure provides an electrical device comprising a battery cell; a pressure sensor for measuring swelling forces of an electrode of the battery cell, and a battery management system including a controller in electrical communication with the pressure sensor. The pressure sensor converts levels of pressure into electrical signals, wherein each electrical signal has a value corresponding to one of the levels of pressure, and each of the levels of pressure corresponds to a swelling force of the electrode of the battery cell sensed by the pressure sensor. The controller is configured to execute a program stored in the controller to: (i) determine a reference swelling force corresponding to a reference electrical signal received from the pressure sensor at a reference time, (ii) determine a second swelling force corresponding to a second electrical signal received from the pressure sensor at a second time, wherein the second time is later than the reference time, and (iii) determine whether gas generation by the battery cell exists by comparing a reference level of the reference electrical signal and a signal representative of the second electrical signal. The controller can be configured to execute the program stored in the controller to determine that gas generation by the battery cell exists when the signal representative of the second electrical signal exceeds the reference level of the reference electrical signal by a threshold amount.

In another aspect, this disclosure provides an electrical device comprising a battery cell, a pressure sensor for measuring swelling forces of an electrode of the battery cell, and a battery management system including a controller in electrical communication with the pressure sensor. The pressure sensor converts levels of pressure into electrical signals, wherein each electrical signal has a value corresponding to one of the levels of pressure. Each of the levels of pressure corresponds to a swelling force of the electrode of the battery cell sensed by the pressure sensor. The controller is configured to execute a program stored in the controller to: (i) receive the electrical signals from the pressure sensor, (ii) compare a swelling force corresponding to each electrical signal received from the pressure sensor to a characteristic curve of measured or model predicted swelling forces of a reference battery cell of equal capacity and chemistry to the battery cell, wherein the measured or model predicted swelling forces ranging from a first swelling force whenever the reference battery cell is at a first state of charge to a second swelling force whenever the reference battery cell is at a second state of charge, and (iii) determine whether gas generation by the battery cell exists based on the comparison of each electrical signal received from the pressure sensor to the characteristic curve. The controller can be configured to execute the program stored in the controller to determine whether gas generation by the battery cell exists based on receiving an electrical signal indicating that a swelling force of the battery cell exceeds a measured or model predicted swelling force on the characteristic curve of measured or model predicted swelling forces of the reference battery cell.

In another aspect, this disclosure provides a method for determining whether a risk of internal short circuit of a battery cell exists. The method comprises: (a) using a pressure sensor to measure a reference level of pressure of the battery cell at a reference time, wherein the pressure sensor converts the reference level of pressure into a reference electrical signal corresponding to a reference swelling force; (b) using the pressure sensor to measure a second level of pressure of the battery cell at a second time, wherein the pressure sensor converts the second level of pressure into a second electrical signal corresponding to a second swelling force, and wherein the second time is later than the reference time; (c) comparing a reference level of the reference electrical signal and a signal representative of the second electrical signal; and (d) when the signal representative of the second electrical signal exceeds the reference level of the reference electrical signal by a threshold amount, determining that a risk of internal short circuit or gassing due to solid electrolyte interface/anode material breakdown of the battery cell exists.

In another aspect, this disclosure provides a method for determining whether a risk of internal short circuit of a battery cell exists. The method comprises: (a) using a pressure sensor to measure swelling forces of the battery cell, wherein the pressure sensor converts levels of pressure into electrical signals, wherein each electrical signal has a value corresponding to one of the levels of pressure, wherein each of the levels of pressure corresponds to a swelling force of the battery cell sensed by the pressure sensor; and (b) comparing a swelling force corresponding to each electrical signal from the pressure sensor to a characteristic curve of measured or model predicted swelling forces of a reference battery cell of equal capacity and chemistry to the battery cell, wherein the measured or model predicted swelling forces range from a first swelling force whenever the reference battery cell is at a first state of charge to a second swelling force whenever the reference battery cell is at a second state of charge, and (c) when a swelling force of the battery cell exceeds a measured or model predicted swelling force on the characteristic curve of measured or model predicted swelling forces or model predicted swelling forces of the reference battery cell, determining that a risk of internal short circuit of the battery cell exists.

In another aspect, this disclosure provides a method for detecting gas generation by a battery cell. The method can comprise: (a) using a pressure sensor to measure a reference level of pressure of an electrode of the battery cell at a reference time, the pressure sensor converting the reference level of pressure into a reference electrical signal corresponding to a reference swelling force; (b) using the pressure sensor to measure a second level of pressure of the electrode of the battery cell at a second time, the pressure sensor converting the second level of pressure into a second electrical signal corresponding to a second swelling force, the second time being later than the reference time; (c) comparing a reference level of the reference electrical signal and a signal representative of the second electrical signal; and (d) when the signal representative of the second electrical signal exceeds the reference level of the reference electrical signal by a threshold amount, determining that gas generation by the battery cell exists.

In another aspect, this disclosure provides a method for detecting gas generation by a battery cell. The method can comprise: (a) using a pressure sensor to measure swelling forces of an electrode of the battery cell, the pressure sensor converting levels of pressure into electrical signals, each electrical signal having a value corresponding to one of the levels of pressure, each of the levels of pressure corresponding to a swelling force of the electrode of the battery cell sensed by the pressure sensor; and (b) comparing a swelling force corresponding to each electrical signal from the pressure sensor to a characteristic curve of measured or model predicted swelling forces of a reference battery cell of equal capacity and chemistry to the battery cell, the measured or model predicted swelling forces ranging from a first swelling force whenever the reference battery cell is at a first state of charge to a second swelling force whenever the reference battery cell is at a second state of charge, and (c) when a swelling force of the battery cell exceeds a measured or model predicted swelling force on the characteristic curve of measured or model predicted swelling forces of the reference battery cell, determining that gas generation by the battery cell exists.

These and other features, aspects, and advantages of the present invention will become better understood upon consideration of the following detailed description, drawings and appended claims.

DETAILED DESCRIPTION OF THE INVENTION

Figure 1:
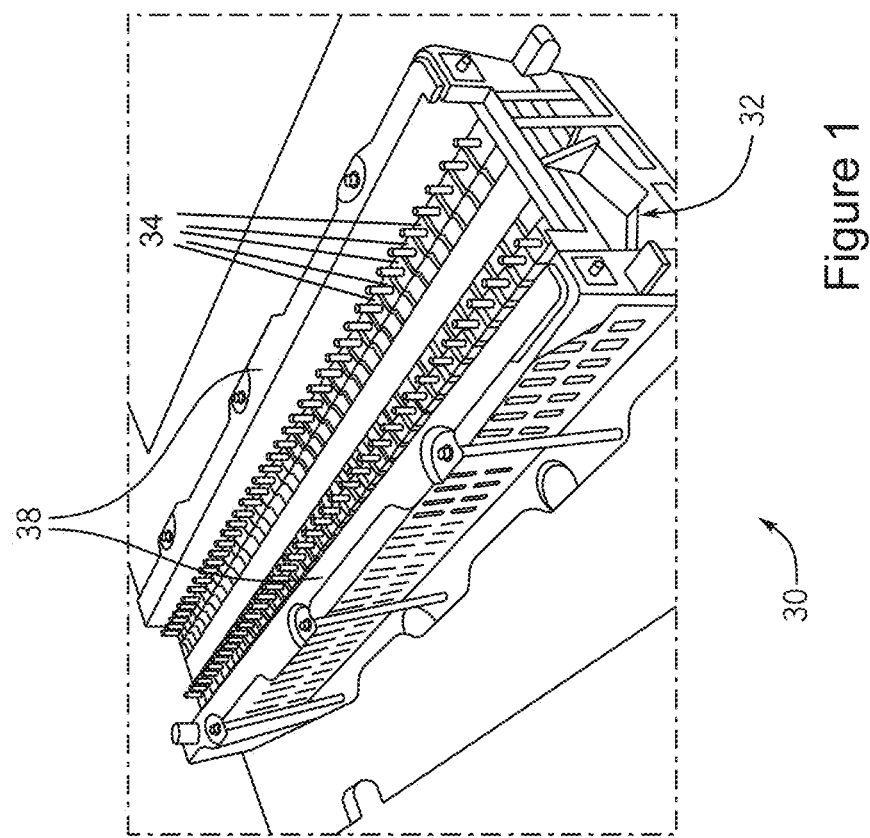
FIG. 1 shows a drawing of battery cells under compression in a hybrid electric vehicle battery pack.

An electrical device of the invention including a battery pack and a battery management system has many uses. In one non-limiting example, the electrical device including a battery pack and a battery management system is used in electric vehicles. Hybrid electric vehicles use both high voltage battery power for traction, and an internal combustion engine for propulsion and for battery charging via a generator. Plug-in electric vehicles can be charged from an external source of electricity, and the stored energy is used to power the vehicle. Battery management systems for electric vehicles may include an electronic controller to monitor various parameters associated with the operation of the battery pack. The controller may include a microprocessor under the control of a software program stored in the controller memory. Temperature, pressure, current, voltage, capacity, and so forth can be monitored by the controller of the battery management system.

In one non-limiting example embodiment, this disclosure provides an electrical device comprising a battery cell; a pressure sensor for measuring swelling forces of the battery cell, and a battery management system including a controller in electrical communication with the pressure sensor. The pressure sensor converts levels of pressure from the battery cell into electrical signals having a value corresponding to one of the levels of pressure. Each of the levels of pressure corresponds to a swelling force of the battery cell sensed by the pressure sensor. The controller is configured to execute a program stored in the controller to: (i) determine a reference swelling force corresponding to a reference electrical signal received from the pressure sensor at a reference time, (ii) determine a second swelling force corresponding to a second electrical signal received from the pressure sensor at a second time, wherein the second time is later than the reference time, and (iii) determine whether a risk of internal short circuit of the battery cell exists by comparing a reference level of the reference electrical signal and a signal representative of the second electrical signal. The second electrical signal can be received by the controller less than one second after the reference electrical signal is received by the controller. In one non-limiting example embodiment, a sampling rate of 80 Hz is used. The second electrical signal and the reference electrical signal may be one sample or a collection of samples. When the signal representative of the second electrical signal exceeds the reference level of the reference electrical signal by a threshold amount (for example, by 250% of the reference electrical signal), a risk of internal short circuit or cell gas-generation and venting which are precursors to thermal runaway of the battery cell exists. The controller can initiate an alert that a risk of internal short circuit of the battery cell exists, such as a visual alert for the user of the device. The signal representative of the second electrical signal, which corresponds to the second swelling force, may be an actual signal. Alternatively, the signal representative of the second electrical signal may be a derivative of the second electrical signal versus time. The reference level of the reference electrical signal can be a derivative of the reference electrical signal versus time. The derivative may depend on dT/dt (derivative of the temperature versus time) and dSOC/dt (derivative of the state of charge versus time) (i.e., changing/discharging rate).

In this non-limiting example embodiment of the invention, one can use force measurements obtained using one or more pressure sensors that convert a level of pressure of a battery cell into an electrical signals, and monitor the force measurements over time for a distinct increase in measured electrical output of the pressure sensor(s). The distinct increase in measured electrical output of the pressure sensor(s) can occur at the same time with the occurrence of gas generation due to breakdown of the solid electrolyte interface layer at elevated temperature due to an internal short circuit, which is a precursor to thermal runaway in a battery cell, such as a lithium ion battery cell.

The device can further comprise a voltage sensor wired to measure a voltage level of the battery cell, wherein the controller is in electrical communication with the voltage sensor, and the controller executes the program stored in the controller to determine whether a risk of internal short circuit of the battery cell exists by comparing a reference voltage level received from the voltage sensor at the reference time and a second voltage level received from the voltage sensor at the second time. The controller is configured to execute the program stored in the controller to determine that a risk of internal short circuit of the battery cell exists when the second voltage level drops below the reference voltage level by a predetermined amount. Alternatively, a signal representative of the second voltage level (e.g., a derivative of the second voltage level versus time) can be compared to the reference voltage level. Alternatively, a signal representative of the second voltage level (e.g., a derivative of the second voltage level versus time) can be compared to a signal representative of the reference voltage level (e.g., a derivative of the reference voltage level versus time).

The device can further comprise a temperature sensor wired to measure a temperature level of the battery cell, wherein the controller is in electrical communication with the temperature sensor, and wherein the controller executes the program stored in the controller to determine whether a risk of internal short circuit of the battery cell exists by comparing a reference temperature level received from the temperature sensor at the reference time and a second temperature level received from the temperature sensor at the second time. The pressure sensor and the temperature sensor can comprise an integrated sensor. Alternatively, a signal representative of the second temperature level (e.g., a derivative of the second temperature level versus time) can be compared to the reference temperature level. Alternatively, a signal representative of the second temperature level (e.g., a derivative of the second temperature level versus time) can be compared to a signal representative of the reference temperature level (e.g., a derivative of the reference temperature level versus time).

The device can further comprise a current sensor wired to measure a current level of the battery cell, wherein the controller is in electrical communication with the current sensor, and wherein the controller executes the program stored in the controller to determine whether a risk of internal short circuit of the battery cell exists by comparing a reference current level received from the current sensor at the reference time and a second current level received from the current sensor at the second time. Alternatively, a signal representative of the second current level (e.g., a derivative of the second current level versus time) can be compared to the reference current level. Alternatively, a signal representative of the second current level (e.g., a derivative of the second current level versus time) can be compared to a signal representative of the reference current level (e.g., a derivative of the current voltage level versus time).

In the device, the battery cell can be one of a plurality of cells of a battery pack. The battery pack can comprise a plurality of cells held in compression between a first plate and an opposed second plate wherein the pressure sensor is adjacent an outer side of the first plate. The pressure sensor can comprise a load cell. Alternatively, the pressure sensor can contact an electrode of the battery cell. The pressure sensor can comprise a capacitive or inductive proximity sensor such as an eddy current sensor. The device may also comprise a first pressure sensor adjacent an outer side of the first plate and a second pressure sensor contacting an electrode of the battery cell. Other types of pressure sensors that convert levels of pressure from the battery cell into electrical signals are suitable such as piezoelectric sensors and capacitive pressure sensors.

In one version of the device, the battery pack is a lithium ion battery pack. The battery pack may include a single cell or a plurality of cells. The battery pack may include a plurality of prismatic cells. Each prismatic cell may comprise a positive electrode selected from lithium nickel manganese cobalt oxide, lithium manganese oxide, and lithium iron phosphate, a negative electrode selected from graphite, lithium titanate, hard carbon, tin/cobalt alloy, and silicon carbon, and an electrolyte selected from lithium salts such as $LiPF_6$, $LiBF_4$, and $LiClO_4$.

In another version of the device, the battery pack comprises a first plate and an opposed second plate. An inner side of the first plate is in contact with a first end of the plurality of cells of the battery pack, and an inner side of the second plate is in contact with a second end of the plurality of cells of the battery pack. One or more adjustable connectors can be used to keep the first plate and the second plate in contact with the plurality of cells of the battery pack. In the electrical device, the pressure sensor can be a load cell on one of the battery plates. The load cell senses bulk force change of the plurality of cells of the battery pack which are between the first plate and the second plate. In one version of the device, the load cell is adjacent an outer side of the first plate. The load cell provides electrical signals to the battery management system.

In another non-limiting example embodiment, this disclosure provides an electrical device comprising a battery cell; a pressure sensor for measuring swelling forces of the battery cell, and a battery management system including a controller in electrical communication with the pressure sensor. The pressure sensor converts levels of pressure from the battery cell into electrical signals having a value corresponding to one of the levels of pressure. Each of the levels of pressure corresponds to a swelling force of the battery cell sensed by the pressure sensor. The controller is configured to execute a program stored in the controller to: (i) receive the electrical signals from the pressure sensor, (ii) compare a swelling force corresponding to each electrical signal received from the pressure sensor to a characteristic curve of measured or model predicted swelling forces of a reference battery cell of equal capacity and chemistry to the battery cell, wherein the measured or model predicted swelling forces range from a first swelling force whenever the reference battery cell is at a first state of charge to a second swelling force whenever the reference battery cell is at a second state of charge, and (iii) determine a risk of internal short circuit of the battery cell based on the comparison of each electrical signal received from the pressure sensor to the characteristic curve. A determination of risk of internal short circuit of the battery cell can be made based on the controller receiving an electrical signal indicating that a swelling force of the battery cell exceeds a measured or model predicted swelling force on the characteristic curve of measured or model predicted swelling forces of the reference battery cell.

In this non-limiting example embodiment, the first state of charge can a minimum swelling force whenever the reference battery cell is completely discharged, and the second state of charge can be a maximum swelling force whenever the reference battery cell is completely charged. A plurality of characteristic curves of measured or model predicted swelling forces corresponding to the reference battery cell can be stored in the controller, and each of the plurality of characteristic curves can be based on measured or model predicted swelling forces of the reference battery cell after different numbers of charge/discharge cycles of the reference battery cell. The controller is configured to execute the program stored in the controller to compare a swelling force corresponding to each electrical signal received from the pressure sensor to one of the plurality of characteristic curves of based a number of charge/discharge cycles experienced by the battery cell. The characteristic curve of measured or model predicted swelling forces of the reference battery cell stored in the controller can correspond to a battery cell without an internal short circuit.

A plurality of characteristic curves of measured or model predicted swelling forces corresponding to a plurality of different reference battery cells can be stored in the controller, and the controller can be configured to execute the program stored in the controller to compare a swelling force corresponding to each electrical signal received from the pressure sensor to one of the plurality of characteristic curves of measured or model predicted swelling forces of one of the plurality of different reference battery cells.

In this non-limiting example embodiment, the device can further comprise a voltage sensor wired to measure a voltage level of the battery cell, wherein the controller is in electrical communication with the voltage sensor, and wherein the controller executes the program stored in the controller to determine whether a risk of internal short circuit of the battery cell exists by comparing a reference voltage level received from the voltage sensor at a reference time and a second voltage level received from the voltage sensor at a second time later than the reference time. The controller can be configured to execute the program stored in the controller to determine that a risk of internal short circuit of the battery cell exists when the second voltage level drops below the reference voltage level by a predetermined amount. Alternatively, a signal representative of the second voltage level (e.g., a derivative of the second voltage level versus time) can be compared to the reference voltage level. Alternatively, a signal representative of the second voltage level (e.g., a derivative of the second voltage level versus time) can be compared to a signal representative of the reference voltage level (e.g., a derivative of the reference voltage level versus time).

In this non-limiting example embodiment, the device can further comprise a temperature sensor wired to measure a temperature level of the battery cell, wherein the controller is in electrical communication with the temperature sensor. The controller can execute the program stored in the controller to determine whether a risk of internal short circuit of the battery cell exists by comparing a reference temperature level received from the temperature sensor at a reference time and a second temperature level received from the temperature sensor at a second time later than the reference time. Alternatively, a signal representative of the second temperature level (e.g., a derivative of the second temperature level versus time) can be compared to the reference temperature level. Alternatively, a signal representative of the second temperature level (e.g., a derivative of the second temperature level versus time) can be compared to a signal representative of the reference temperature level (e.g., a derivative of the reference temperature level versus time).

In this non-limiting example embodiment, the device can further comprise a current sensor wired to measure a current level of the battery cell, wherein the controller is in electrical communication with the current sensor. The controller can execute the program stored in the controller to determine whether a risk of internal short circuit of the battery cell exists by comparing a reference current level received from the current sensor at a reference time and a second current level received from the current sensor at a second time later than the reference time. Alternatively, a signal representative of the second current level (e.g., a derivative of the second current level versus time) can be compared to the reference current level. Alternatively, a signal representative of the second current level (e.g., a derivative of the second current level versus time) can be compared to a signal representative of the reference current level (e.g., a derivative of the current voltage level versus time).

In this non-limiting example device, the battery cell can be one of a plurality of cells of a battery pack. The battery pack can comprise a plurality of cells held in compression between a first plate and an opposed second plate wherein the pressure sensor is adjacent an outer side of the first plate. The pressure sensor can comprise a load cell. Alternatively, the pressure sensor can contact an electrode of the battery cell. The pressure sensor can comprise a capacitive or inductive proximity sensor such as an eddy current sensor. The device may also comprise a first pressure sensor adjacent an outer side of the first plate and a second pressure sensor contacting an electrode of the battery cell. Other types of pressure sensors that convert levels of pressure from the battery cell into electrical signals are suitable such as piezoelectric sensors and capacitive pressure sensors.

In one version of the device, the battery pack is a lithium ion battery pack. The battery pack may include a single cell or a plurality of cells. The battery pack may include a plurality of prismatic cells. Each prismatic cell may comprise a positive electrode selected from lithium nickel manganese cobalt oxide, lithium manganese oxide, and lithium iron phosphate, a negative electrode selected from graphite, lithium titanate, hard carbon, tin/cobalt alloy, and silicon carbon, and an electrolyte selected from lithium salts such as $LiPF_6$, $LiBF_4$, and $LiClO_4$.

In another version of the device, the battery pack comprises a first plate and an opposed second plate. An inner side of the first plate is in contact with a first end of the plurality of cells of the battery pack, and an inner side of the second plate is in contact with a second end of the plurality of cells of the battery pack. One or more adjustable connectors can be used to keep the first plate and the second plate in contact with the plurality of cells of the battery pack. In the electrical device, the pressure sensor can be a load cell on one of the battery plates. The load cell senses volume change of the plurality of cells of the battery pack which are between the first plate and the second plate. In one version of the device, the load cell is adjacent an outer side of the first plate. The load cell provides electrical signals to the battery management system.

In another non-limiting example embodiment, this disclosure provides an electrical device comprising a battery cell, such as a lithium ion battery cell; a pressure sensor for measuring swelling forces of an electrode of the battery cell, and a battery management system including a controller in electrical communication with the pressure sensor. The pressure sensor converts levels of pressure into electrical signals, wherein each electrical signal has a value corresponding to one of the levels of pressure, and each of the levels of pressure corresponds to a swelling force of the electrode of the battery cell sensed by the pressure sensor. The controller is configured to execute a program stored in the controller to: (i) determine a reference swelling force corresponding to a reference electrical signal received from the pressure sensor at a reference time, (ii) determine a second swelling force corresponding to a second electrical signal received from the pressure sensor at a second time, wherein the second time is later than the reference time, and (iii) determine whether gas generation by the battery cell exists by comparing a reference level of the reference electrical signal and a signal representative of the second electrical signal. The controller can be configured to execute the program stored in the controller to determine that gas generation by the battery cell exists when the signal representative of the second electrical signal exceeds the reference level of the reference electrical signal by a threshold amount. The second electrical signal can be received by the controller less than one second after the reference electrical signal is received by the controller.

In this non-limiting example embodiment, the signal representative of the second electrical signal can be an actual signal. The signal representative of the second electrical signal can be a derivative of the second electrical signal versus time. The reference level of the reference electrical signal can be a derivative of the reference electrical signal versus time.

In this non-limiting example embodiment, the device can further comprise a voltage sensor wired to measure a voltage level of the battery cell, and the controller is in electrical communication with the voltage sensor. The controller executes the program stored in the controller to determine whether gas generation by the battery cell exists by comparing a reference voltage level received from the voltage sensor at the reference time and a second voltage level received from the voltage sensor at the second time. The controller can be configured to execute the program stored in the controller to determine that gas generation by the battery cell exists when the second voltage level drops below the reference voltage level by a predetermined amount. Alternatively, a signal representative of the second voltage level (e.g., a derivative of the second voltage level versus time) can be compared to the reference voltage level.

Alternatively, a signal representative of the second voltage level (e.g., a derivative of the second voltage level versus time) can be compared to a signal representative of the reference voltage level (e.g., a derivative of the reference voltage level versus time).

In this non-limiting example embodiment, the device can further comprise a temperature sensor wired to measure a temperature level of the battery cell, and the controller is in electrical communication with the temperature sensor. The controller executes the program stored in the controller to determine whether gas generation by the battery cell exists by comparing a reference temperature level received from the temperature sensor at the reference time and a second temperature level received from the temperature sensor at the second time. The pressure sensor and the temperature sensor can comprise an integrated sensor. Alternatively, a signal representative of the second temperature level (e.g., a derivative of the second temperature level versus time) can be compared to the reference temperature level. Alternatively, a signal representative of the second temperature level (e.g., a derivative of the second temperature level versus time) can be compared to a signal representative of the reference temperature level (e.g., a derivative of the reference temperature level versus time).

In this non-limiting example embodiment, the device can further comprise a current sensor wired to measure a current level of the battery cell, and the controller is in electrical communication with the current sensor. The controller executes the program stored in the controller to determine whether gas generation by the battery cell exists by comparing a reference current level received from the current sensor at the reference time and a second current level received from the current sensor at the second time. Alternatively, a signal representative of the second current level (e.g., a derivative of the second current level versus time) can be compared to the reference current level. Alternatively, a signal representative of the second current level (e.g., a derivative of the second current level versus time) can be compared to a signal representative of the reference current level (e.g., a derivative of the current voltage level versus time).

In the device, the battery cell can be one of a plurality of cells of a battery pack. The battery pack can comprise a plurality of cells held in compression between a first plate and an opposed second plate wherein the pressure sensor is adjacent an outer side of the first plate. The pressure sensor can comprise a load cell. Alternatively, the pressure sensor can contact an electrode of the battery cell. The pressure sensor can comprise a capacitive or inductive proximity sensor such as an eddy current sensor. The device may also comprise a first pressure sensor adjacent an outer side of the first plate and a second pressure sensor contacting an electrode of the battery cell.

In another non-limiting example embodiment, this disclosure provides an electrical device comprising a battery cell, such as a lithium ion battery cell, a pressure sensor for measuring swelling forces of an electrode of the battery cell, and a battery management system including a controller in electrical communication with the pressure sensor. The pressure sensor converts levels of pressure into electrical signals, wherein each electrical signal has a value corresponding to one of the levels of pressure. Each of the levels of pressure corresponds to a swelling force of the electrode of the battery cell sensed by the pressure sensor. The controller is configured to execute a program stored in the controller to: (i) receive the electrical signals from the pressure sensor, (ii) compare a swelling force corresponding to each electrical signal received from the pressure sensor to a characteristic curve of measured or model predicted swelling forces of a reference battery cell of equal capacity and chemistry to the battery cell, wherein the measured or model predicted swelling forces ranging from a first swelling force whenever the reference battery cell is at a first state of charge to a second swelling force whenever the reference battery cell is at a second state of charge, and (iii) determine whether gas generation by the battery cell exists based on the comparison of each electrical signal received from the pressure sensor to the characteristic curve. The controller can be configured to execute the program stored in the controller to determine whether gas generation by the battery cell exists based on receiving an electrical signal indicating that a swelling force of the battery cell exceeds a measured or model predicted swelling force on the characteristic curve of measured or model predicted swelling forces of the reference battery cell. The first state of charge can be a minimum swelling force whenever the reference battery cell is completely discharged, and the second state of charge can be a maximum swelling force whenever the reference battery cell is completely charged.

In this non-limiting example embodiment, a plurality of characteristic curves of measured or model predicted swelling forces corresponding to the reference battery cell can be stored in the controller, wherein each of the plurality of characteristic curves is based on measured or model predicted swelling forces of the reference battery cell after different numbers of charge/discharge cycles of the reference battery cell, The controller can be configured to execute the program stored in the controller to compare a swelling force corresponding to each electrical signal received from the pressure sensor to one of the plurality of characteristic curves of based a number of charge/discharge cycles experienced by the battery cell. The characteristic curve of measured or model predicted swelling forces of the reference battery cell stored in the controller can correspond to a battery cell without gas generation. A plurality of characteristic curves of measured or model predicted swelling forces corresponding to a plurality of different reference battery cells can be stored in the controller, and the controller can be configured to execute the program stored in the controller to compare a swelling force corresponding to each electrical signal received from the pressure sensor to one of the plurality of characteristic curves of measured or model predicted swelling forces of one of the plurality of different reference battery cells.

In this non-limiting example embodiment, the device can further comprise a voltage sensor wired to measure a voltage level of the battery cell, and the controller is in electrical communication with the voltage sensor. The controller executes the program stored in the controller to determine whether gas generation by the battery cell exists by comparing a reference voltage level received from the voltage sensor at the reference time and a second voltage level received from the voltage sensor at the second time. The controller can be configured to execute the program stored in the controller to determine that gas generation by the battery cell exists when the second voltage level drops below the reference voltage level by a predetermined amount. Alternatively, a signal representative of the second voltage level (e.g., a derivative of the second voltage level versus time) can be compared to the reference voltage level. Alternatively, a signal representative of the second voltage level (e.g., a derivative of the second voltage level versus time) can be compared to a signal representative of the reference voltage level (e.g., a derivative of the reference voltage level versus time).

In this non-limiting example embodiment, the device can further comprise a temperature sensor wired to measure a temperature level of the battery cell, and the controller is in electrical communication with the temperature sensor. The controller executes the program stored in the controller to determine whether gas generation by the battery cell exists by comparing a reference temperature level received from the temperature sensor at the reference time and a second temperature level received from the temperature sensor at the second time. The pressure sensor and the temperature sensor can comprise an integrated sensor. Alternatively, a signal representative of the second temperature level (e.g., a derivative of the second temperature level versus time) can be compared to the reference temperature level. Alternatively, a signal representative of the second temperature level (e.g., a derivative of the second temperature level versus time) can be compared to a signal representative of the reference temperature level (e.g., a derivative of the reference temperature level versus time).

In this non-limiting example embodiment, the device can further comprise a current sensor wired to measure a current level of the battery cell, and the controller is in electrical communication with the current sensor. The controller executes the program stored in the controller to determine whether gas generation by the battery cell exists by comparing a reference current level received from the current sensor at the reference time and a second current level received from the current sensor at the second time. Alternatively, a signal representative of the second current level (e.g., a derivative of the second current level versus time) can be compared to the reference current level. Alternatively, a signal representative of the second current level (e.g., a derivative of the second current level versus time) can be compared to a signal representative of the reference current level (e.g., a derivative of the current voltage level versus time).

In the device, the battery cell can be one of a plurality of cells of a battery pack. The battery pack can comprise a plurality of cells held in compression between a first plate and an opposed second plate wherein the pressure sensor is adjacent an outer side of the first plate. The pressure sensor can comprise a load cell. Alternatively, the pressure sensor can contact an electrode of the battery cell. The pressure sensor can comprise a capacitive or inductive proximity sensor such as an eddy current sensor. The device may also comprise a first pressure sensor adjacent an outer side of the first plate and a second pressure sensor contacting an electrode of the battery cell.

Figure 4A:
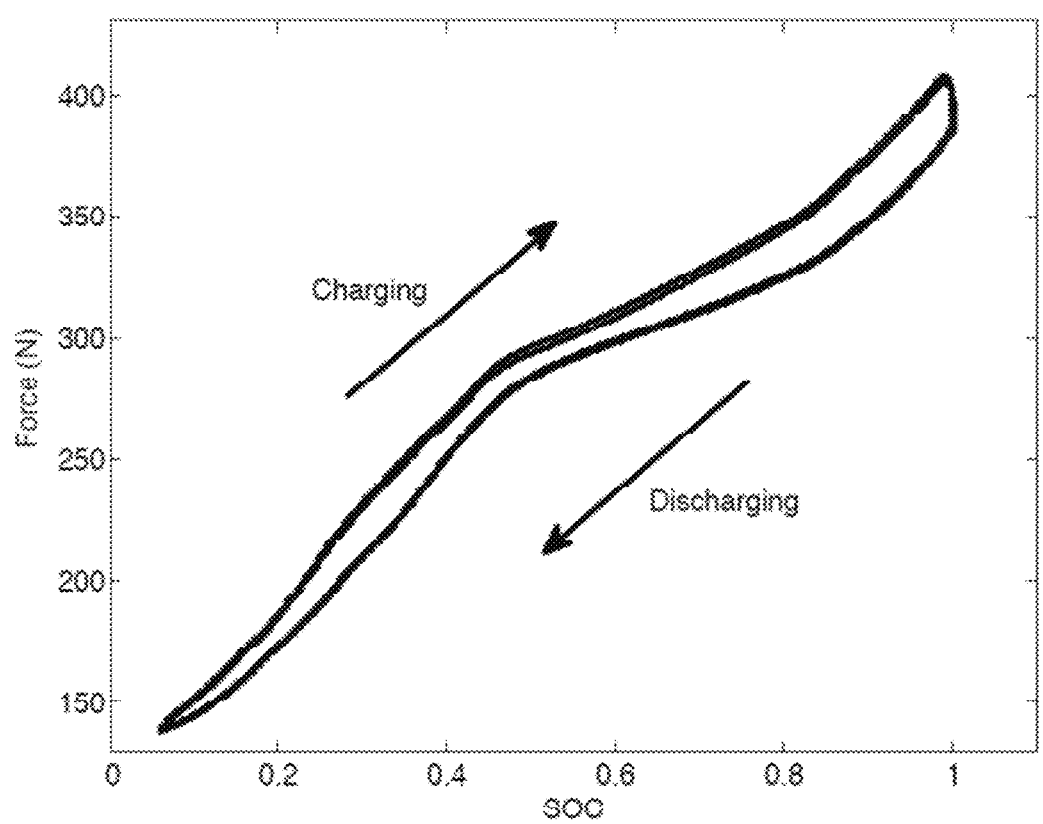
FIG. 4A is a measured bulk force vs. state of charge (SOC) graph obtained when a lithium nickel manganese cobalt oxide cell was cycled using a 1 C current with an ambient temperature of 25° C.

Looking at FIG. 4A, there is shown a measured bulk force versus state of charge (SOC) graph obtained when a lithium nickel manganese cobalt oxide cell was cycled using a 1 C current with an ambient temperature of 25° C. FIG. 4A is taken from a study reported in U.S. Patent Application Publication No. 2016/0064972 to Stefanopoulou et al., which is incorporated herein by reference. State of charge in FIG. 4A is shown running from 0 to 1 but also could be depicted on a 0% to 100% scale. As shown in FIG. 4A, lithium ion batteries expand as they are charged and contract as they are discharged leading to a characteristic curve of measured bulk force versus state of charge. An increase in electrical output of the pressure sensor(s) measuring force will occur during charging of the lithium ion battery. A decrease in electrical output of the pressure sensor(s) measuring force will occur during discharging of the lithium ion battery.

Figure 4B:
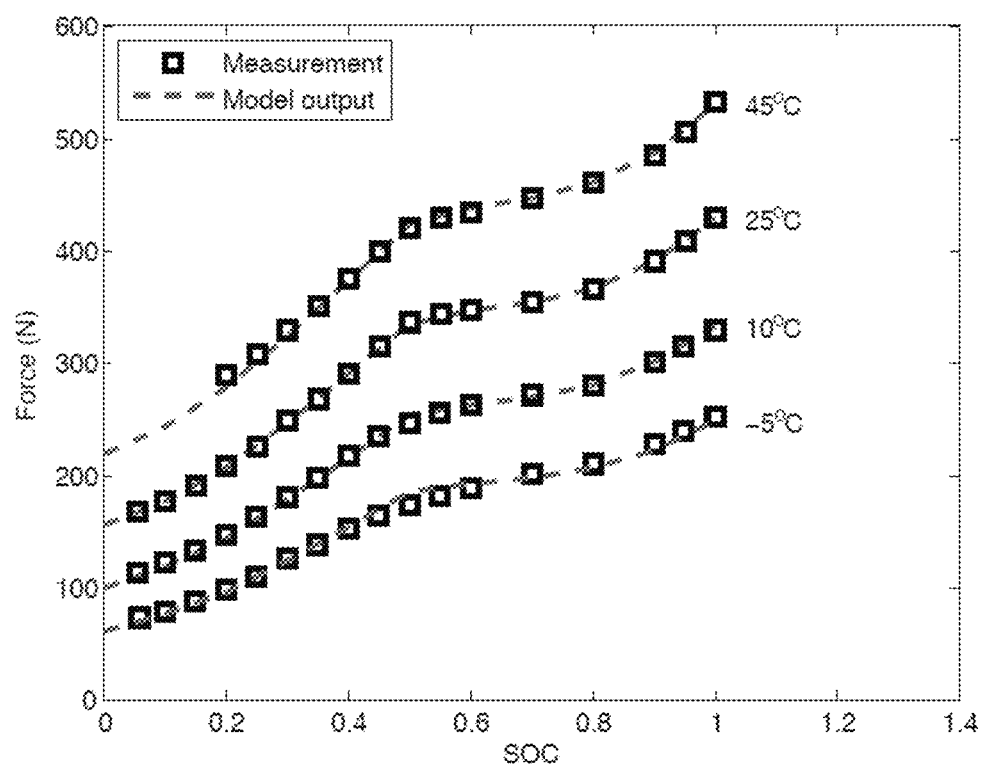
FIG. 4B is a graph showing the measured force at various states of charge and temperature compared with a predicted bulk force at steady state.

Looking at FIG. 4B, there is shown a graph showing the measured force at various states of charge (SOC) and temperatures compared with a predicted bulk force at steady state. FIG. 4B is taken from a study reported in U.S. Patent Application Publication No. 2016/0064972 to Stefanopoulou et al. State of charge in FIG. 4B is shown running from 0 to 1 but also could be depicted on a 0% to 100% scale. As shown in FIG. 4B, lithium ion batteries expand as they are charged and contract as they are discharged differently at different temperatures leading to different characteristic curves of measured bulk force versus state of charge at different temperatures.

Preferably, one seeks to distinguish between an increase in measured electrical output of the battery cell pressure sensor due to charging of the battery cell and a distinct increase in measured electrical output of the battery cell pressure sensor due to gas generation and/or an internal short circuit. The expected increases in measured electrical output of a battery cell pressure sensor in an undamaged battery cell due to charging of the undamaged battery cell can be readily obtained in a controller from stored characteristic curves such as that shown in FIGS. 4A and 4B. The expected increases in measured electrical output of an undamaged battery cell pressure sensor can be distinguished from a distinct increase in measured electrical output of the battery cell pressure sensor due to gas generation and/or an internal short circuit. Likewise, decreases in measured electrical output due to discharging of an undamaged battery cell pressure sensor can be distinguished from a distinct increase in measured electrical output of the battery cell pressure sensor due to gas generation and/or an internal short circuit.

U.S. Patent Application Publication No. 2016/0064972 also reports that irreversible swelling related to battery degradation leads to a gradual increase in measured bulk force. Thus, characteristic curves similar to FIGS. 4A and 4B can be created for a battery that has experienced different numbers of charge/discharge cycles. For example, one can create a first measured bulk force versus state of charge characteristic curve for a battery having experienced one thousand cycles and a second measured bulk force versus state of charge characteristic curve for a battery having experienced three thousand cycles. Of course, any number of characteristic curves can be created for different levels of cycles at different temperatures. Also, characteristic curves similar to FIGS. 4A and 4B can be created for any number of batteries having different capacities and chemistries. The characteristic curves can all be stored in the controller. The characteristic curves can also be created from a physics based model that translates solid electrolyte interface growth into irreversible thickness growth of the electrode and the resulting increase in pressure observed when the cell is constrained from freely swelling.

The program stored in the controller can determine a reference swelling force of a battery cell at an earlier reference time, determine a second swelling force of the battery cell at a later second time, locate the reference swelling force on a characteristic curve of the battery cell, and determine whether an expected increase in swelling force due to charging has occurred between the earlier reference time and the later second time, or whether an unexpected distinct increase in swelling force due to gas generation and/or an internal short circuit has occurred between the earlier reference time and the later second time.

Also, the program stored in the controller can store data on the number of cycles experienced by a battery cell and use a characteristic curve for a battery having experienced a certain number of cycles. Likewise, the program stored in the controller can store data on the capacity and chemistry of a battery cell and use characteristic curves for a battery having that capacity and chemistry at different temperatures.

In another non-limiting example embodiment, this disclosure provides a method for determining whether a risk of internal short circuit of a battery cell exists. The method comprises: (a) using a pressure sensor to measure a reference level of pressure of the battery cell at a reference time, wherein the pressure sensor converts the reference level of pressure into a reference electrical signal corresponding to a reference swelling force; (b) using the pressure sensor to measure a second level of pressure of the battery cell at a second time, wherein the pressure sensor converts the second level of pressure into a second electrical signal corresponding to a second swelling force, and wherein the second time is later than the reference time; (c) comparing a reference level of the reference electrical signal and a signal representative of the second electrical signal; and (d) when the signal representative of the second electrical signal exceeds the reference level of the reference electrical signal by a threshold amount (for example, by 250% of the reference level of the reference electrical signal), determining that a risk of internal short circuit of the battery cell exists. The signal representative of the second electrical signal may be an actual signal. Alternatively, the signal representative of the second electrical signal may be a derivative of the second electrical signal versus time. The reference level of the reference electrical signal can be an actual signal or a derivative of the reference electrical signal versus time. In this non-limiting example embodiment of the method, the battery cell can be one of a plurality of cells of a battery pack. The battery pack may comprise a plurality of cells held in compression between a first plate and an opposed second plate wherein the pressure sensor is adjacent an outer side of the first plate and the pressure sensor comprises a load cell.

In another non-limiting example embodiment, this disclosure provides a method for determining whether a risk of internal short circuit of a battery cell exists. The method comprises: (a) using a pressure sensor to measure swelling forces of the battery cell, wherein the pressure sensor converts levels of pressure into electrical signals, wherein each electrical signal has a value corresponding to one of the levels of pressure, wherein each of the levels of pressure corresponds to a swelling force of the battery cell sensed by the pressure sensor; and (b) comparing a swelling force corresponding to each electrical signal from the pressure sensor to a characteristic curve of measured or model predicted swelling forces of a reference battery cell of equal capacity and chemistry to the battery cell, wherein the measured or model predicted swelling forces range from a first swelling force whenever the reference battery cell is at a first state of charge to a second swelling force whenever the reference battery cell is at a second state of charge, and (c) when a swelling force of the battery cell exceeds a measured or model predicted swelling force on the characteristic curve of measured or model predicted swelling forces of the reference battery cell, determining that a risk of internal short circuit of the battery cell exists. In this non-limiting example embodiment of the method, the battery cell can be one of a plurality of cells of a battery pack. The battery pack may comprise a plurality of cells held in compression between a first plate and an opposed second plate wherein the pressure sensor is adjacent an outer side of the first plate and the pressure sensor comprises a load cell.

In another non-limiting example embodiment, this disclosure provides a method for detecting gas generation by a battery cell, such as a lithium ion battery cell. The method can comprise: (a) using a pressure sensor to measure a reference level of pressure of an electrode of the battery cell at a reference time, the pressure sensor converting the reference level of pressure into a reference electrical signal corresponding to a reference swelling force; (b) using the pressure sensor to measure a second level of pressure of the electrode of the battery cell at a second time, the pressure sensor converting the second level of pressure into a second electrical signal corresponding to a second swelling force, the second time being later than the reference time; (c) comparing a reference level of the reference electrical signal and a signal representative of the second electrical signal; and (d) when the signal representative of the second electrical signal exceeds the reference level of the reference electrical signal by a threshold amount, determining that gas generation by the battery cell exists. The signal representative of the second electrical signal can be an actual signal. The signal representative of the second electrical signal can be a derivative of the second electrical signal versus time. The reference level of the reference electrical signal can be a derivative of the reference electrical signal versus time.

In another non-limiting example embodiment, this disclosure provides a method for detecting gas generation by a battery cell, such as a lithium ion battery cell. The method can comprise: (a) using a pressure sensor to measure swelling forces of an electrode of the battery cell, the pressure sensor converting levels of pressure into electrical signals, each electrical signal having a value corresponding to one of the levels of pressure, each of the levels of pressure corresponding to a swelling force of the electrode of the battery cell sensed by the pressure sensor; and (b) comparing a swelling force corresponding to each electrical signal from the pressure sensor to a characteristic curve of measured or model predicted swelling forces of a reference battery cell of equal capacity and chemistry to the battery cell, the measured or model predicted swelling forces ranging from a first swelling force whenever the reference battery cell is at a first state of charge to a second swelling force whenever the reference battery cell is at a second state of charge, and (c) when a swelling force of the battery cell exceeds a measured or model predicted swelling force on the characteristic curve of measured or model predicted swelling forces of the reference battery cell, determining that gas generation by the battery cell exists.

Figure 5:
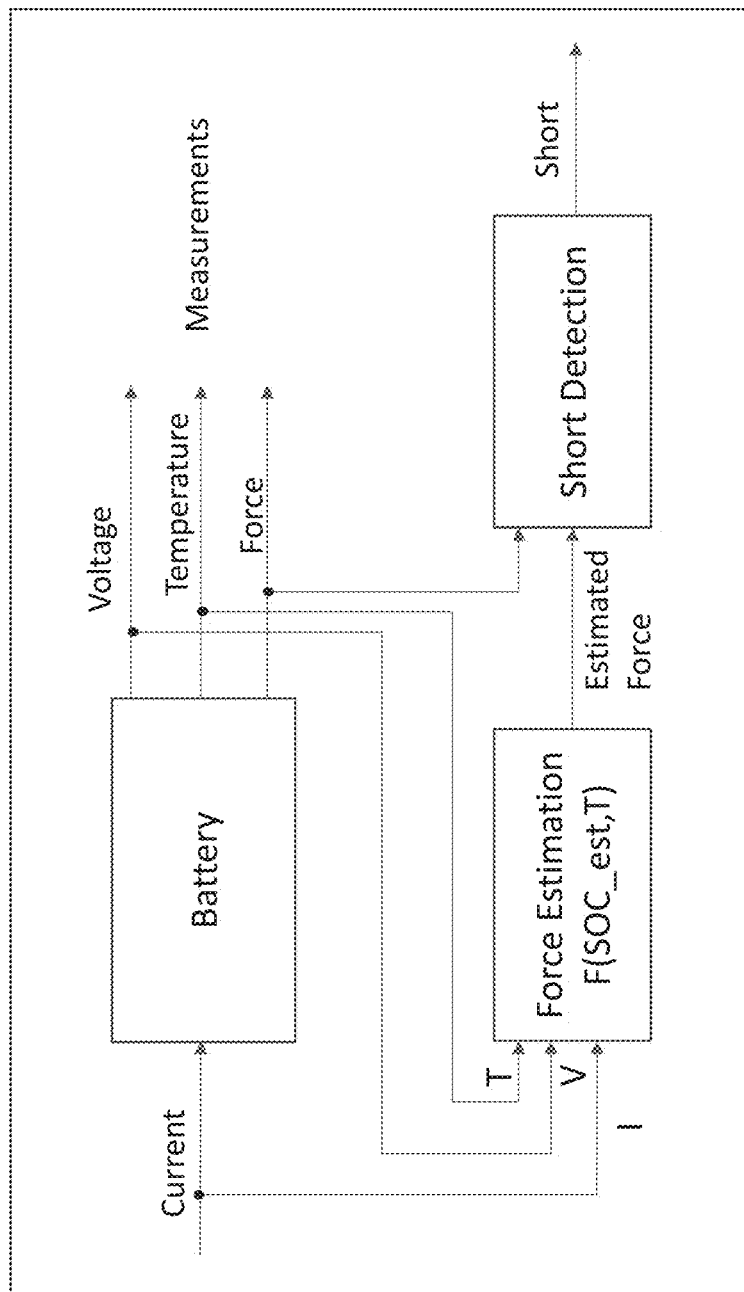
FIG. 5 shows a flow diagram for a non-limiting example method for internal short circuit detection according to one aspect of this disclosure.

FIG. 5 shows a flow diagram for a non-limiting example method for gas generation and/or an internal short circuit detection. A fixture such as that shown in FIG. 2 can be used to obtain force measurements of a battery at various temperatures and states of charge for the battery. Using a method, such as one of the methods disclosed in U.S. Patent Application Publication No. 2016/0064972, the measurements can be used in a model for estimating force measurement that provides the Force Estimation F(SOC_est,T) shown in the block of FIG. 5.

Figure 6:
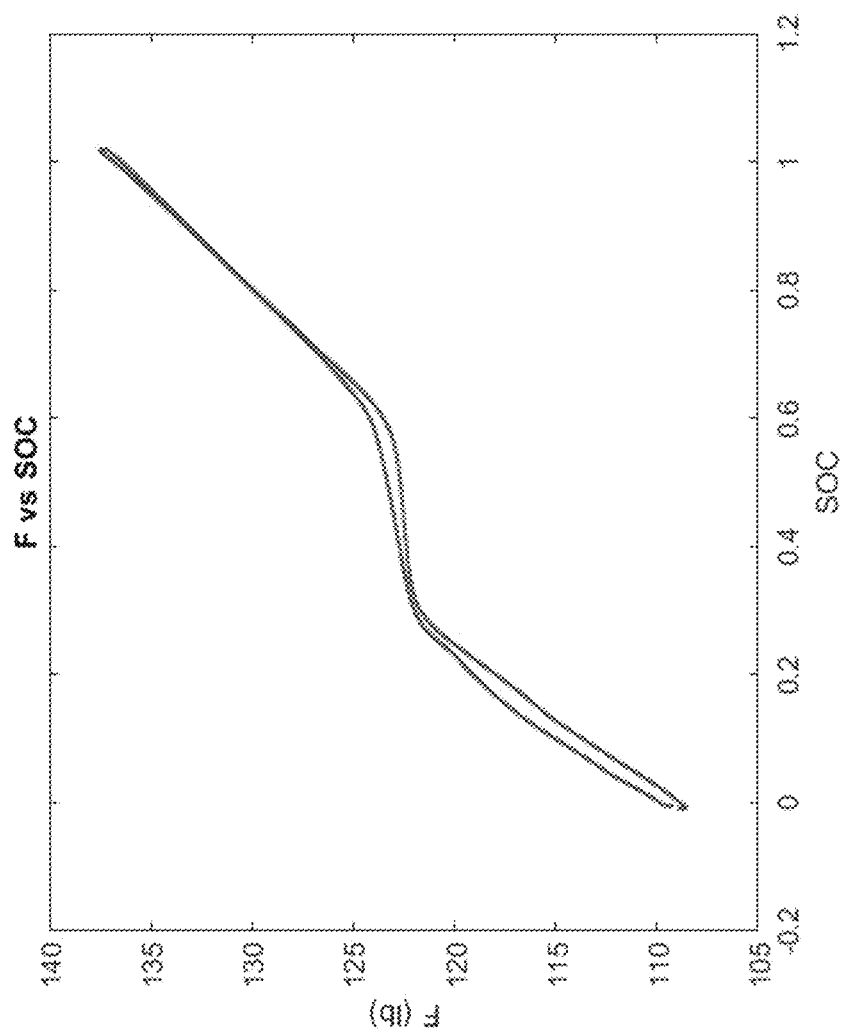
FIG. 6 shows another example of a measured force vs. state of charge (SOC) graph for a normal range of battery charge and discharge.
Figure 7:
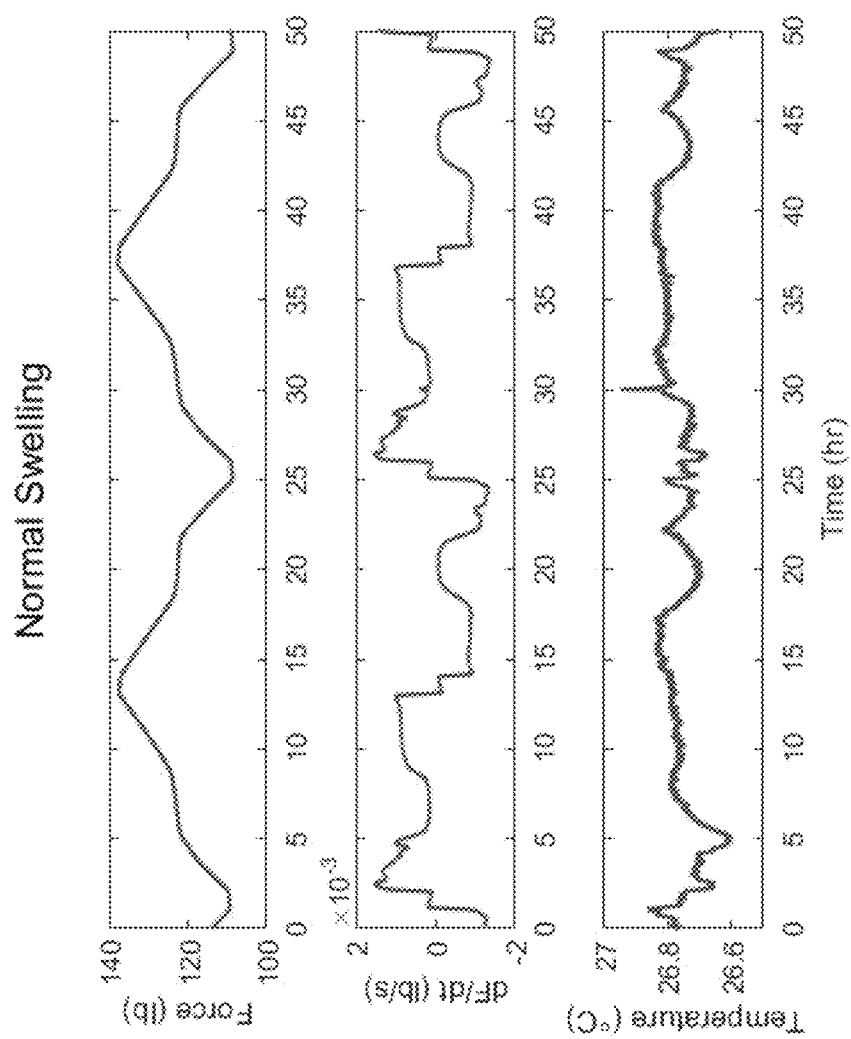
FIG. 7 shows examples of force measurement, dF/dt, and temperature measurement versus time during normal swelling conditions of a battery.
Figure 8:
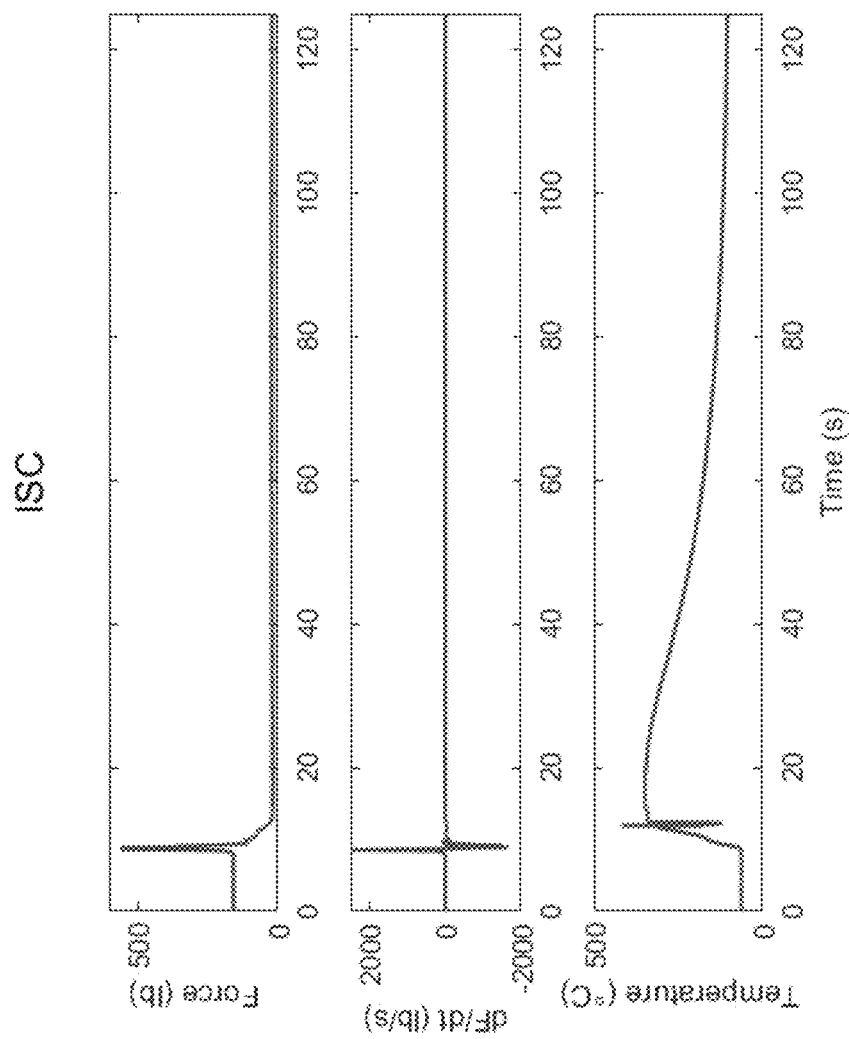
FIG. 8 shows the force measurement, dF/dt, and temperature measurement versus time during an internal short circuit event of a battery.

FIG. 6 shows an example normal range of force measurement as a function of state of charge. By comparing the estimated force under normal swelling conditions with the measured signal and determining if the difference exceeds a threshold, gas generation and/or an internal short circuit can be detected. The threshold can be identified either based on experiments or by using thermal runaway models which can predict force (for example, gas evolution models can predict the moles of gas released which directly correlates to the pressure buildup inside a battery). Observers can also be added to detect sensor faults. Alternatively, from the force model, one can estimate the rate of change of force versus time. Again, one can compare the estimated values with the measured values and if the difference exceeds a predetermined threshold, gas generation and/or an internal short circuit can be detected. FIG. 7 shows examples of force measurement, dF/dt (derivative of the force versus time), and temperature measurement during normal swelling conditions of a battery. FIG. 8 shows the force measurement, dF/dt (derivative of the force versus time), and temperature measurement during an internal short circuit event. In FIG. 8, one can observe that there are sudden spikes in the force and dF/dt (derivative of the force versus time) when the internal short circuit occurs.

In any of the electrical devices or methods, the temperature sensor may comprise a plurality of temperature sensors, and/or the voltage sensor may comprise a plurality of voltage sensors, and/or the pressure sensor may comprise a plurality of pressure sensors, and/or the current sensor may comprise a plurality of current sensors.

In another aspect, the invention provides a vehicle that includes any of the electrical devices as previously described, the vehicle being configured to supply electrical power to propel the vehicle. The vehicle may include an internal combustion engine, a generator, and a fuel tank storing fuel. The internal combustion engine is designed to combust the fuel from the fuel tank to power the generator, and the generator is configured to supply electrical power to the battery pack to recharge the battery pack.

In another aspect, the invention provides a consumer electronics apparatus which includes any of the electrical devices as previously described.

EXAMPLES

The following Examples are provided to demonstrate and further illustrate certain embodiments and aspects of the present invention and are not to be construed as limiting the scope of the invention.

Example 1

A 4.5 amp hour lithium nickel manganese cobalt oxide (NMC)—graphite pouch cell with a built-in internal short circuit device was fabricated for the experiment. The built-in internal short circuit device used was similar to one described in U.S. Pat. No. 9,142,829, which is incorporated herein by reference. During the battery fabrication, a hole is cut in the separator, which is then covered by a phase change material (PCM) trigger. The PCM melts when the temperature reaches its melting point at 55° C., thus creating a gap in the separator, allowing the cathode and the anode to contact and trigger the internal short circuit.

Figure 2:
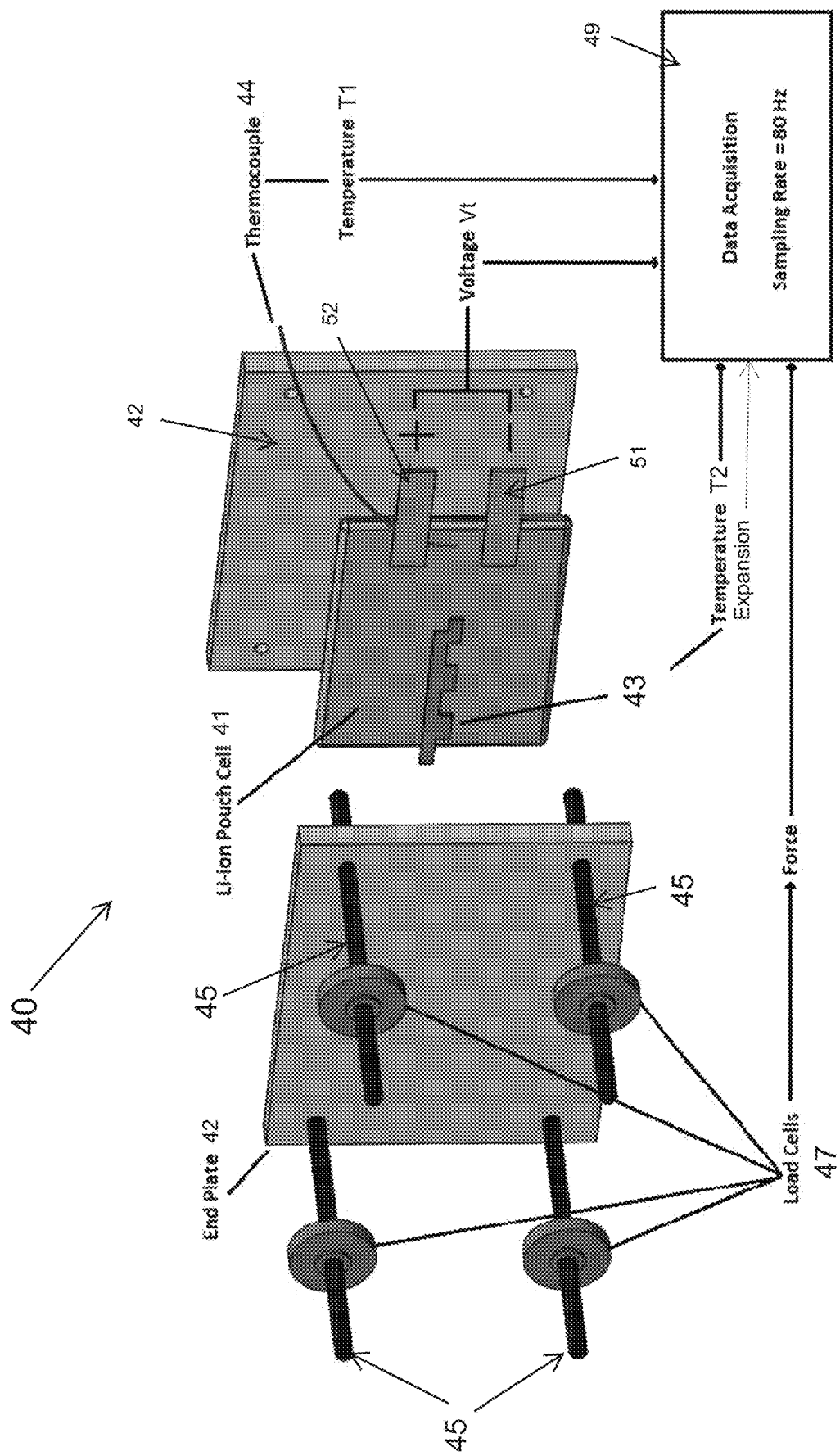
FIG. 2 is a schematic showing an exploded perspective view of a fixture used in the invention.

A fixture 40 shown in FIG. 2 was designed and used in the experiment. The NMC-graphite pouch cell 41 was placed between two 1-inch thick Garolite (a fiberglass-epoxy composite) plates 42.

A temperature and expansion sensor 43 with six temperature sensing elements was placed on the pouch cell 41. The temperature and expansion sensor 43 is fabricated in accordance with the methods of Aaron Knobloch, Chris Kapusta, Jason Karp, Yuri Plotnikov, Jason B. Siegel and Anna G. Stefanopoulou, described in "Fabrication of Multi-Measurand Sensor for Monitoring of a Li-ion Battery", *ASME Journal of Electronic Packaging*, 2018; doi:10.1115/ 1.4039861. A Kapton substrate of 25 µm in thickness was laminated onto a 9-inch processing frame to aid in handling thru the process. First, six platinum resistance temperature detectors for temperature sensing are formed on the substrate. This is done through a liftoff process using AZ photoresist, to define the sensor shape and evaporation of approximately 2000 angstroms of platinum on the front side of the substrate. Once the photoresist is removed, vias are formed using an ESI 5330UV laser system. The vias are through holes in the Kapton substrate, which will provide interconnect between the front side and the backside of the substrate for the coils. These vias are aligned to the platinum layer that was previously deposited. A Ti/Cu/Ti set of metal layers was blanket deposited on both sides of the substrate to form the eddy current coils, interconnect to the resistance temperature detectors and to route to the connectors. This was accomplished through sputtering of 2000 angstroms Ti and 6000 angstroms Cu then subsequently plating 4 µm of Cu and then sputtering 1000 angstroms of Ti. Ni/Au pads were plated up to form a reliable connection to a Ziff-connector interface, with thicknesses of 1 µm of Ni and 1500 angstroms of Au. Photolithography processes were performed to define the pattern in photoresist, and the metal stack was wet etched to pattern the eddy current coils, the ground plane, and the terminations. Dilute HF was used to etch the Ti and a $FeCl_2$ solution was used to etch the copper. After etching and removal of the resist, the circuit was laminated on both sides with a 25 µm thick coverlay (0.5 mil adhesive/0.5 mil Kapton) to encapsulate the metal lines and protect against shorting to the metal case of the battery. The end terminations were designed so that the temperature and expansion sensor 43 can be connected to a Ziff connector at the edge of the flex. The Kapton at the edge of the flex was removed so that the Au is accessible for the Ziff connector.

A thermocouple 44 was placed between the current collecting tabs 51, 52 of the NMC-graphite pouch cell 41 at the position where the venting will occur.

The Garolite plates 42 allow for compression of the pouch cell 41 and the plates 42 are bolted together using four bolts 45, one in each corner of the plate 42. Each of the four bolts 45 is instrumented with a 350 ohm strain gauge (Omega LC8150-250-100 sensor) load cell 47, with a 450 Newton full scale range and 2 Newton accuracy. The cell temperature T1 from thermocouple 44, the cell temperature T2 from the temperature and expansion sensor 43, the terminal voltage Vt, and force are sampled at an 80 Hz rate as shown at block 49 in FIG. 2.

The instrumented fixture 40 was heated in an Accelerating Rate calorimeter until the PCM melted triggering an internal short circuit.

Figure 3:
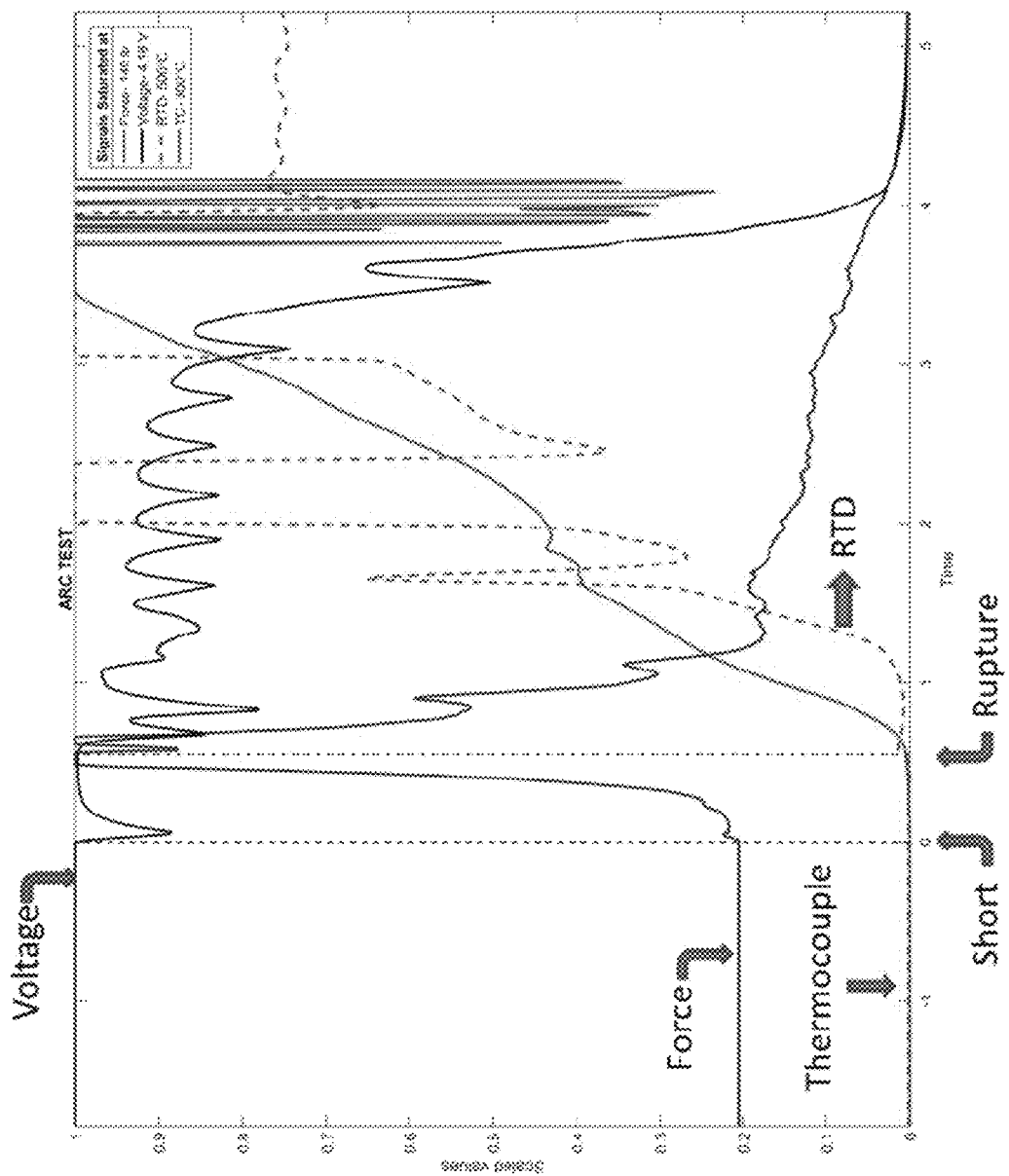
FIG. 3 is a graph showing a cell temperature from a thermocouple, a cell temperature from a temperature and expansion sensor, force from load cells, and cell terminal voltage from a battery having an electrical device according to the invention.

The chronology of events shown in FIG. 3 indicated that the internal short circuit led to local heating and gas generation, which resulted in battery swelling before the elevated temperature could reach to the surface of the cell. Looking at FIG. 3, the measured voltage exhibited an initial drop (indicated by t=0 in the graph) but subsequently rose again and continued to fluctuate until reaching zero 6.5 seconds later. The force started rising immediately after the initial voltage drop. Even the thin film temperature and expansion sensor 43 located on top of the internal short circuit PCM trigger responded slower than the force, at 0.2 seconds after the initial voltage drop. The accumulated pressure inside the cell then caused the pouch cell 41 to rupture between the current collecting tabs 51, 52 (at the weakest part of the pouch cell). The ultimate burst pressure exceeded the measurement range of the temperature and expansion sensor 43, but the timing of the event was observed by the rapid depressurization at 0.55 seconds. Finally, the thermocouple temperature T1 increased at 0.60 seconds, most likely due to hot gases venting out over the thermocouple 44 placed between the current collecting tabs 51, 52. Thus, an internal short circuit event and the eventual rupture can be detected using measured force earlier than using temperature sensors on the surface of the battery.

We note that the voltage signal shows high ambiguity during an internal short circuit, since the voltage signal drops abruptly but then recovers to a reasonable value till the rupture of the battery cell occurs. The raw battery terminal voltage signal is therefore not sufficient to identify the internal short circuit before a significant temperature rise, i.e., the pressure increases due to gas generation during thermal-runaway can precede rise of the surface temperature measurement.

Thermal runaway is one of the major safety risks in lithium ion batteries. One of the prime reasons for thermal runaway are internal short circuits. The internal short circuit phenomenon is very fast and the battery discharges in a matter of seconds, possibly resulting in an explosion which can propagate to other cells, resulting in additional thermal runaway. Hence, it is important to understand which sensors can give earliest warning (integrated with voltage measurement) to give a higher confidence level of detecting the imminent evolution of the thermal runaway due to the internal short circuit. In this Example, we showed the benefits of force measurement for detecting the onset of thermal runaway. Force measurement can also be used along with voltage and/or temperature measurement. As shown in FIG. 3, the measured force increases at the same instance when there is a voltage drop due to the short. The measured force changed earlier than the installed temperature and expansion sensor 43 or thermocouple 44. The mechanical force measurement, therefore, can be used to generate an early detection of internal shorts. Optionally, mechanical force measurement can be used in conjunction with electric and temperature measurements to generate a robust detection of internal shorts.

Example 2

Overview of Example 2

Thermal runaway of Li-ion batteries is a major safety issue. It is a complex process involving high heat generation, fast temperature rise and significant amounts of generated gas. Modeling thermal runaway will enable a better understanding and earlier detection of the phenomenon. Since the majority of the thermal runaway incidents are triggered by an internal short circuit, this paper presents a model describing lithium-ion battery thermal runaway triggered by an internal short. In this study, two internal short circuit experiments were conducted on two nickel manganese cobalt oxide pouch cells, one that was fully charged and one half charged. The fully charged cell went into a quick thermal runaway, while the half-charged cell evolved only into a slow, self-discharge process. Both of these experiments demonstrate that a huge battery swelling force signal can be detected prior to the surface temperature rise during an internal short circuit event. This thermal runaway model is the first attempt to connect gas generation with force signal, and successfully predict the early stages of thermal runaway, including the early rise of force signal. This model's use of force measurement enables a higher confidence in the early detection of thermal runway induced by an internal short.

1 Introduction for Example 2

Lithium ion batteries are widely used in energy storage and offer significant improvements in electric vehicles. However, the growth in battery energy density increases the risk and severity of battery failures. With the increasing numbers of electric vehicles and consumer electronics applications of large capacity Li-ion batteries, battery fires and explosions accidents are increasing worldwide. Many of these accidents start with an overcharge, over-discharge, or a battery separator penetration due to mechanical abuse[1] that lead to battery temperature elevation, self-heating and finally thermal runaway (TR). In many cases, this process begins with an internal short circuit (ISC) that causes self-heating and can elevate the battery temperature above 130° C. This in turn can result in side reactions, including a breakdown of the Solid Electrolyte Interface (SEI) layer.[2] These side reactions quickly produce addition heat and can lead to battery thermal runaway. Common hazards of battery thermal runaway include toxic off gassing, smoke, tire, and even an explosion.[3]

To develop early detection method, it is important to model the thermal runaway process. The proposed model divides the battery into three sections: core, middle layer and surface layer,[4] and identifies the heat released per the electrochemical energy stored in each section. The model contains four sub-models: an electrical model for the internal short circuit process, a side reactions model for exothermic reactions of active materials, a thermal model for battery temperature and a gas evolution model to predict early gas generation.

Many researchers have made an effort toward a battery thermal model that explains battery temperature evolution. Hatchard[5] used a spatially discretized thermal model, with N concentric rings, to account for the radial temperature distribution of a battery during thermal runaway. This showed that there is very little difference in the onset temperature for thermal runaway (3° C.) during oven testing, as compared to the lumped thermal mass approach. Furthermore, since the entire cell is at an elevated temperature when the exothermic process begins, the reaction progresses more uniformly along the radius of the cell. Coman[6] used lumped thermal models to describe battery temperature during thermal runaway. The lumped thermal model assumes a uniform temperature distribution and one temperature state to represent the cell. This assumption is valid for an 18650 cell, which has a small Biot number ($B_i$=0.051),[6] and they stowed the battery surface temperature from the model is very close to the experiment measurement. In the case of a local internal short circuit, however, the ohmic heat generation will be concentrated in a small localized area, causing a large spatial temperature gradient in a focused space. To address this inhomogeneity, others have used a finite element approach, with high computation cost and difficulty in tuning.[7,8] By using the proposed three-section thermal model, a reasonable trade-off can be achieved between computational complexity and accuracy.

In modeling the internal short, the resistance of ISC is a critical parameter for determining the severity and time to onset of the TR event.[9] However, few papers address calculation of the short resistance depends on the area of the separator failure. Guo[10] explained the ISC caused by over-discharge, and used experimental data to fit a curve of ISC resistance with over-discharge capacity. Coman[6] developed a model for energy released due to the ISC with an efficiency factor that was fitted to their experiment data. The fitting approach worked well with the specific cells in the experiment, but is difficult to be applied to varying Li-ion battery chemistries. This study presents an electrical model that describes ISC, and proposes a finite element method for solving ISC resistance of the battery for small geometric areas.

Side read models are well established for major exothermic reactions during a TR event. Previous studies already provide robust reaction kinetic parameters measured from Accelerated Rate calorimetry (ARC) experiments during thermal runaway.[5,11] Hatchard[5] developed these side reaction models for major exothermic side reactions including SEI decomposition anode decomposition, and cathode decomposition. Kim[12] extended the model to include electrolyte decomposition, and these models have been used by many researchers over the years. Ren[13] developed a set of thermal runaway side reaction chemical kinetics based on DSC testing that include six exothermic reactions in the model, SEI decomposition, anode-binder reaction, anode-electrolyte reaction, cathode-electrolyte reaction, cathode-binder reaction and cathode decomposition.

During stage of thermal runaway, a significant amount of gas and electrolyte is vented to the outer regions of the battery. Coman[14] studied and modeled this electrolyte and ejecta venting during thermal runaway. They showed how the amount of ejected material impacts the peak temperature of thermal runaway due to the Joule-Thomson effect during venting and removal of hot materials from the cell during the later stages of thermal runaway. Previous experimental studies for commercial 18650 Li-ion batteries from Lammer et al.[15] on the composition of vented gas showed that most of the gas is $CO_2$ during the first gas venting event. Other studies have demonstrated that SEI decomposition is the primary source of $CO_2$ generation during the early stages of thermal runaway.[1] Pannala[16] characterized a battery swelling and the immediate rise of force signal during a pouch cell thermal runaway event, and hot gases were detected after the force drops. Based on these results, our study assumes that gas from SEI decomposition is the most significant contributor to battery swelling and force signal rise during the first few seconds following an ISC event. This study is the first attempt to make a connection between side reactions and force of battery swelling for modeling purposes.

To tune and validate the model, two experiments were conducted with 4.5 Ah pouch cells for which an ISC was triggered at 57° C. with different initial State of Charge (SOC). In a previous study, the battery internal short circuit was emulated by triggering a shape memory alloy to penetrate the separator.[17] Here we used a wax-based melt device in the separator to trigger the internal short[18] for model validation. In our experiments, we demonstrated two modes for the ISC event. The cell w ax 50% SOC didn't trigger thermal runaway, while the cell with 100% SOC went into a quick thermal runaway. The model fits well for temperature and force signal on both experiments, by predicting the surface temperature rise and gas volume change inside the cell compared with force measurement. The model and experiments with early rise of force signal show the potential of using the mechanical behavior as an early indicator for ISC induced thermal runaway.

Some contributions of this paper are:

Three section discretization is proposed and parameterized to capture the high rate of core temperature change and the peak temperature; while at the same time, predicting the surface temperature which is compared Smith the measurements. The prior work on TR modeling either employed a title mesh using the Finite Element Method[8] or used a single bulk temperature state.[6] The model presented here represents a trade-off between computational complexity and accuracy and is useful for online model-based fault detection.

Detailed modeling work is developed on ISC resistance as a function of its spatial area. The model also couples cell SOC with the anode decomposition process. Since multiple reactions compete for available lithium at the negative electrode, including the impact of self-discharge caused by the ISC on SOC is crucial for predicting TR. With these improvements, the proposed model can better evaluate the peak temperature and SOC change during an ISC event which triggers TR.

Two experiments are shown for two different SOC levels with a triggering ISC. The cell with high SOC led to a quick thermal runaway, and the other cell with low SOC led to a slow self-discharge after triggering ISC. The model can describe both events with two model settings when the type of ISC mode in the event is known.

Matching the model and experiments with the force signal show the potential of using the mechanical behavior as an early indication for ISC-induced thermal runaway.

2 Thermal Runaway Model

Figure 9:
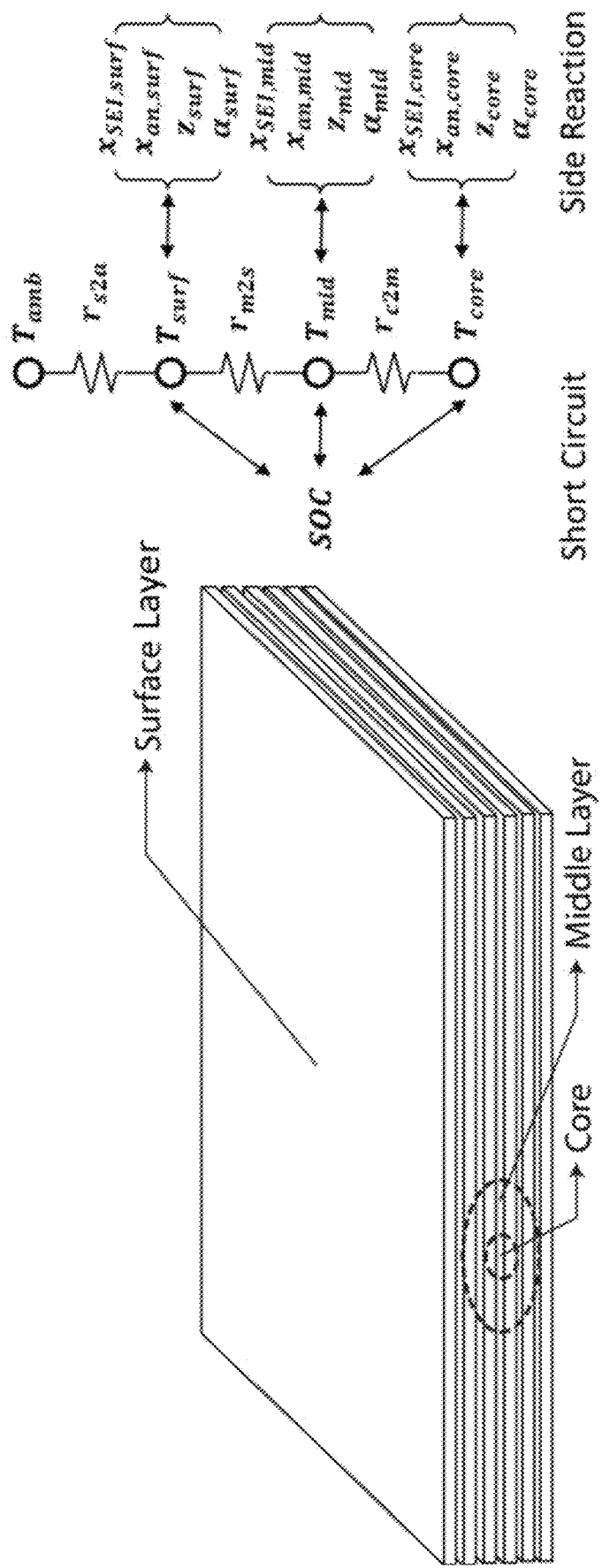
FIG. 9 shows a three section model with a battery discretized into a core, a middle layer and surface layer.

The battery's internal temperature states are divided according to three sections, and the mass of each section is scaled proportionally to its volume fraction. This uneven coarse discretization better captures the relatively small area adjacent to the internal short circuit which heats more rapidly than the surrounding volume. The remainder of the cell mass, which lags in heating, contains the bulk of the cell material. As FIG. 9 illustrates, the overall thermal runaway model includes a three-state thermal model, a side reaction model which tracks the consumption of active materials, and an electrical equivalent circuit model. The model has three temperature states, four side reaction states in each section, and one state for cell state of charge according to an electrical equivalent circuit model. In total, the three-section model consists of 16 states. The nomenclature can be found in the appendix.

2.1 Three-State Thermal Model

For thermal runaway triggered by ISC, the ISC area has a significant volumetric heat rate and will have a relatively fast temperature rise compared to the surface of the cell. To address this inhomogeneity of temperature within the battery, we need to discretize the battery into several sections. We found that three sections for temperature discretization achieved good accuracy while at the same time maintained reasonable computational complexity.

A three-state thermal model describes battery core temperature ($T_c$), middle layer temperature ($T_m$), and surface layer temperature ($T_s$). The battery core represents the area in which the ISC first occurs. In FIG. 9, this location is schematically shown at the center of the cell. However, it need not necessarily be located at the geometric center. The proposed model also applies to cases where the ISC is located near the surface, as shown later in the experimental results. It is the relative volumes rather than the specific ISC location, that is critical for capturing the temperature rise during thermal runaway. Specifically, the dynamic evolution of the core temperature state is $$C_p m_{core} \frac{dT_{core}}{dt} = (\dot{Q}_{exo,core} + \dot{Q}_{ohmic,core}) + \frac{T_{mid} - T_{core}}{r_{c2m}} \quad (1)$$

where $T_{core}$ and $T_{mid}$ represent the core and middle layer temperatures respectively and $r_{c2m}$ is the thermal resistance between the core and middle layer. Similarly the middle and surface layer temperatures are given by $$C_p m_{mid} \frac{dT_{mid}}{dt} = \left(\dot{Q}_{exo,mid} + \dot{Q}_{ohmic,mid}\right) - \frac{T_{mid} - T_{core}}{r_{c2m}} + \frac{T_{surf} - T_{mid}}{r_{m2s}} \quad (2)$$

$$C_p m_{surf} \frac{dT_{surf}}{dt} = \left(\dot{Q}_{exo,surf} + \dot{Q}_{ohmic,surf}\right) + \frac{T_{amb} - T_{surf}}{r_{s2a}} - \frac{T_{surf} - T_{mid}}{r_{m2s}} \quad (3)$$

The $r_{c2m}$, $r_{m2s}$, $r_{s2a}$ terms are equivalent thermal conduction resistance.

The battery core section refers to the battery area affected by initial ISC, and the $m_{core}$ core parameter can be derived if the ISC area is known. Theoretically, the mass ratio of each layer equals to the volume ratio of the each layer when assuming uniform density $$\left(m_{core} = m_{cell} \frac{V_{core}}{V_{cell}}, m_{mid} = m_{cell} \frac{V_{mid}}{V_{cell}}\right),$$

where $m_{cell}$ is the battery cell mass, and $V_{core}$ and $V_{mid}$ are the volumes of core and middle layer). In this study, for a cell with a wax-based separator, the core mass ideally can be calculated by the area of wax part separator and the electrode sheet thickness. The volume of a cylindrical ISC area can be expressed as $$V_{core} = \pi r^2_{short} H \quad (4)$$

where $r_{short}$ is the radius of short circuit region, and H is the height of cylindrical short area, which is the sum of two electrode sheets thickness and the separator thickness. However, the initial ISC also heats up regions outside of ISC area during the internal short circuit process, so the relative size of the volumes for three sections are tuned in this study.

The total heat generation by the side reactions is given by $$\dot{Q}_{exo*} = \dot{Q}_{an,*} + \dot{Q}_{ca,*} + \dot{Q}_{SEI,*} \quad (5)$$

where * corresponds to the core, middle and surface layers. The total heat rate from all side reactions depends on the three exothermic decomposition reactions in each layer. These reactions drive the temperature rise, and the temperature rise will accelerate these reactions leading to thermal runaway.

2.2 Elect Model

Figure 10A:
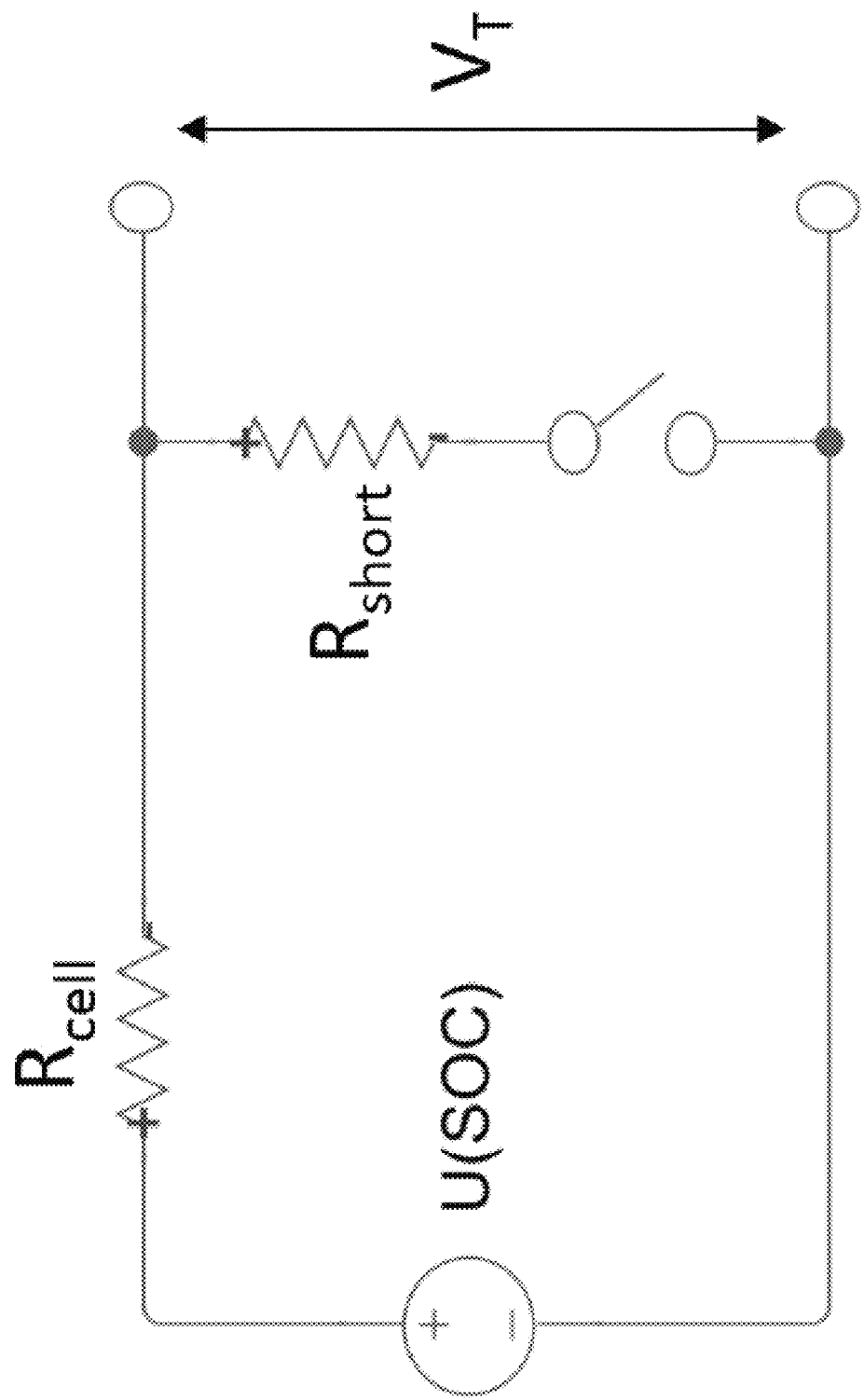
FIG. 10A shows an electrical model of an equivalent circuit model for ISC.
Figure 10B:
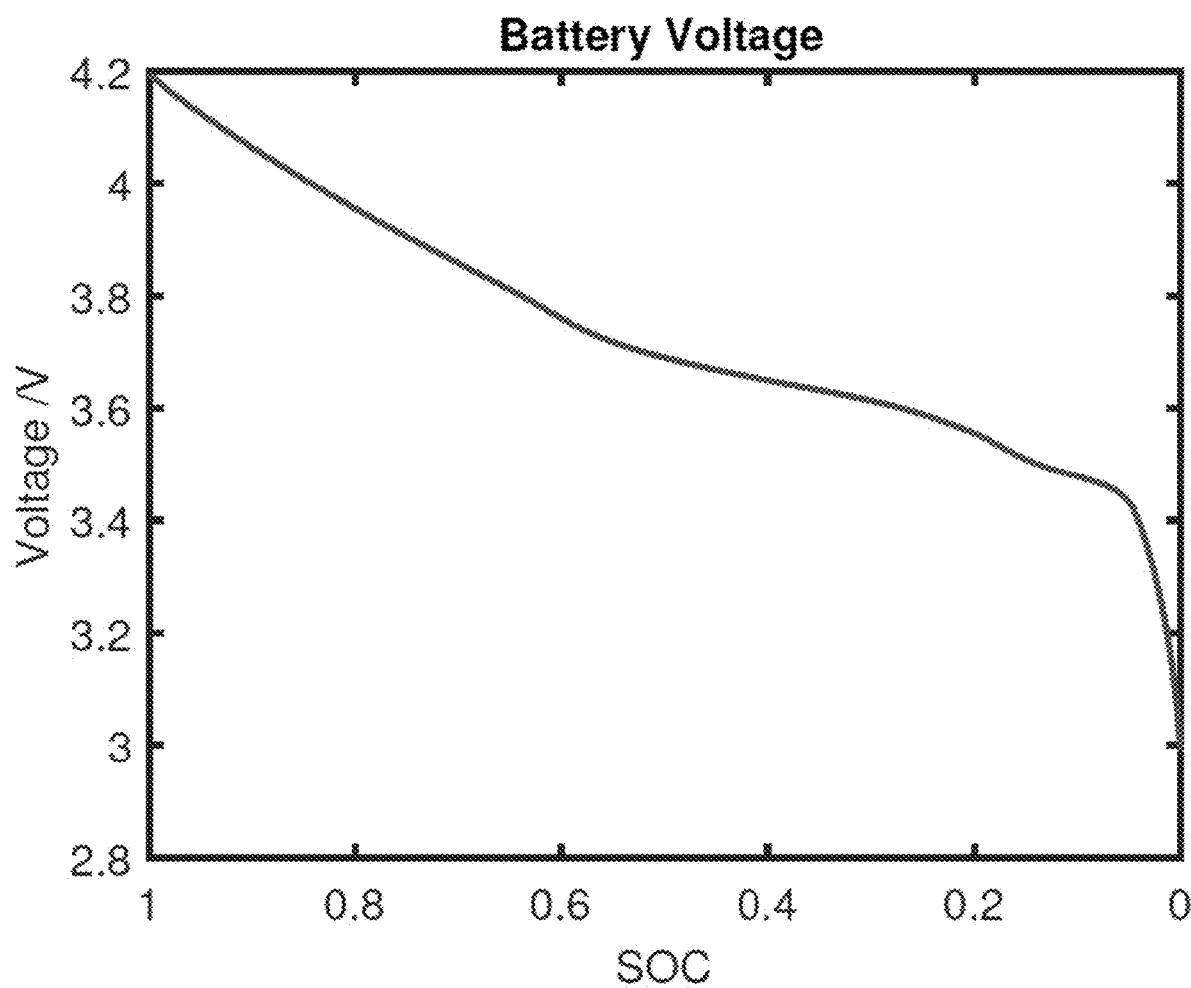
FIG. 10B shows an electrical model of a battery open circuit voltage U(SOC).

During a thermal runaway event, besides exothermic side reactions that generate heat, the battery short, circuit will also generate ohmic heat. The thermal and decomposition evolution depends on the rate of this ohmic heat generation and its dissipation rate to the surrounding material. This paper focuses on the internal short circuit that occurs in a small region of a battery and presents a model for its local heating. The battery terminal voltage can be represented by an equivalent circuit model $$V_T = U(SOC) - I \cdot R_{cell} \quad (6)$$

where I is the discharge current, which is equal to the short current $I_{short}$ when there is no load, as shown in FIG. 10A. The nominal cell internal resistance is $R_{cell}$ and U(SOC) is the battery open circuit voltage (OCV). The OCV is a function of SOC, as shown in FIG. 10B.

Rheinfeld[19] used the 1 kHz impedance as cell resistance to evaluate the theoretical maximum short circuit at the first few seconds of the internal short process. Here, 1 kHz impedance of the cell from EIS testing ($R_{1\,kHz}$=4.76 mΩ) will be used to represent, cell resistance for an modeling internal short circuit.

2.2.1 Equivalent Circuit Model for ISC

From the ISC resistance, an equivalent circuit model can be developed to describe the internal short circuit process. Previous studies on ISC mechanisms have also used an equivalent circuit model with area dependent resistance.[10] In this study for a self-induced thermal runaway case, we assume no external wires connecting the positive and negative electrodes of the cell. The corresponding equivalent circuit model is shown in FIG. 10A: Therefore short circuit current can be found using Kirchoff's laws directly for the simple circuit.

$$I_{short} = \frac{U(SOC)}{R_{cell} + R_{short}} \quad (7)$$

The total heal release due to self discharge is given by, $$\dot{Q}_{ohmic} = I^2_{short}(R_{cell} + R_{short}) \quad (8)$$

To be noted, the ohmic heat $I^2 R_{short}$ is distributed only in the short circuit area, and the overall heat rate $I^2 R_{cell}$ distributed among all cell. Specifically, when the ISC starts in the battery core, the ohmic heat will be distributed as following:

$$\dot{Q}_{ohmic,core} = I^2_{short} R_{short} + \frac{m_{core}}{m_{cell}} I^2_{short} R_{cell} \quad (9)$$

$$\dot{Q}_{ohmic,mid} = \frac{m_{mid}}{m_{cell}} I^2_{short} R_{cell} \quad (10)$$

$$\dot{Q}_{ohmic,surf} = \frac{m_{surf}}{m_{cell}} I^2_{short} R_{cell} \quad (11)$$

where the subscript core, mid, surf corresponds to the core, middle and surface layers of the battery respectively. Adjusting the resistance values can increase the heat rate in the short circuit area to be much higher than the rest of cell so that the short area will experience significant temperature rise before the rest of the cell.

2.2.2 ISC Resistance

Four major types of internal short circuits have been discussed in previous studies,[17] with Cathode to Anode ISC (or called Type A ISC) being the most common type of ISC. Typically the ISC area is small in comparison with the total cell area. In cathode to anode ISC, if the ISC area is caused by a, penetrated separator and the cathode and anode is connected through high conductivity materials, such as iron, then the resistivity of the electrode's active material dominates the resistance of the short. A zero-th order approximation of true electric resistance can be derived using geometric resistance:

$$R_{geo} = \rho \frac{L}{S} \quad (12)$$

where ρ is electric resistivity, L is the length and S is the cross-sectional area for uniform resistive property material.

For small areas, however, the distribution of the potential field near the edge cannot be ignored. Thus, a Comsol simulation was developed for a an it current flowing through the ISC area. The simulation solves Ohm's law in 3D at a fixed applied current to compute the electric field:

$$E = \rho J \quad (13)$$

with J being the current density. Then $R_{3D}$ is calculated numerically by:

$$R_{3D} = \frac{-\int E \cdot dx}{I} \qquad (14)$$

where dx is the element of path along electric field, and I is the total applied current, which equals to the integration of current density over the cross-sectional area (I=∫J$\chi$dy).

Figure 11A:
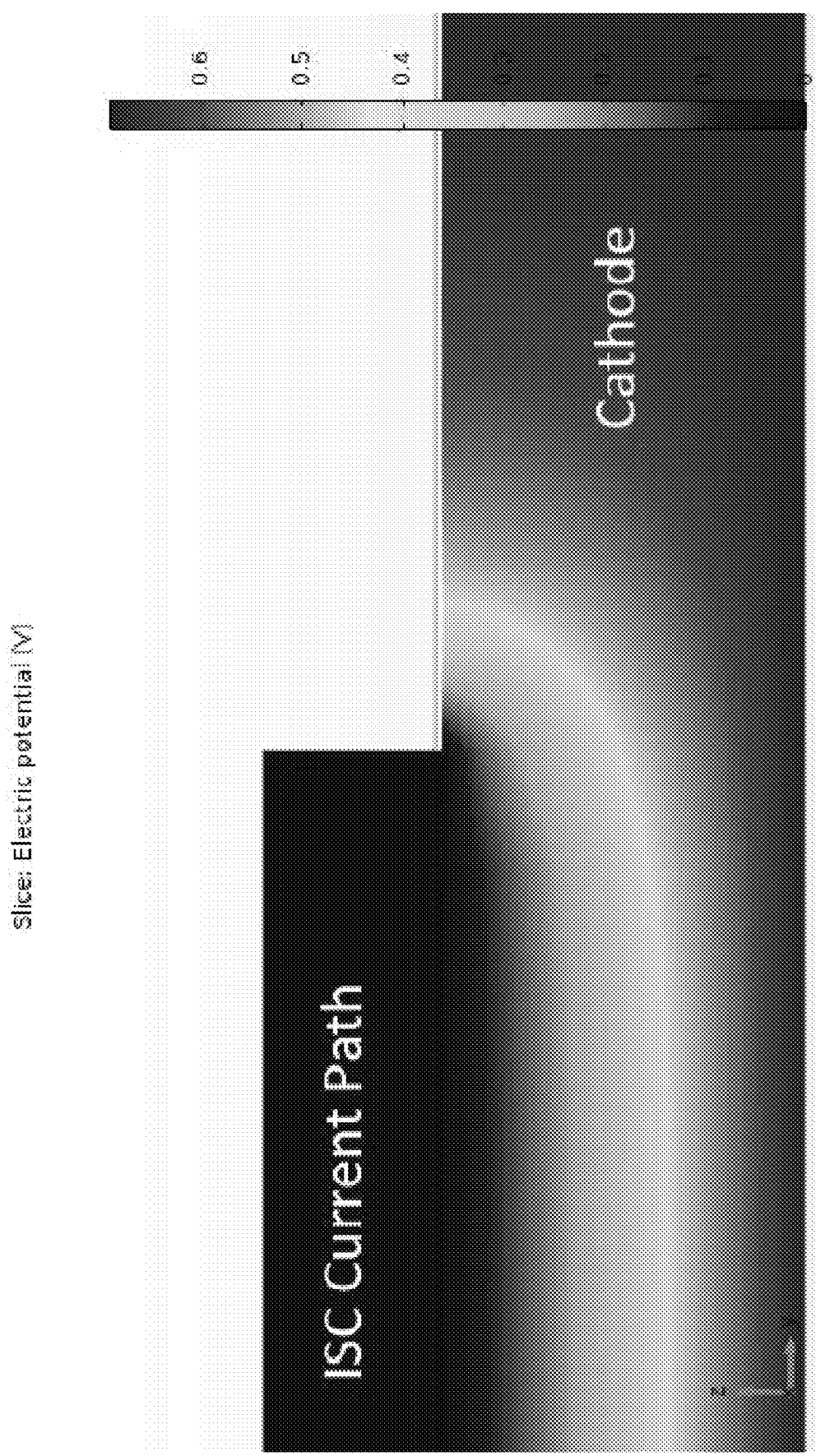
FIG. 11A shows an ISC resistance computation including an electric potential at short circuit area.
Figure 11B:
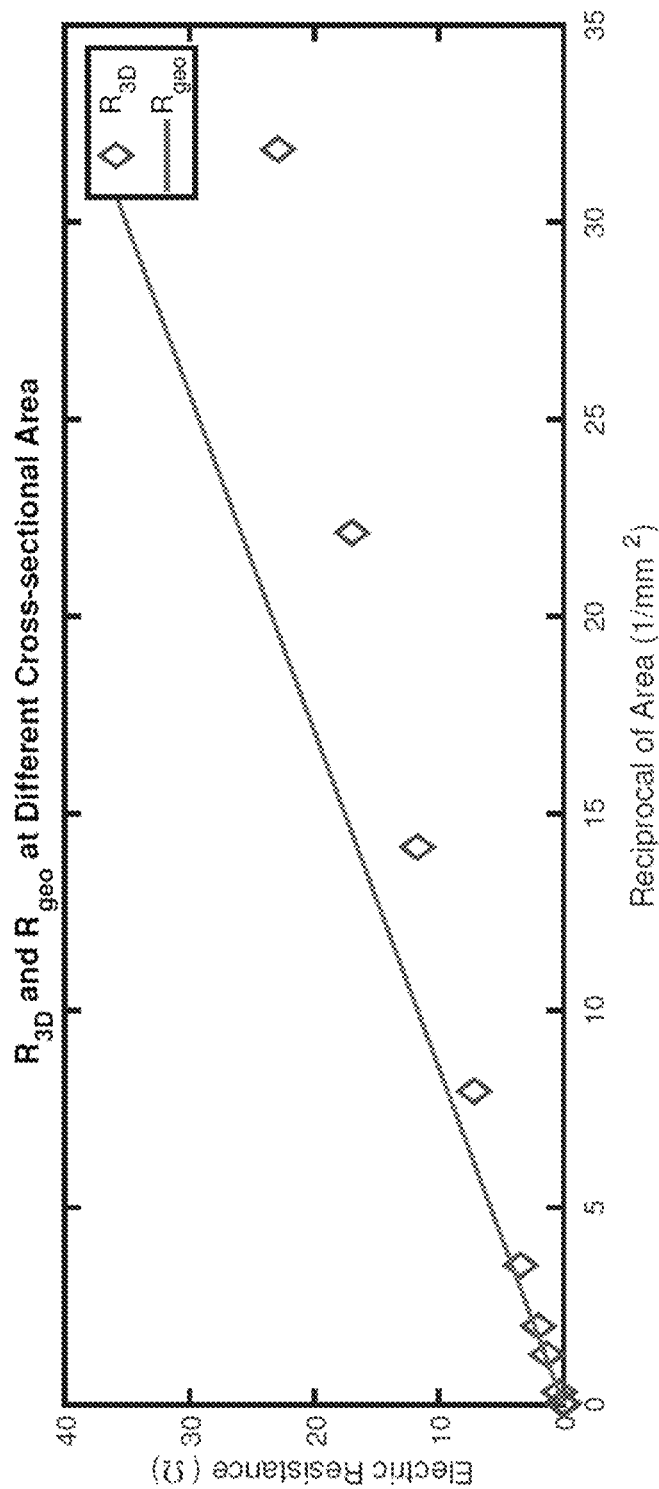
FIG. 11B shows an ISC resistance computation including a comparison between R3D and Rgeo.

FIG. 11A shows a 2-D slice of the electrical potential distribution of ISC, current path at the short circuit area with a unit applied current. The ISC resistance is obtained numerically from this simulation for a range of areas. The ISC resistance is nearly inversely proportional to the ISC area, where a smaller ISC area will have larger short resistance. As FIG. 11B indicates, geometric resistance estimates the ISC resistance well for large ISC areas. However, for small areas, the geometric resistance overestimates the ISC resistance where the edge effects are significant. Detailed results for the comparison of equivalent ISC resistance ($R_{3D}$) and geometric resistance ($R_{geo}$) are shown in FIG. 11B. Based on this result, $R_{geo}$ is a good estimation of $R_{3D}$ when the ISC resistance is lower than 5Ω. For ISC resistance greater than 5Ω the area dependence is non-linear, and the full 3D potential field should be evaluated as shown in FIG. 11A, if the short area is known. In the following study, $R_{3D}$ will be adopted for ISC resistance $R_{short}$ greater than 5Ω based on the error shown in FIG. 11B.

2.2.3 Temperature Dependency for Cell Resistance

As the cell temperature increase significantly during the thermal runaway process, the temperature dependency for electrical resistance needs to be taken into consideration. The diffusivity ion transport increase exponentially with temperature.[20] The cell resistance is then assumed to decrease exponentially with battery core temperature rise, while the short circuit resistance is assumed constant with temperature change. Under this assumption, an exponential temperature dependency relation is selected from Lin[21] to represent the cell resistance:

$$R_{cell} = R_{e,ref} \exp(T_{ref}/T) \qquad (15)$$

where $R_{e,ref}$ is the reference resistance value at a reference temperature $T_{ref}$. The exponential relationship is directly adopted from Lin,[21] while the reference resistance value is selected to reflect the measured 1 kHz impedance at 20° C. In this study, $R_{e,ref}$ is taken as 0.0246 mΩ, and $T_{ref}$ is taken as 1543 K.[21]

However, since the cell temperature is discretized in this model, so the cell resistance should be expressed as a function of three sections temperature. The cell resistance can be represented by the three sections, where the temperature dependency comes from the temperature of each section:

$$R_{cell} = \frac{1}{1/R_{cell,core} + 1/R_{cell,mid} + 1/R_{cell,surf}} \qquad (16)$$

where $R_{cell,core}$, $R_{cell,mid}$, $R_{cell,surf}$ is the cell electrical resistance based on core, middle layer and surface layer. The temperature dependency for each of the electrical resistances can be expressed as:

$$R_{cell,*} = R_{*,ref} \exp(T_{ref}/T^*) \qquad (17)$$

where * corresponds to core, middle layer and surface layer. $R_{*,ref}$ is the reference resistance value for layer *, and is a function of mass ratio of layer *.

$$R_{*,ref} = \frac{R_{e,ref}}{m_*/m_{cell}} \qquad (18)$$

where m* is the mass or layer *, and $R_{e,ref}$ is the reference resistance value for the whole cell (0.026 mΩ).

2.2.4 Additional Assumption for Short Circuit

We assume that the core part structure collapses at the melting temperature of the current collector and will interrupt the short. We then assume that the internal short circuit at that high-temperature area will stop. Further, due to heat propagation, the neighboring area will trigger internal short circuit once the separator in neighboring areas melt. For simplicity, we assume that the short circuit happens only at one place at a time, and that the neighboring area starts its internal short after the previous section collapses.

2.3 Side Reaction Model

To simplify the study, the side reaction model includes only three major side reactions, SEI decomposition, anode decomposition, and cathode decomposition.[5] The side reaction model used in this work will be based on the work of Coman,[6] where the Arrhenius equations for the temperature dependent reaction rates of thermal runaway side reactions are included. To match the NMC cathode material used in our experiment, all side reaction parameters are adopted from. Dong.[22] Most of the reaction parameters are the same as Coman,[6] although some parameters are different, including the heat release, activation energy, pre-exponential term of NMC cathode decomposition, and the pre-exponential term of SEI. Detailed values and sources for side reaction parameters are listed in Table 2.

2.3.1 Solid Electrolyte Interface (SEI) Decomposition

The SEI starts to decompose first at temperatures above 130° C.[2]

$$\frac{dx_{SEI,*}}{dt} = -A_{SEI} \cdot x_{SEI,*} \cdot \exp\left(-\frac{E_{SEI}}{k_b T_*}\right) \qquad (19)$$

where $\chi_{SEI,*}$ is the fraction of Li in the SEI in layer * (*=core, mid, surf), $A_{SEI}$ is the frequency factor for SEI decomposition and $E_{SEI}$ is the activation energy for SEI decomposition, $k_b$ is Boltzmann's constant, and T* is the temperature layer *. The heat released by SEI decomposition in each layer * is given by:

$$\dot{Q}_{SEI,*} = -m_{an,*} \cdot h_{SEI} \cdot \frac{dx_{SEI,*}}{dt} \qquad (20)$$

where $h_{SEI}$ is the reaction enthalpy of SEI decomposition. The mass fraction of anode material in each layer is given by the total anode mass multiplied by the mass fraction of the layer to the cell total $m_{an,*} = m_{an} \cdot m^*/m_{cell}$.

2.3.2 Anode Decomposition

Intercalated lithium in graphite starts to react with the electrolyte at high temperature. This side reaction starts at around 180° C.[23]

$$\frac{dx_{an,*}}{dt} = -A_{an} \cdot x_{an,*} \cdot \exp\left(-\frac{E_{an}}{k_B T_*}\right) \cdot \exp\left(-\frac{z_*}{z_0}\right) \quad (21)$$

where $\chi_{an,*}$ is the fraction of Li in the anode in layer *, $A_{an}$ is the frequency factor for anode decomposition and $E_{an}$ is the activation energy for anode decomposition. In addition, the relative SEI thickness (z) is also considered in anode decomposition (tunneling effect[11]).

$$\frac{dz_*}{dt} = A_{an} \cdot x_{an,*} \cdot \exp\left(-\frac{E_{an}}{k_B T_*}\right) \cdot \exp\left(-\frac{z_*}{z_0}\right) \quad (22)$$

where z* is a dimensionless number representing relative SEI thickness in layer *. The heat released by decomposition of the anode in each layer * is given by:

$$\dot{Q}_{an,*} = -m_{an,*} \cdot h_{an} \cdot \frac{dx_{an,*}}{dt} \quad (23)$$

where $h_{an}$ is the reaction enthalpy of anode decomposition.

2.3.3 Cathode Decomposition

Finally at the highest temperature, the cathode material starts to decompose releasing oxygen and heat. For the NMC battery chemistry, this side reaction usually starts at 240° C.[24] The rate of conversion, of the cathode active material is given by:

$$\frac{d\alpha_*}{dt} = \alpha_*(1-\alpha_*) \cdot A_{ca} \cdot \exp\left(-\frac{E_{ca}}{k_B T_*}\right) \quad (24)$$

where $\alpha_*$ is the degree of conversion of cathode decomposition in layer *. The reaction stops when $\alpha_* = 1$ and all of the cathode material in that layer has been consumed. $A_{ca}$ is the frequency factor for cathode decomposition and $E_{ca}$ is the activation energy for cathode decomposition. The heat generation in each layer is proportional to the rate of conversion given by:

$$\dot{Q}_{ca,*} = m_{ca,*} \cdot h_{ca} \cdot \frac{d\alpha_*}{dt}. \quad (25)$$

where $h_{ca}$ is the reaction enthalpy of cathode decomposition. Similarly to the anode, the mass fraction of cathode material in each layer is given by the total anode mass multiplied by the mass fraction of the layer to the cell total $m_{ca,*} = m_{ca} \cdot m^*/m_{cell}$.

Equations 19-25 describe the thermal runaway side reactions. The temperature in Eq. 19-25 should be the local temperature (core, middle, surface layer). At different regions of the battery, we will see different reaction rates for the side reactions.

2.4 Coupling ISC and Anode Decomposition

Figure 12:
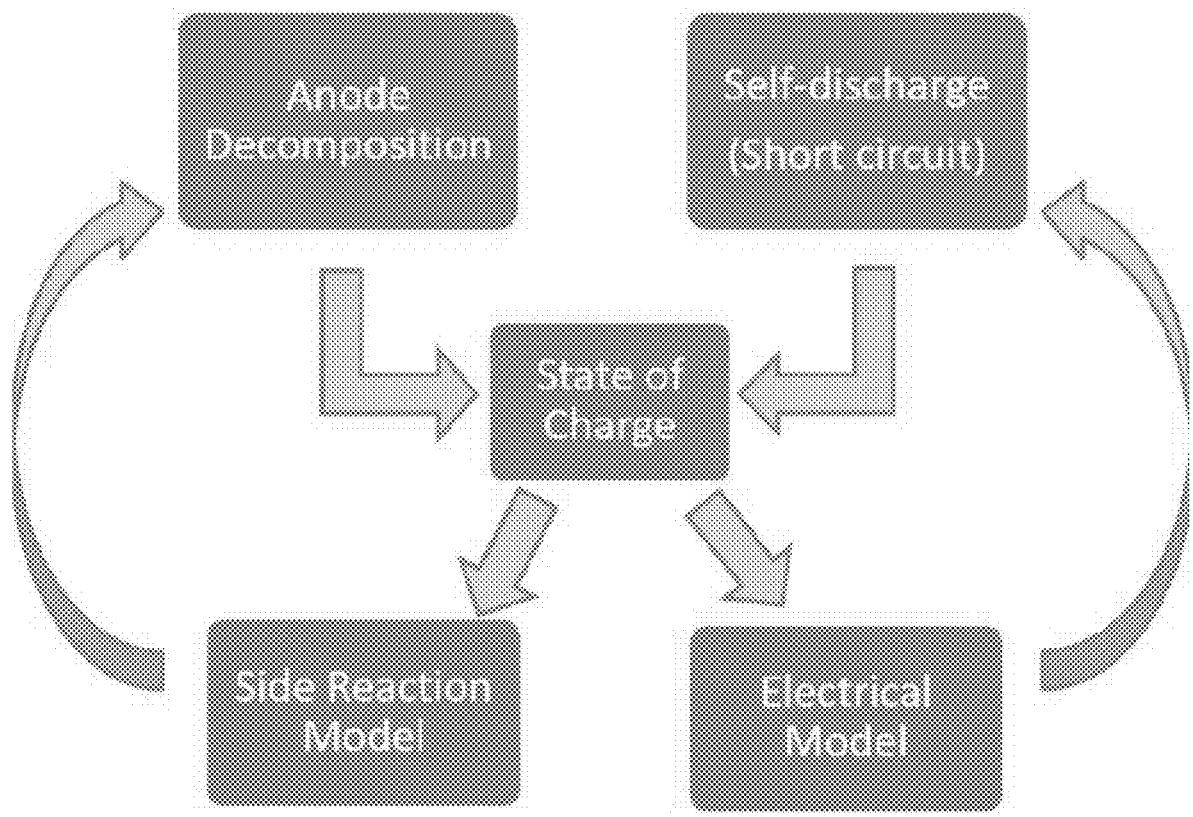
FIG. 12 shows a coupling ISC and an anode decomposition.

The anode decomposition and self-discharge due to ISC are coupled in this work, as they both consume Li in the anode. As shown in FIG. 12, both processes cause SOC to decrease. The SOC is an important parameter in the side reaction model and the electrical model which impacts the total heat release. Higher initial SOC increases the chance of thermal runaway since the heat released during the ISC is larger. After coupling, SOC can be expressed as the weighted average fraction of Li of the anode in all layers ($\chi_{an,*}$).

$$SOC = \sum_* \frac{m_*}{m_{cell}} \frac{x_{an,*}}{x_{an,0}} \quad (26)$$

where $\chi_{an,0}$ is the initial Li fraction in an anode for fully charged cells. Then anode decomposition and SOC change of a cell with capacity C can be re-written as:

$$\frac{dSOC}{dt} = -\frac{I_{short}}{C} - \frac{1}{x_{an,0}} \sum_* \frac{m_*}{m_{cell}} A_{an} \cdot x_{an,*} \cdot \exp\left(-\frac{E_{an}}{k_B T_*}\right) \cdot \exp\left(-\frac{z_*}{z_0}\right) \quad (27)$$

where * here represents core, middle layer or surface layer, and $\chi_{an,*}$ represent local $\chi_{an}$ in core, middle layer or surface layer. Assuming that $I_{short}$ depletes lithium in all sections proportionally, then the fraction of lithium in each section is computed by:

$$\frac{dx_{an,*}}{dt} = -A_{an} \cdot x_{an,*} \cdot \exp\left(-\frac{E_{an}}{k_B T_*}\right) \cdot \exp\left(-\frac{z_*}{z_0}\right) - x_{an,0} \frac{I_{short}}{C} \quad (28)$$

instead of solving Eq. 21, where T* the local temperature for core, middle and surface layer.

2.5 Gas Evolution Model

Previous studies have assumed the main component of SEI is $(CH_2OCO_2Li)_2$.[1] They showed the SEI decomposition react ion mechanism, which will release $CO_2$.[1,25]

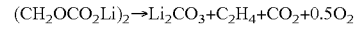

Experiments on commercial 18650 Li-ion batteries from Lainmer et al.[15] showed that during the first veining, most of the gas is $CO_2$. Based on these results, we assume that $CO_2$ is the main component of vented gas and it causes the gas pressure build-up process inside the cell before venting. Our study only models the gas generation of $CO_2$ coming from SEI decomposition which important for early indication of potential thermal runaway. The quantity of SEI consumed in mol can be expressed as:

$$n_{(CH_2OCO_2Li)_2} = \frac{\sum_* m_{an,*}(x_{SEI,0} - x_{SEI,*})}{2M_{C_6}} \quad (29)$$

where $M_{C_6}$ is the mass per mol (g/mol) for $C_6$, the main component of anode when completed delithiated, and $n_{(CH_2OCO_2Li)_2}$ is the quantity of lithium-containing metastable species in SEI consumed in the reaction in mol. Since the SEI decomposition reaction mechanism shows the proportional constant for generated $CO_2$ and the consumed SEI quantity is 1, then the quantity of gas generated in mol can be expressed as:

$$n_{CO_2} = n_{(CH_2OCO_2Li)_2} = \frac{\sum_* m_{an,*}(x_{SEI,0} - x_{SEI,*})}{2M_{C_6}} \quad (30)$$

Hence the thermal model can be used to predict the gas pressure using the ideal gas law. As $n_{CO_2}$ is a small number, for convenience, $n_{CO_2}$ will be shown in mmol units in following discussions.

The gas evolution model can be used to predict battery force changes during the early stage of a thermal runaway if volume is known. During the early stages of TR, the cell's mechanical behavior is mainly due to the increased internal gas pressure within the cell. The force and gas pressure have different units, but the gas pressure can be used to predict the overall trend of cell mechanical behavior.

3 Experimental Setup

Figure 13A:
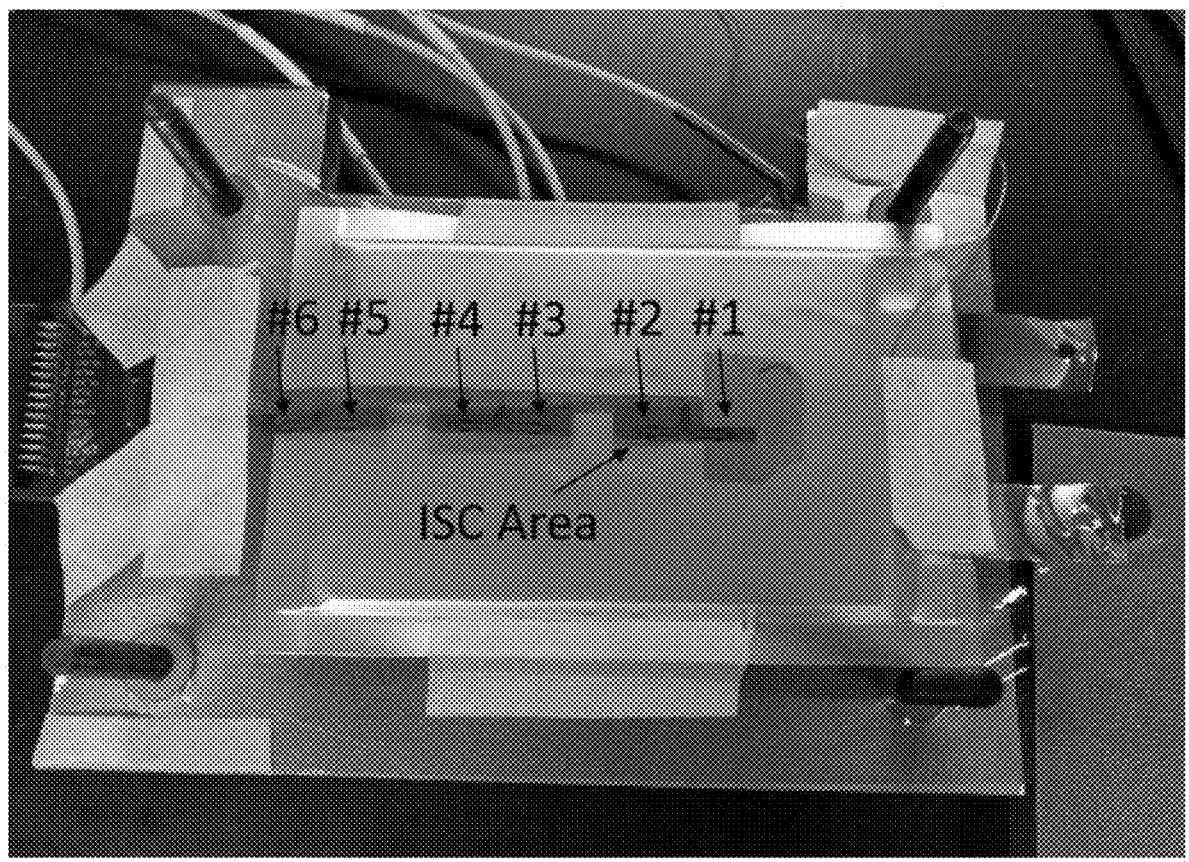
FIG. 13A shows an experiment setup including a cell before an internal short test.

The batteries used in this experiment were manufactured at the University of Michigan Battery Lab. The pouch cell size is 133 mm×89 mm×4 mm. As shown in FIG. 13A, a thermal runaway experiment using a 4.5 Ah Nickel Manganese Cobalt Oxide (NMC) pouch cell was set up to validate the model. The pouch cell was assembled with a hole in the separator covered by wax in one of the outer layers of the cell, the hole size being around 10 mm radius. The 1 kHz impedance of cell, from EIS testing, was 4.76 mΩ at 20° C. The experiment was performed for two pouch cells, one with 50% SOC and the other cell was fully charged (100% SOC). The battery specifications are provided in Table 1.

The instrumented cell fixture was slowly heated in an Accelerating Rate calorimeter (ARC) until the wax melted at around 57° C., and triggering an internal short circuit. The ambient temperature was measured with a T-type thermocouple. The thermocouple was placed between the current collecting tabs, and the reading was 63° C. before the thermal runaway event. The whole ARC chamber was continuously heated at around 0.7° C./min and reached 63° C. before the onset of the internal short circuit event. When the core part in the pouch cell reached its melting point (around 57° C.) it triggered the ISC. A sketch of the sectional view of pouch cell tested is shown in FIG. 13B, to better illustrate the location and size of initial ISC area.

Figure 13B:
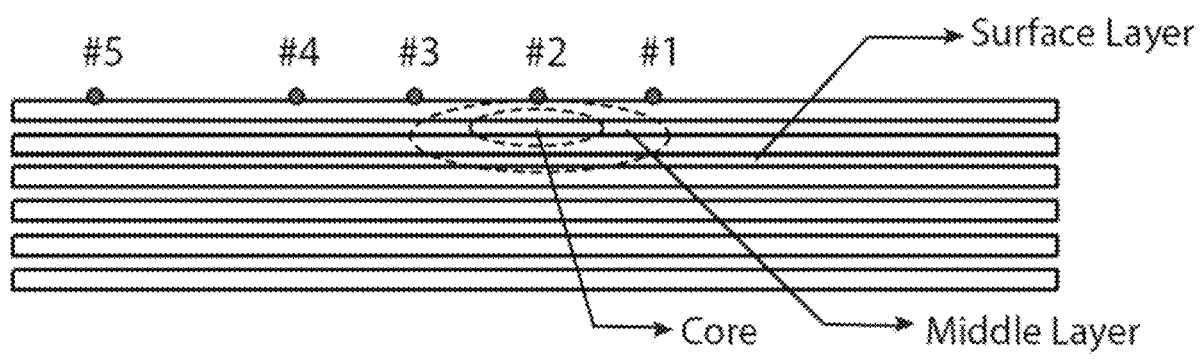
FIG. 13B shows an experiment setup including sensor locations from a sectional view.
Figure 13C:
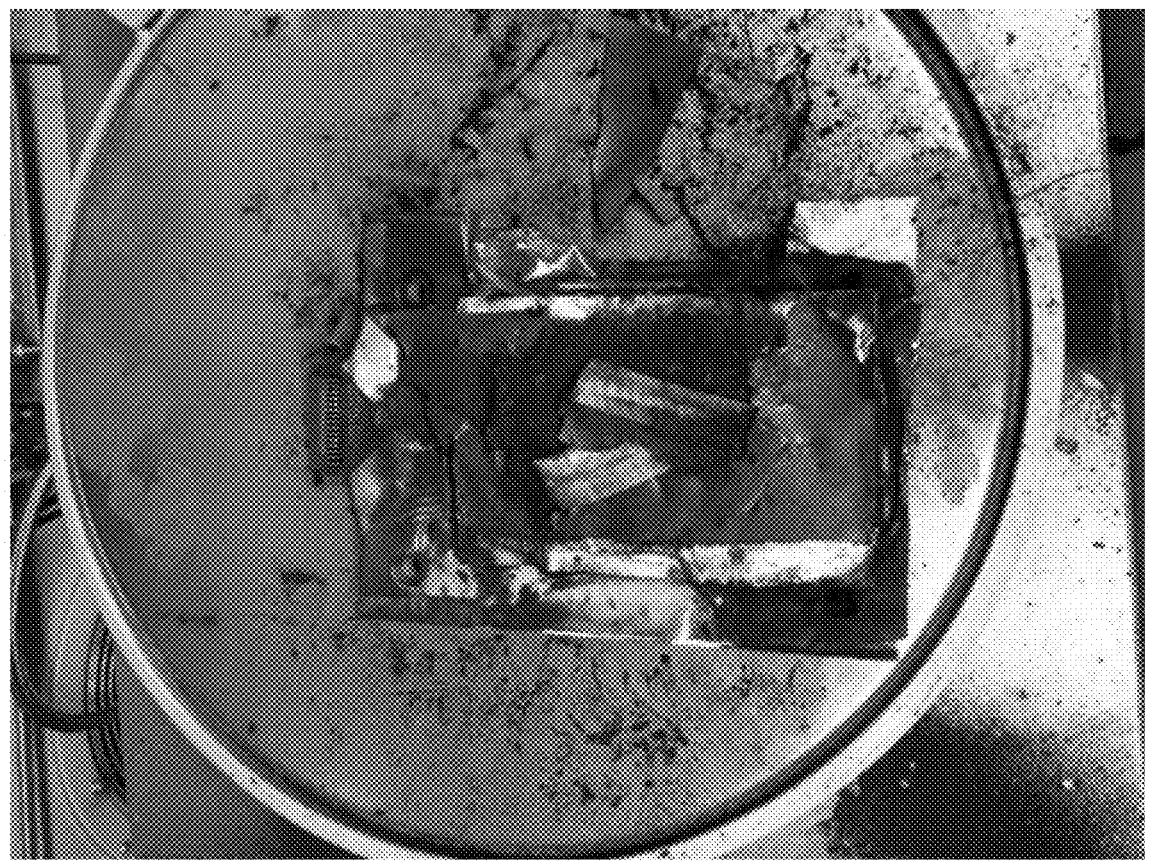
FIG. 13C shows an experiment setup including a cell after a thermal runaway.

The experiment measures battery surface temperature using an array with six thin film platinum RTD sensors,[26] as shown in FIG. 13A and FIG. 13B. At the same time, force is measured on the fixture using four load washers attached to the four corners of the fixture. The force signal is used to measure the expansion of the battery against the fixture. The peak force measured exceeds 400 pounds and is the result of gas pressure that built up inside the pouch during thermal runaway before cell venting. The ISC location and sensor locations are shown in FIG. 13A and FIG. 13B. Further details of the experiment and the tested battery cell are in Example 1 and Table 1.

4 Result and Analysis

The model is compared with the two internal short circuit test results—Test One for the 100% SOC cell. Test Two for the 50% SOC cell. The cell with 50% SOC didn't go to thermal runaway, and instead experienced a slow self-discharge. The fully charged cell experienced a quick thermal runaway, as shown in FIG. 13G.

Before further discussing the experiment and comparing our model and the experimental results, a few assumptions have been made for the model. First, the e volumes of the core and middle layer are tuned to match the experimental data. The core mass used for our simulation is chosen to be 1% of total mass to match the duration of internal short circuit for 50% SOC cell. The middle layer is 4.5% of total battery mass based on a minimum least square error of the model and experimental surface temperature measured by sensor #45 in FIG. 13A.

The hole in the separator is around 10 mm in radius, and from previous discussion of ISC resistance, Eq. 12 can be used to estimate the short circuit resistance. The estimated $R_{short}$ for this pouch cell is 3.68 mΩ.

The equivalent thermal resistance can be calculated using cell heat conduct conductivity ($\lambda_x$=21 W/(m·K), $\lambda_y$=21 W/(m·K), $\lambda_z$=0.5 W/(m·K)[9]) and geometry of the three regions. As the shape of the pouch cell is long and flat, we can roughly approximate the thermal resistance by the following equation:

$$r_i = \frac{\Delta d_i}{\lambda_z A_i} (i = c2m, m2s) \qquad (31)$$

where $r_x$ is thermal resistance for core to middle, or middle to surface, $\Delta d_i$ is the vertical distance between the mass center of the core to middle layer, or the middle layer to surface layer, and $A_i$ is the contact area in the x and y plane for core to middle, or middle to surface layer. In calculating thermal resistance, we assume the core and middle layer to be cylinders. For the core, we roughly assume it as a cylinder with 10 mm radius and 1.51 mm height, which will correspond to 1% core volume ratio. For the middle layer, we assume it as a cylinder with 16.5 mm radius and 2.5 mm height, which correspond to 4.5% middle layer volume ratio. $\Delta d_i$ and $A_i$ will be provided in Table 2 that are used to calculate $r_{c2m}$ and $r_{m2s}$.

The melting point of Aluminum is 660° C., and around 1000° C. for Copper, so the current collector will melt and at that point the battery structure collapses. We can then assume that the internal short circuit will stop at sections with temperatures above 660° C. As the heat propagates to neighboring areas, an internal short starts in the neighbouring areas after that collapse.

In addition, the experiment, setup contains a compliant rubber foam pad and an aluminum fixture, which should be considered in the model to accurately represent the heat transfer to the ambient environment. The equivalent thermal resistance $r_{s2a}$ now represents the thermal resistance between the battery surface and the aluminum fixture, so that the $T_{amb}$ term in Eq. 3 will now be $T_{fix}$. The aluminum fixture is not an ideal heat sink, in this case, the temperature rise of the fixture can be expressed as:

$$C_{p,Al} \cdot m_{fix} \frac{dT_{fix}}{dt} = \frac{T_{surf} - T_{fix}}{r_{s2a}} + \frac{T_{amb} - T_{fix}}{r_{fix}} \qquad (32)$$

where thermal resistance terms $r_{s2a}$ and $r_{fix}$ are correlated with the rubber foam properties and heat transfer process from air to fixture. For convenience, these two thermal resistance terms will be given in Table 2 directly. Other model parameters for the fully charged cell are also presented in Table 2. The parameters come from existing literature, direct measurement, fitting, approximation or estimation based on the equations in this paper. The comparison between experiment result and model prediction for both tests will be shown in the following.

4.1 Test One: Fully Charged Cell

The first experiment was performed with a cell at 100% SOC, and it resulted in a thermal runaway. The behavior of fast voltage drop out recovering is referred as Mode B in previous studies,[27] except in this case a quick thermal runaway event was triggered. As described by Feng,[1] the shrinkage and collapse of the separator following the shutdown caused a ISC, triggering a quick thermal runaway in the tested battery cell. The model assumes that for the fully charged cell, the propagation of ohmic heat leads to additional short-circuit regions after the initial short circuit area burns out.[27]

A function $\in_{ISC\_t1}$ is implemented here to control the state of ISC of Test One, $\in_{ISC\_t1}=0$ represents no massive ISC, while $\in_{ISC\_t1}=1$ represents an ongoing ISC in the cell. $\in_{ISC\_t1}$ is a function of maximum core temperature recorded in the model before tinge $t_0$, defined as $T_{max}=\max\{T_{core}|_{t \leq t_0}\}$, and can be expressed as:

$$\in_{ISC\_t1} = \begin{cases} 1, & \text{if } T_{max} > 57° \text{ C.} \\ 0, & \text{otherwise.} \end{cases} \tag{33}$$

Figure 14A:
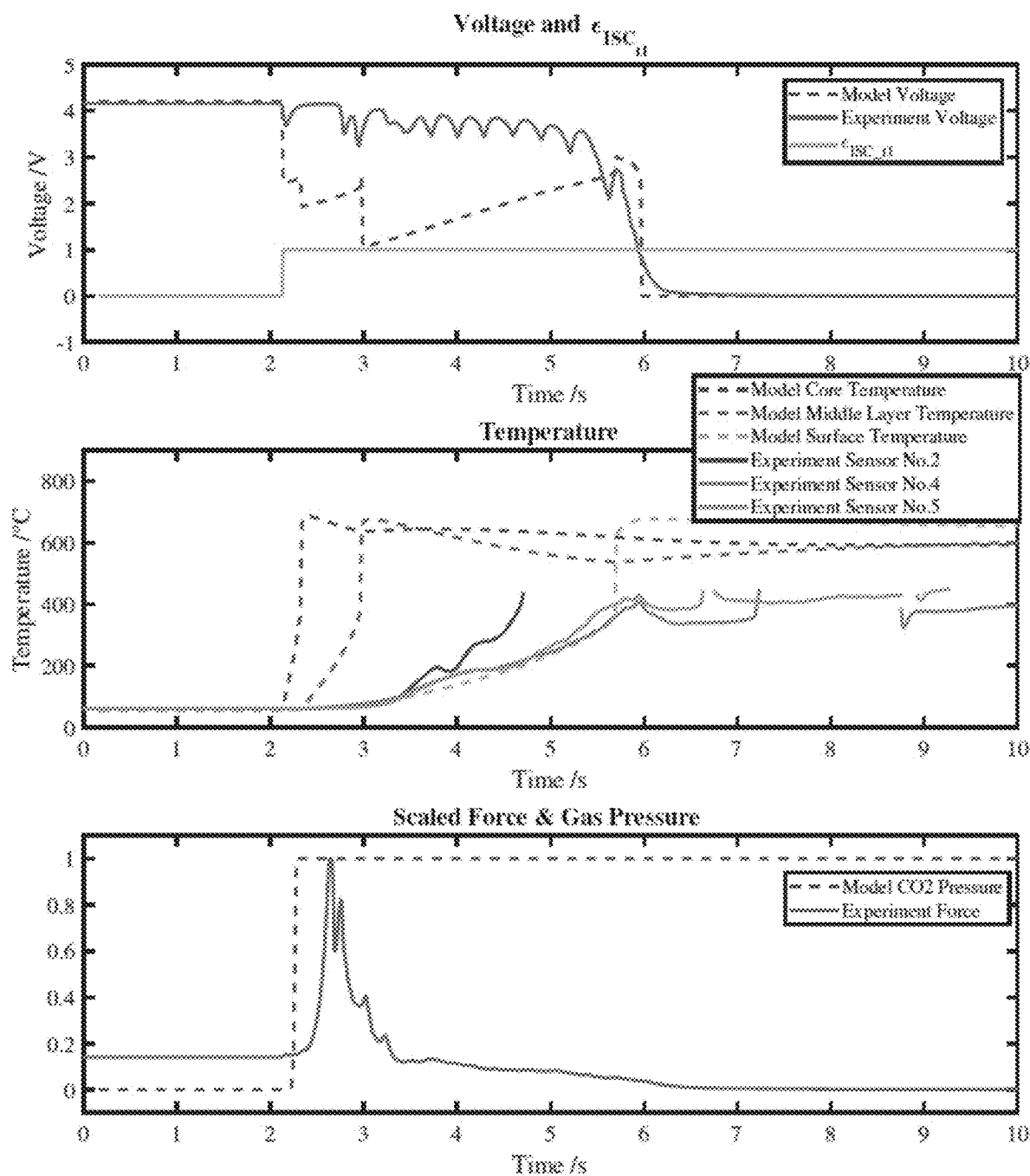
FIG. 14A shows a test one result (catastrophic thermal runaway) including the timings of the voltage drop. Temperature rise with battery internal pressure build-up are well captured by the model.
Figure 14B:
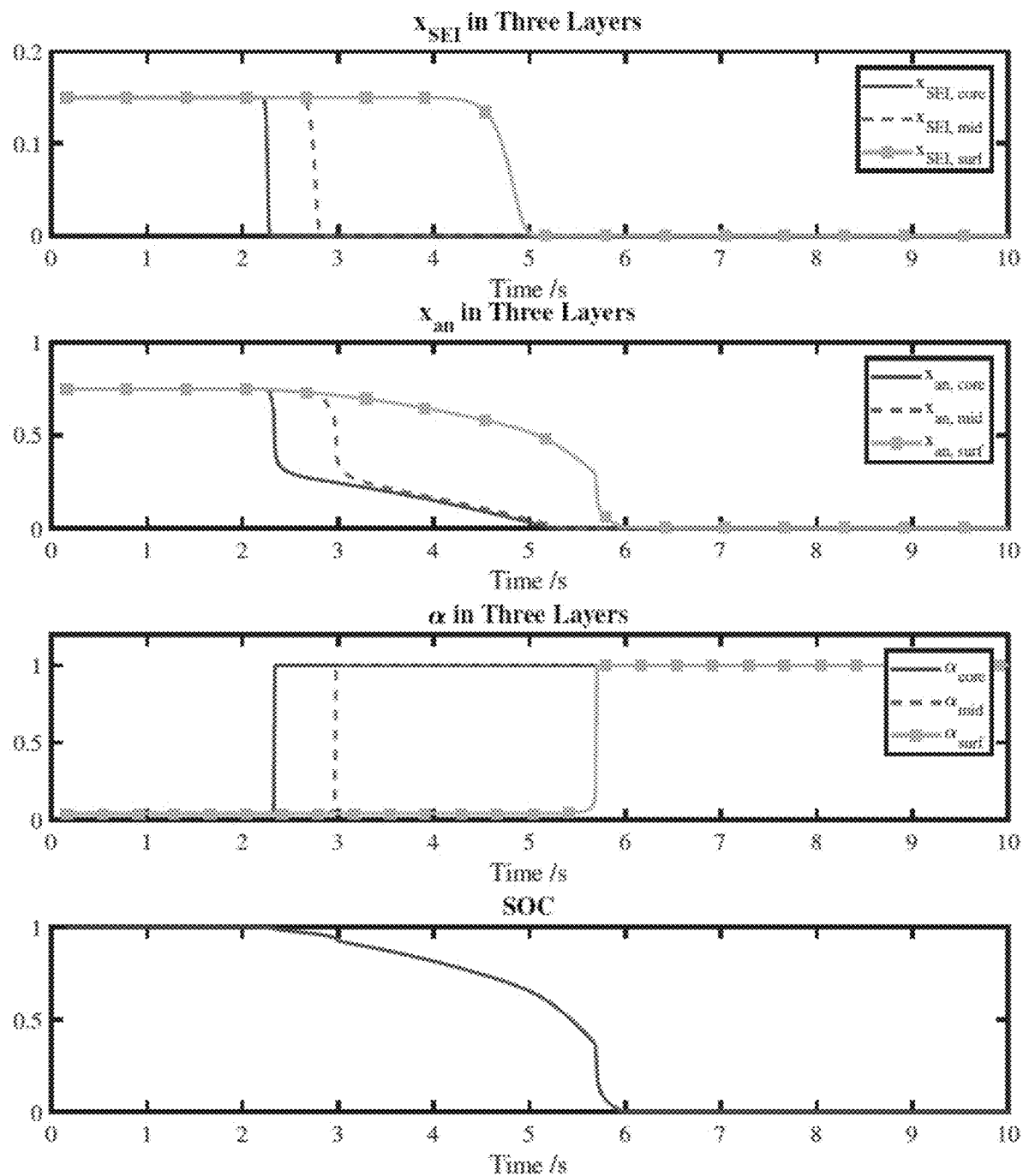
FIG. 14B shows a test one result (catastrophic thermal runaway) including side reaction parameters that show the side reactions sequence during a thermal runaway.

The Test One result is shown in FIG. 14A. The solid line shows the experimental result, and the dashed line is the model prediction. The side reaction parameters and SOC predicted by the model are shown in FIG. 14B.

4.1.1 Voltage Analysis

The voltage drop at t=2.1 s in FIG. 14A represents the start of the internal short circuit event. When voltage drops to zero, the ohmic heat generation stops. The oscillation in the measured voltage is the result of the intermittent connection of the ISC due to structural changes at high temperature. The model predicts a stepwise voltage drop because we assume the ISC area gill expand to the neighboring area, and as discussed above, the larger ISC area will decrease the $R_{short}$, and decrease the terminal voltage. The model voltage increases at 3 to 5 seconds, and this is due to $R_{cell}$, decrease with temper rise, while the $R_{short}$ stays constant with temperature change.

To be noticed, voltage is also a function of SOC. However, the SOC voltage curve is relatively flat, as seen in FIG. 10B. The influence of the SOC change in voltage is relatively small in this thermal runaway event. On the overall time scale, the model matches with experiment data and predicts total battery failure at approximately the same time as the experiment.

4.1.2 Temperature Analysis

The RTD sensors are located in different regions of the pouch cell, as seen in FIG. 13A. The ISC trigger device is located near the surface, as described by Pannala.[16] As seen from the sensor locations of FIG. 13B, the RTD sensor #2 corresponds to the surface layer in the model but is physically located directly above the ISC area. RTD sensor #1, #3 and #4 measure the temperatures at the surface, each RTD sensor is spaced 1.75 mm apart,[26] RTD sensor #5 measures the temperature of the bulk surface.

The second subplot in FIG. 14A shows the comparison of model and experimental temperatures. The experimental data above 450° C. has been ignored, because the melting point of Kapton used in RTD sensor is 400° C. The readings from RTD sensor #1 and #2 are very similar due to their close proximity, the same for RTD sensor #3 and #4. RTD sensor #6 was damaged prior to installation, and could not be used. For readability, only data from sensor #2, #4 and #5 will be presented and analyzed.

The RTD sensor #2 is at the surface layer of the battery model, but it is located above the middle layer and core part, so its response should be close to our modeled middle layer temperatures. The experimental data from RTD sensor #2 (the purple solid line in the plot) is in between the modeled middle layer temperature (dashed red line) and the modeled surface temperature (dashed yellow line), and this is due to the small middle layer chosen in this study, so the RTD sensor #2 response will be slower than the modeled middle layer temperature. RTD sensor #4 (green solid line) and #5 (blue solid line) measure the surface temperature and match well with the modeled surface layer temperature.

The model matches well with the temperature measured experimentally, which indicates that this pouch cell can be modeled using the proposed three section model. However, a highly discretized distributed model or 3D finite element method is recommended the temperature at different point, of the cell surface is the main focus.

At around 5.8 seconds, the model predicts a sudden surface temperature rise. This sudden rise is due to cathode decomposition in the surface layer which released a vast amount of energy in a short time around 5.8 seconds, as shown in FIG. 14B. The sudden rise of surface temperature also increased other exothermic reactions including anode decomposition, which depleted SOC in the cell. At 5.8 seconds, the cell reached peak surface temperature, and it completed the exothermic reactions and internal short circuit process in this thermal runaway event.

4.1.3 Force & Gas Anaylsis

As there is no good way of measuring battery core temperature directly in the experiment, the force measurement is the chosen alternative for early detection of thermal runaway inside the battery.

From the experimental data we see a sharp rise and drop of force measurement. Compared the with battery force signal at the start of experiment, the force increased 2.5 pounds due to battery thermal expansion caused by a 30° C. temperature increase. After the short circuit, before venting, the peak force rose over 400 pounds. The sharp rise of force is the result of pressure that is built up due to formed gas. Example 1 using a thermocouple placed between the tabs, also detected vented hot gases following a quick drop of force. So the quick drop of force is the result of venting of the pouch.

In the model, the primary source of $CO_2$ during the early stage of thermal runaway is assumed to come front SEI breakdown. The model predicted force comes from gas pressure build-up due to SEI breakdown in the core section.

According to the observed decomposition reactions of each layer in the three-section model, the predicted gas generation will include additive contributions from each of three sections, core, middle layer, and surface layer. A significant amount of gas is generated when the middle layer and surface, layer reach the critical temperature. However, since the pouch breaks soon after the first stage gas pressure build-up, only the $CO_2$ generated in core section is presented in the third subplot of FIG. 14A. Also, since the force measurement and gas pressure have different scale units, so the force data and gas pressure are both normalized to 1 using the maximum value over the experiment duration.

From the third subplot of FIG. 14A, the two peaks of force and predicted gas pressure align well. The model successfully predicts the battery core temperature rise prior to surface temperature rise, and the timing of care temperature rise matches well with our experimental force measurement. The model is therefore able to predict the feature of gas pressure build-up during a fast, internal short circuit event.

4.2 Test Two with 50% SOC Cell

Figure 15A:
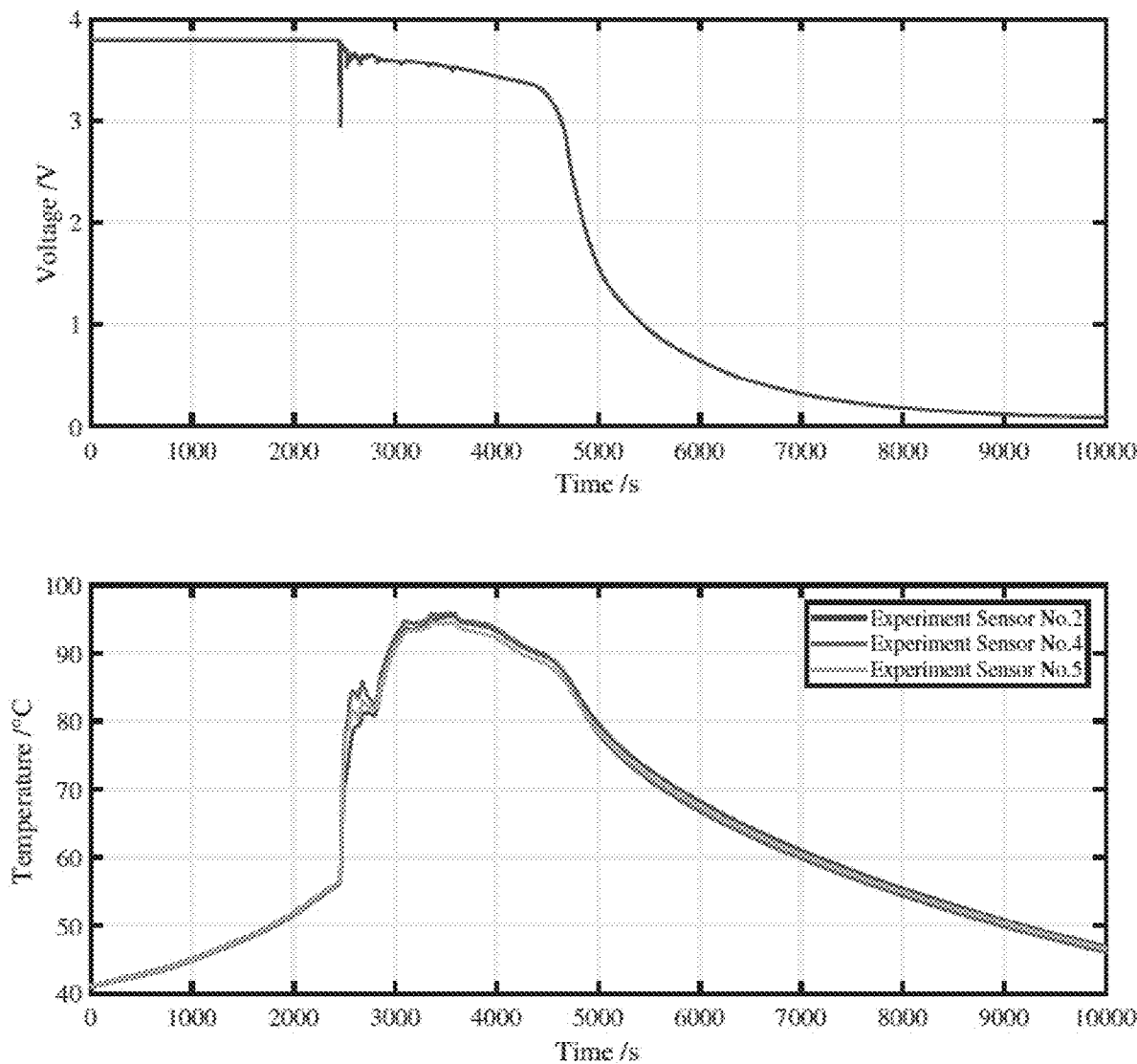
FIG. 15A shows a test two result (slow self-discharge) including the terminal voltage and temperature profile of 50% SOC cell from an experiment over 10000 seconds. No thermal runaway was observed, but a slow self-discharge process after triggering ISC was.

For the cell with 50% SOC, that was also heated to 57° C., an ISC was triggered but didn't evolve into a catastrophic thermal runaway. In Test Two, the cell experienced a rapid decrease and subsequent recovery of voltage after the ISC was triggered. It then processed to a slow self-discharge process that completely used up the available lithium ions after 8000 seconds. FIG. 15A shows this behavior in our experiment over 10000 seconds. This behavior is similar to the result in previous study on internal short-circuit, described as Mode A[27] or fusing phenomenon.[28] In the fusing phenomenon, the shutdown of the internal short circuit and the quick voltage recovery happen because of the burnt-out of the area around the initial ISC. Then a following small-scale ISC event occurs resulting in a slow self-discharge process.[28]

Kim[27] used an infrared camera and showed the peak temperature for the nail penetration region in a Mode A short is around 200° C. to 210° C. In the current model, 200° C. will be used as the critical temperature of Mode A. The ISC stops after the core region reaches 200° C. This temperature range fits well with both experimental and model data, in this study.

For Test Two, the internal short circuit was assumed to shut down when the core temperature reached 200° C. Similar to Test One, a function $f_{SC\_t2}$ is implemented here to control the state of ISC of Test Two. $f_{SC\_t2}=0$ represents no massive ISC, while $f_{SC\_t2}=1$ represents an ongoing ISC in the cell. Defined same as test one, max $T_{max}=$,ax $\{T_{core}|_{t \le t_0}\}$. $f_{SC\_t2}$ is a function of $T_{max}$, and can be expressed as:

$$\epsilon_{ISC\_t2} = \begin{cases} 1, & \text{if } T_{max} > 57° \text{ C. \& } T_{max} \le 200° \text{ C.} \\ 0, & \text{otherwise.} \end{cases} \quad (34)$$

Figure 15B:
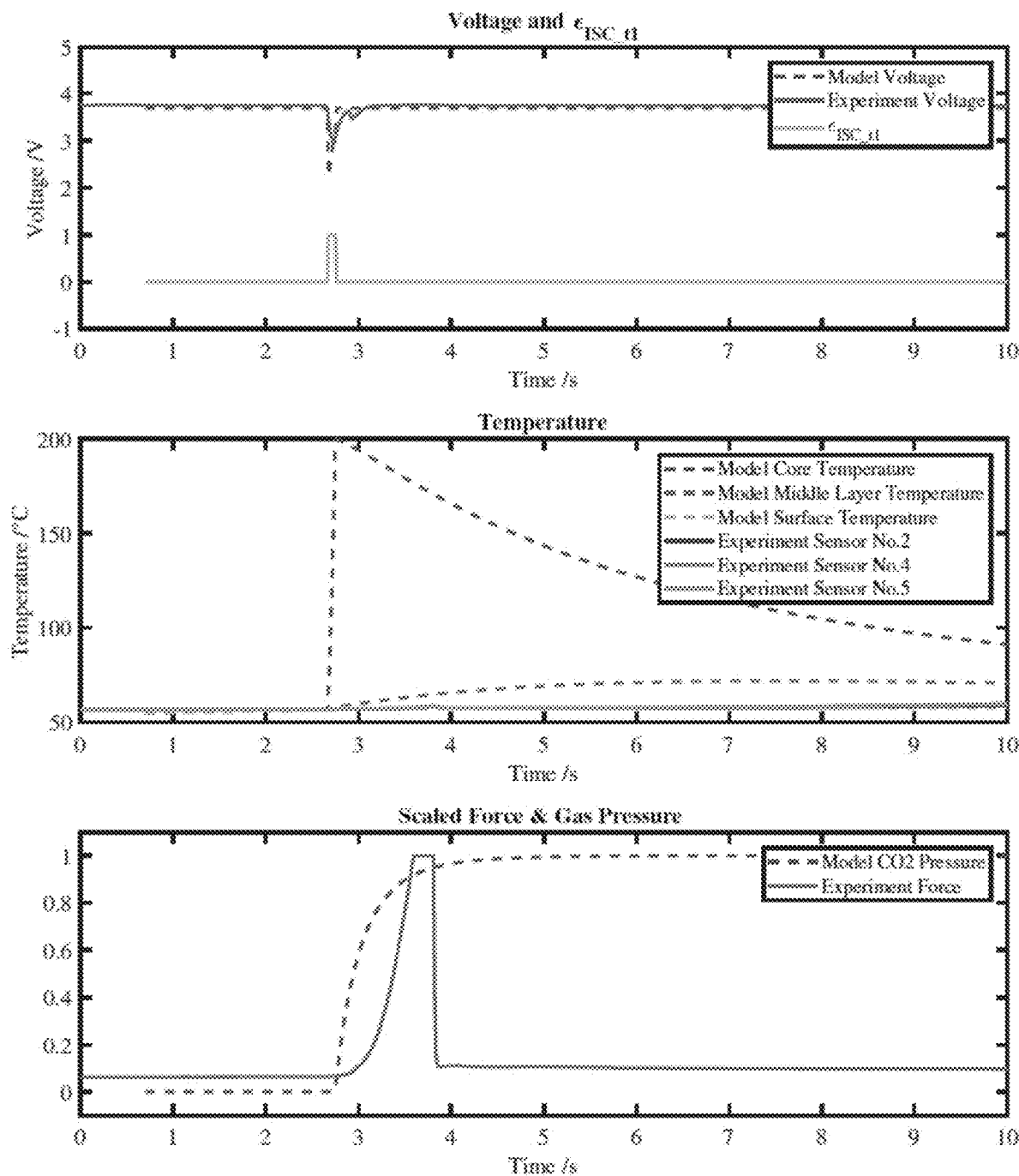
FIG. 15B shows a test two result (slow self-discharge) including the model that matches the measured voltage, temperature, and build-up of internal pressure well.
Figure 15C:
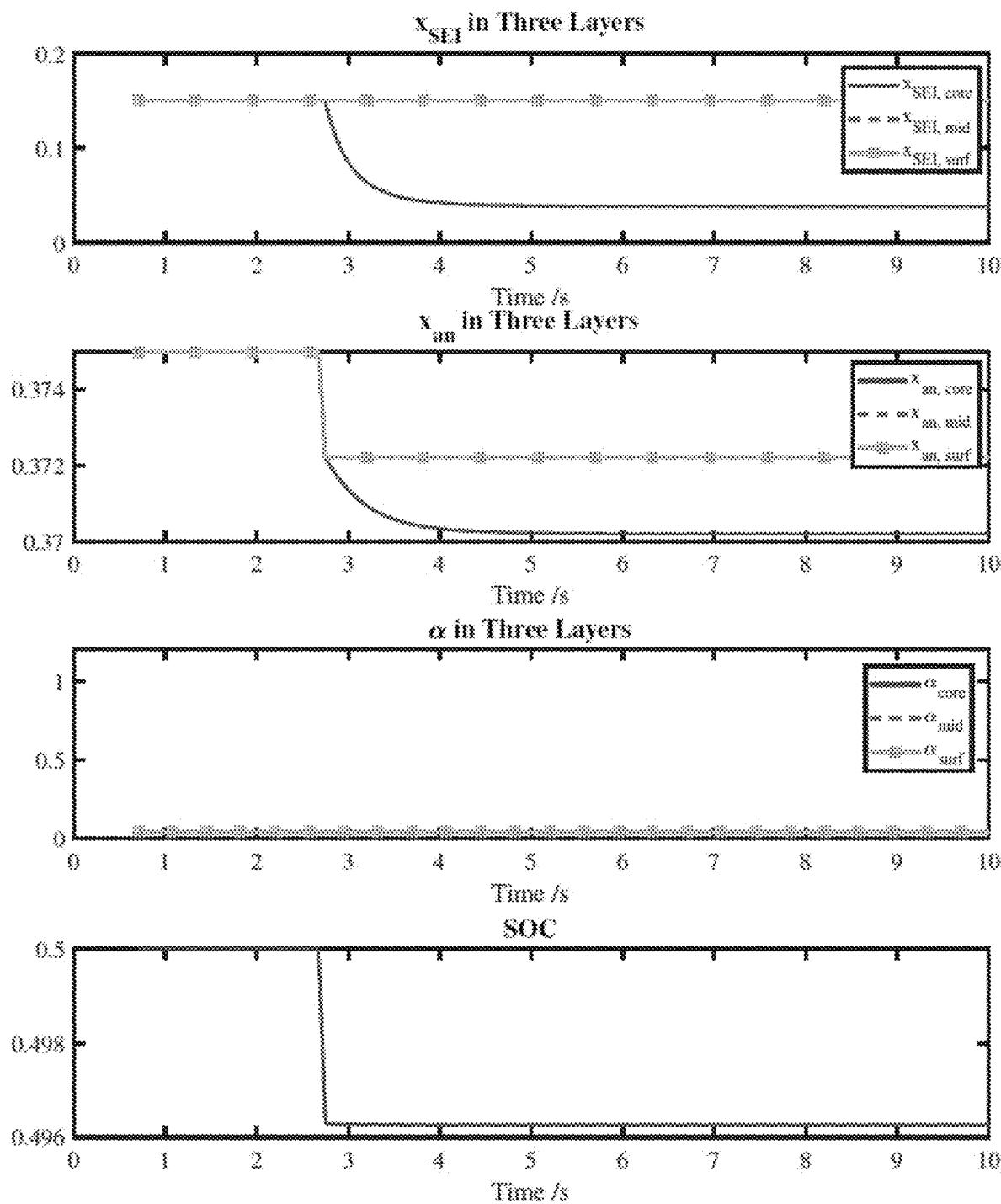
FIG. 15C shows a test two result (slow self-discharge) including side reaction parameters that show that the SEI decomposition is the only active side reaction.

Test Two result is shown in FIG. 15B. The solid line represents the experiment results, and the dashed line is the model prediction the side reaction parameters predicted by the model are given in FIG. 15G.

4.2.1 Voltage Analysis

The first subplot of FIG. 15B is a comparison of voltage from the experiment and model. The voltage drop at t=2.65 s represents the start of the internal short circuit event. The model matches with experimental data on the timescale and overall trend. It also successfully shows the shutdown of ISC and the voltage recovering.

4.2.2 Temperature Analysis

Temperature sensor locations for Test Two are the same for Test One. In this test, the cell didn't trigger a quick thermal runaway.

As the core temperature reached 200° C., the ISC stopped due to burn out of the short circuit region, so the ISC process only lasted for a small period of time and caused core layer temperature rise only. RTD sensors located on the battery surface showed few changes of their readings during the ISC process. The model prediction matches well with the middle layer and surface Layer temperature and at the same time predicts core temperature rise (blue dashed line), which cannot be measured by RTD sensors in the experiment.

4.2.3 Force & Gas Analysis

Similar to Test One, the force measurement can be used to detect potential ISC within the cell. From the third subplot of FIG. 15B for Test Two, the time for the peak of force and the rising time for gas pressure align well. The model successfully predicts the battery core temperature rise, and while at the same time shows that the battery didn't progress into a quick thermal runaway.

4.3 Analysis for Different ISC Modes

Both Test One and Test Two were conducted under the same conditions, except for cell SOC but each progressed to a different ISC event. The fully charged cell went into thermal runaway while the 50% SOC cell experienced fusing phenomenon and didn't explode. However, SOC is not the only factor in determining the ISC mode. Previous nail penetration experiments and computational analysis pointed out that SOC, separator material[27] and ISC radius[28] will all affect the types of ISC mode.

It is possible that the temperature increase speed for core and neighboring layers is the dominant factor for ISC mode. Unlike the fully charged cell, the 50% SOC cell had a slower temperature rise and a smaller spatial temperature gradient, which in the end didn't trigger a massive addition short circuit that can lead to a catastrophic thermal runaway.

In this study, different model settings of ISC modes are given for Test one and Test two to describe the results.

5 Model Parametric Study

Most of the parameters in the proposed model come from the battery's physical properties. In this study, with the ISC area known, parameters like ISC resistance can be estimated. However, when applying this model to a real case, the ISC resistance and ratio of core mass to total cell mass are usually unknown and need to be tuned to match the experimental data. A parametric study of the thermal runaway model will help to explore the sensitivity of parameters on the model. In this parametric study, ISC resistance, core mass ratio and ISC radius will be studied.

For a parametric study of ISC radius, anode to cathode ISC will be the focus, as anode to cathode ISC is the most common type of ISC.[17] In such a case, changes made to the ISC radius will be applied to both ISC resistance and core mass ratio. As discussed in previous sections, ISC resistance is a function of ISC radius, and the increase of ISC radius will decrease ISC resistance as a result of the larger ISC area. The core mass ratio is also a function of ISC radius. The core section is the battery area affected by the initial ISC, and as expressed by Eq. 4: $V_{core}=\pi r^2_{short}H$, where $r_{short}$ is the radius of short, and H is the height of cylindrical short area. The increase of ISC radius will increase the core mass. The parameters used in experimental sessions will serve as a benchmark case for our model parametric study, with ISC resistance 3.68 mΩ, core mass ratio 1% and ISC radius of 10 mm.

5.1 ISC Resistance

In this section, ISC resistance will be changed to study the influence of model parameters on the prediction of the electrical, thermal and mechanical behavior, Feng[9] used $R_{short}=20Ω$ to study the online detection of ISC. For comparison, ISC resistance will be chosen 5Ω in this parametric study, while the benchmark ISC resistance is 3.68 mΩ.

Figure 16A:
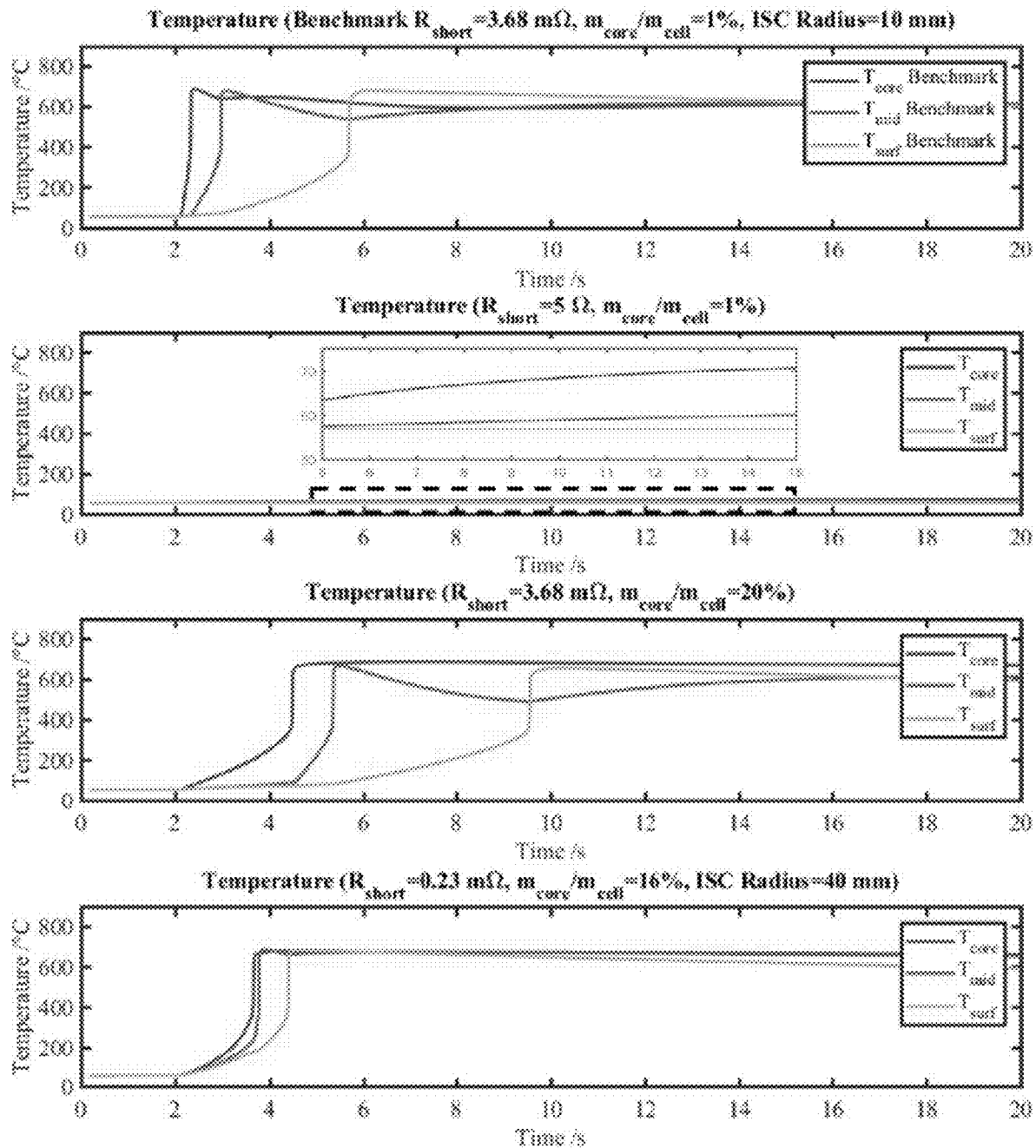
FIG. 16A shows a model parametric (temperature) study on ISC resistance, core mass ratio and ISC radius.
Figure 16B:
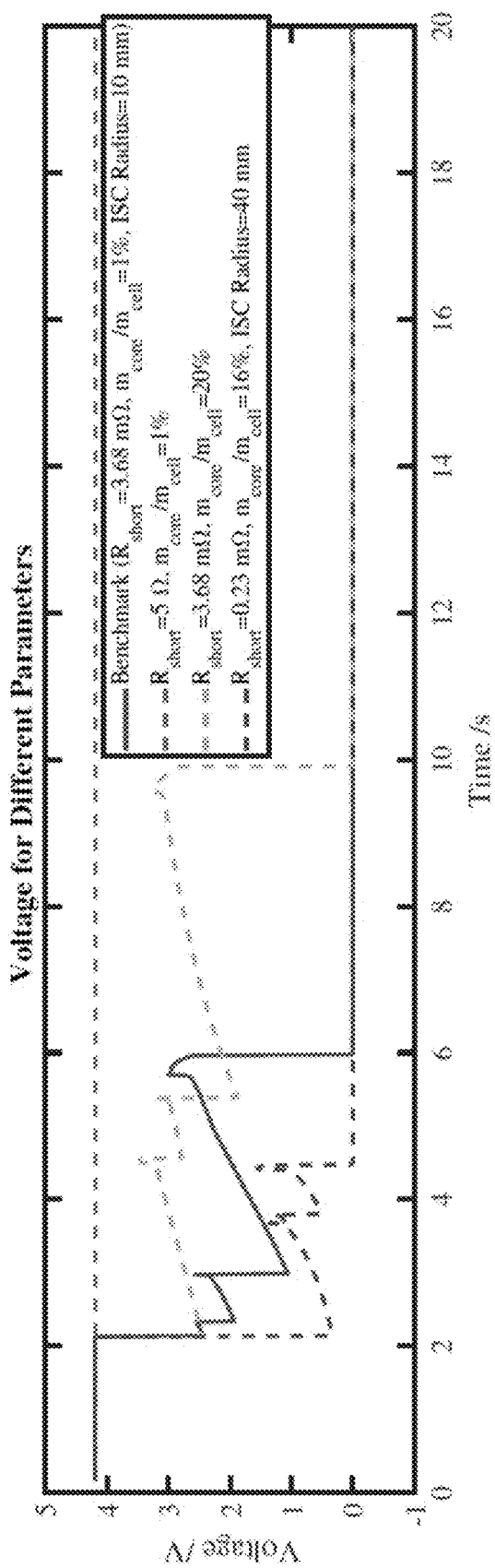
FIG. 16B shows a model parametric (voltage) study on ISC resistance, core mass ratio and ISC radius.

The second subplot for FIG. 16A and red dashed line in FIG. 16B shows the temperature and voltage predicted by the model given different ISC resistances. From the plot, we see the temperature rise of a cell with low ISC resistance is much quicker, and depletes its active material in less than 10 seconds. The cell with high ISC resistance releases the heat slowly, and won't trigger a thermal runaway event. Increasing the resistance will slow the ISC process and possibly prevent a potential thermal runaway event.

Large ISC resistance will have a slow temperature rise, and usually represents micro-shorts in the battery or separator penetrated by a low electric conductivity material. The parametric study of this model can be used to predict the severity of an ISC event, and based on its short circuit radius, it may predict whether the cell will trigger thermal runaway or not.

Figure 16C:
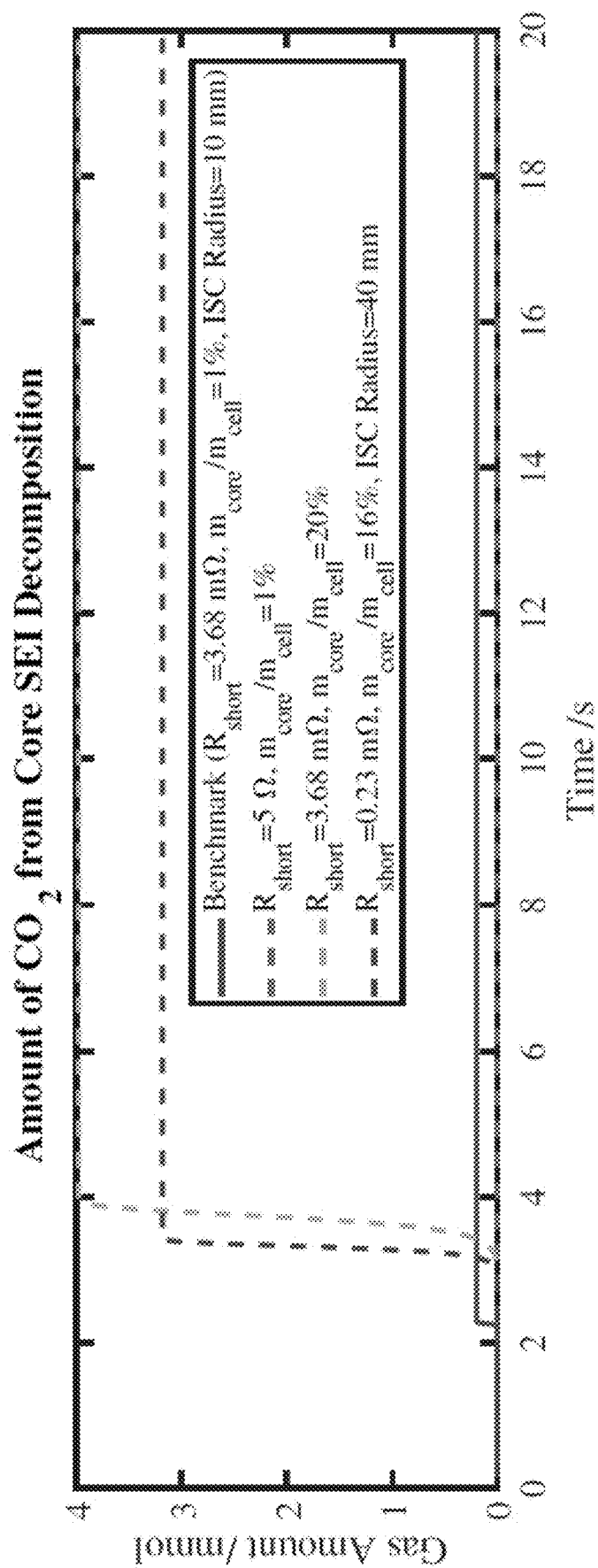
FIG. 16C shows a model parametric ($CO_2$ generation by SEI decomposition in core area) study on ISC resistance, core mass ratio and ISC radius.

FIG. 16C shows the amount of $CO_2$ generated by core SEI decomposition. With ISC resistance so large, the core area will not reach its SEI decomposition critical temperature, every after a few minutes. In this case, the amount of gas generated is limited and can hardly be detected by force or gas sensors.

5.2 Core Mass Ratio

In this section, we demonstrate the effect of changing the core layer mass ratio. The core layer mass ratio is chosen to be 20% of total cell mass, while the benchmark core mass ratio is 1%.

The third subplot for FIG. 16A and yellow dashed line in FIG. 16B shows the temperature and voltage predicted by the model given different core mass ratios, from the plot, we see that with high core mass ratio, the time to reach thermal runaway has been delayed. This is due to the increased effective thermal mass of the core area which decreases the rate of temperature rise and delays the time at which a critical temperature for exothermic reactions is achieved.

5.3 Cathode to Anode ISC with Different ISC Radius

Previous parametric studies have revealed the influence of critical ISC parameters on model performance. For the most common Cathode to Anode ISC, with high conductivity material crossing the separator, core mass ratio and ISC resistance are both a function of ISC area, as indicated by Eq. 4 and Eq. 12. Changes in ISC area, will influence the ISC resistance and core mass ratio.

In this study, the ISC radius is chosen as 40 mm, while the benchmark is 10 mm. From the previous discussion of section 2, for ISC radius of 10 mm and 40 mm, the geometric resistance ($R_{geo}$) is sufficient for calculation. The resulting electric resistances are 3.68 mΩ and 0.23 mΩ, respectively. The core mass ratio for our benchmark is 1%, and with the ISC radius increase to 40 mm, the core mass ratio will now increase from 1% to 16%. The increased mass ratio reflects the increased ISC area. The thermal resistance term $r_{c2m}$ also changes accordingly with the change of contact area for core to middle layer by Eq. 31. The simulation results with the different ISC radius are presented in the fourth subplot of FIG. 16A and FIG. 16B.

From the plot, we see that for Cathode to Anode ISC, at large ISC radius, the temperature distribution in the battery is more uniform. The difference between the three temperature states is small throughout the whole process of thermal runaway. A large ISC radius will make the ISC process seem to approach an external short circuit process. In this specific condition, the three-state thermal model predicts similar temper at dynamics as a lumped thermal model, and a lumped model would be accurate enough.

6 Conclusion

A model for Li-ion battery thermal runaway has been formulated using a three section discretization. The three sections correspond to three battery temperature states: the core temperature, middle layer temperature, and surface layer temperature. A side reaction model, an electrical model, a gas evolution model are also developed. The predicted gas pressure from the gas evolution model can be used to predict battery force during the early stage of thermal runaway. This force behavior indicates a potential method for early detection of thermal runaway. In this study, the prediction of gas pressure from the model is also compared with measured force behavior from experiments.

In the experiment, an internal short circuit is triggered at the core part of two pouch cells. Test One cell with 100% SOC triggered quick thermal runaway, while the other test cell, with 50% SOC, didn't go to thermal runaway. Tale model predicts the voltage, temperature, and force well for both cases when given the types of ISC mode for the ISC event. It shows that the three-section model can describe both an ISC induced thermal runaway event as well as an ISC event where shut down was caused by the burn-out of the ISC region.

The significant difference between our two tests is whether the ISC shuts down or leads to additional ISC after the burn-out of the initial ISC. This difference leads to two different results, a catastrophic thermal runaway or a safe, slow self-discharge process. A predictive model of the propagation of ISC regions will allow further prediction of the ISC mode based on cell parameters and short circuit areas, to predict whether the cell will go to thermal runaway or not.

We have demonstrated experimentally that force measurement can be useful for describing the initial stages of an ISC event regardless of whether or not thermal runaway follows. Combined with a three-section thermal model describing the chemical reactions of material break down, this measurement can be used for diagnosing ISC or thermal runaway events faster and with halter confidence levels than voltage and temperature sensing alone.

REFERENCES (1) Feng, X.; Ouyang, M.; Liu, X.; Lu, L.; Xia, Y.; He, X. *Energy Storage Materials* 2018, 10, 246-267.
(2) Spotnitz, R.; Franklin, J. *J. Power Sources* 2003, 113, 81-100.
(3) Abada, S.; Marlair, G.; Lecocq, A.; Petit, M.; Sauvant-Moynot, V.; Huet, F. *J. Power Sources* 2016, 306, 178-192.
(4) Cai, T.; Stefanopoulou, A.; Siegel, J. In *Dynamic Systems and Control Conference, ASME:* 2018.
(5) Hatchard, T. D.; MacNeil, D. D.; Basu, A.; Dahn, J. R. *J. Electrochem, Soc.* 2001, 148, A755.
(6) Coman, P. T.; Darcy, E. C.; Veje, C. T.; White, R. E. *J. Electrochem. Soc.* 2017, 164, A587-A593.
(7) Zhang, C.; Santhanagopalan, S.; Sprague, M. A.; Pesaran, A. A. *J. Power Sources* 2015, 299, 102-113.
(8) Kim, G. H.; Smith, K.; Ireland, J.; Pesaran, A. *J. Power Sources* 2012, 210, 243-253.
(9) Feng, X.; Weng, C.; Ouyang, M.; Sun, J. *Appl. Energy* 2016, 161, 168-180.
(10) Guo, R.; Lu, L.; Ouyrang, M.; Feng, X. *Sci. Rep.* 2016, 6, DOI: 10.1038/srep30248.
(11) Richard, M. N. *J. Electrochem, Soc.* 1999, 146, 2078.
(12) Kim, G. H.; Pesaran, A.; Spotnitz, R. *J. Power Sources* 2007, 170, 476-489.
(13) Ren, D.; Liu, X.; Feng, X.; Lu, L.; Ouyang, M.; Li, J.; He, X. *Applied Energy* 2018, 228, 633-644,
(14) Coman, P. T.; Rayman, S.; White, R. E. *Journal of Power Sources* 2016, 307, 56-62.
(15) Lammer, M.; Königseder, A.; Hacker, V. *RSC Advances* 2017, 7, 24425-24429.
(16) Pannala, S.; Zhang, M.; Siegel, J.; Less, G.; Stefanopoulou, A. In *ECS Meeting Abstracts,* 2018; Vol. MA2018-01 (3) 2151-2041, pp 368-368.
(17) Zhang, M.; Du, J.; Liu, L.; Stefanopoulou, A.; Siegel, J.; Lu, L.; He, X.; Xie, X.; Ouyang, M. *J. Electrochem. Soc.* 2017, 164, A3038-A3044.
(18) Finegan, D. P.; Darcy, E.; Keyser, M.; Tjaden, B.; Heenan, T. M.; Jervis, R.; Bailey, J. J.; Malik, R.; Vo, N. T.; Magdysyuk, O. V., et, al. *Energy & Envirnomental Science* 2017, 10, 1377-1388.
(19) RheinFeld, A.; Noel, A.; Wilhelm, J.; Kristou, A.; Pfrang, A.; Jossen, A. *Journal of The Electrochemical Society* 2018, 16, A3427-A3448.
(20) Yang, S.; Yan, B.; Wu, J.; Lu, L.; Zeng, K. *ACS applied materials interfaces* 2017, 9, 13999-11005.

(21) Lin, X.; Perez, H. E.; Siegel, J. B.; Stefanopoulou, A. G.; Li, Y.; Anderson, R. D.; Ding, Y.; Castanier, M. P. *IEEE Transactions on Control Systems Technology* 2013, 21, 1745-1755.
(22) Dong, T.; Peng, P.; Jiang, F. *Int. J. Heat Mass Transfer* 2018, 117, 261-272.
(23) Ping. P.; Wang, Q.; Huang, P.; Sun, J.; Chen, C. *Appl. Energy* 2014, 129, 261-273.
(24) Feng, X.; Fang, M.; He, X.; Ouyang, M.; Lu, L.; Wang, H.; Zhang, M. *J. Power Sources* 2014, 255, 294-301.
(25) Yang, H.; Bang, H.; Amine, K.; Prakash, J. *Journal of the Electrochemical Society* 2€1€15, 152, A73-A79.
(26) Knobloch, A.; Kapusta, C.; Karp, J.; Plotnikov, Y.; Siegel, J.; Stefanopoulou, A. *J. Electron. Packag.* 2018.
(27) Kim, C. S.; Yoo, J. S.; Jeong, K. M.; Kim, K.; Yi, C. W. *J. Power Sources* 2015, 289, 41-49.
(28) Zhang, M.; Liu, L.; Stefanopoulou, A.; Siegel, J.; Lu, L.; He, X.; Ouyang, M. *J. Electrochem. Soc.* 2017, 164, A2738-A2745.

NOMENCLATURE $\alpha^*$ Degree of conversion of cathode decomposition in layer $*$, —
$\alpha_0$ Initial degree of conversion of cathode decomposition, —
$\in_{ISC\_t1}$ State of internal short circuit of test one, —
$\in_{ISC\_t2}$ State of internal short circuit of test two, —
$\rho$ Electrical resistivity, $\Omega \cdot m$
$A_{an}$ Frequency factor for anode decomposition, $s^{-1}$
$A_{ca}$ Frequency factor for cathode decomposition, $s^{-1}$
$A_{SEI}$ Frequency factor for SEI decomposition, $s^{-1}$
C Capacity of the Flattery, Ah
$C_p$ Specific heat capacity of battery core, J kg$^{-1}$ K$^{-1}$
$C_{p,Al}$ Specific heat capacity of aluminum, J·kg$^{-1}$·K$^{-1}$
$E_{an}$ Activation energy for anode decomposition, J
$E_{ca}$ Activation energy for cathode decomposition, J
$E_{SEI}$ Activation energy for SEI decomposition, J
$h_a$ Enthalpy of anode decomposition, J·g$^{-1}$
$h_c$ Enthalpy of cathode decomposition, J·g$^{-1}$
$h_s$ Enthalpy of SEI decomposition, J·g$^-$
$I_{short}$ Short circuit current, A
$k_b$ Boltzmann constant, J·K$^{-1}$
$k_r$ resistance temperature coefficient, K
$m_{an}$ Mass of anode, g
$m_{ca}$ Mass of cathode, g
$m_{cell}$ Total mass of cell, g
$m^*$ Mass of battery layer $*$, g
$m_{fix}$ Mass of aluminum fixture, g
$\dot{Q}_{an}$ Heat rate of anode decomposition, W
$\dot{Q}_{ca}$ Heat rate of cathode decomposition, W
$\dot{Q}_{SEI}$ Heat rate of SEI decomposition, W
$\dot{Q}_{exo,*}$ Heat rate of exothermic side reactions in layer $*$, W
$\dot{Q}_{ohmic,*}$ Heat rate of short circuit ohmic heat in layer $*$, W
$r_{c2m}$ Equivalent thermal resistance between battery core and middle layer, K·W$^{-1}$
$r_{m2s}$ Equivalent thermal resistance between battery middle layer and surface layer, K·W$^{-1}$
$r_{s2a}$ Equivalent thermal resistance between battery surface layer and ambient, K·W$^{-1}$
$r_{fix}$ Equivalent thermal resistance between fixture and its ambient air, K·W$^{-1}$
$R_{cell}$ Cell electrical resistance, $\Omega$
$R_{3D}$ Electrical resistance calculated by 3D simulation, $\Omega$
$R_{geo}$ Geometric electrical resistance, $\Omega$
$R_{short}$ Short circuit resistance, $\Omega$
SOC State of Charge, —
SEI Solid Electrolyte Interface, —
$T^*$ Temperature of battery Layer $*$, ° C.
$T_{amb}$ Ambient temperature, ° C.
$T_{fix}$ Temperature of aluminum fixture, ° C.
U(SOC) Battery open circuit voltage vs SOC, V
$\chi_{an,*}$ Fraction of Li in anode in layer $*$, —
$\chi_{an,0}$ Fraction of Li in anode, —
$\chi_{SEI,*}$ Fraction of Li in SEI in layer $*$, —
$\chi_{SEI,0}$ Initial fraction of Li in SEI, —
$z^*$ Dimensionless SEI thickness in layer $*$, —
$z_0$ Initial dimensionless SEI thickness, —
$*_{core}$ subscripts: core layer, —
$*_{mid}$ subscripts: middle layer, —
$*_{surf}$ subscripts: surface layer, —
$\#_{an}$ subscripts: anode, —
$\#_{ca}$ subscripts: cathode, —
$\#_{SEI}$ subscripts: SEI, —

TABLE 1

| Pouch Cell Specification | |
|---|---|
| Cell Specification | Value |
| Anode Thickness (Double Sided with Current Collector) | 125 μm |
| Cathode Thickness (Double Sided with Current Collector) | 135 μm |
| Current Collector Thickness Anode | 13 μm |
| Current Collector Thickness Cathode | 13 μm |
| Separator Material | PE |
| Separator Porosity | 40% |
| Separator Thickness | 12 μm |
| Anode Active Material Mass Fraction (Graphite:PVDF) | 95:5 |
| Cathode Active Material Mass Fraction (NMC111:CB:PVDF) | 94:3:3 |
| Electrode Active Material Loading (Anode Single Side) | 8.55 g/cm$^2$ |
| Electrode Active Material Loading (Cathode Single Side) | 18.5 g/cm$^2$ |
| Number of Double Sided Electrode Sheets Anode | 15 |
| Number of Double Sided Electrode Sheets Cathode | 14 |
| Electrolyte | 1M LiPF$_6$ |
| Organic Solvent in Electrolyte | 2% EC:EMC (3:7) |

TABLE 2

| | | MODEL PARAMETERS | | |
|---|---|---|---|---|
| Parameter | Value | Unit | Source | Physical Meaning |
| $A_{an}$ | 2.5 × 10$^{13}$ | s$^{-1}$ | [6, 22] | Frequency factor for anode decomposition |
| $A_{ca}$ | 2.55 × 10$^{14}$ | s$^{-1}$ | [22] | Frequency factor for cathode decomposition |
| $A_{SEI}$ | 2.25 × 10$^{15}$ | s$^{-1}$ | [22] | Frequency factor for SET decomposition |
| $A_{c2m}$ | 628 | mm$^2$ | Approximated | Contact area for core to middle layer |
| $A_{m2s}$ | 1711 | mm$^2$ | Approximated | Contact area for middle layer to surface |
| C | 4.5 | Ah | Measured | Capacity of the Battery |

TABLE 2-continued

MODEL PARAMETERS

| Parameter | Value | Unit | Source | Physical Meaning |
|---|---|---|---|---|
| $C_p$ | 1100 | J kg$^{-1}$ K$^{-1}$ | [9] | Specific heat capacity of battery core |
| $C_{p,Al}$ | 897 | J kg$^{-1}$ K$^{-1}$ | Approximated | Specific heat capacity of aluminum fixture |
| $\Delta d_{c2m}$ | 1 | mm | Approximated | Core to middle layer mass center vertical distance |
| $\Delta d_{m2s}$ | 1.38 | mm | Approximated | Middle layer to surface mass center vertical distance |
| $E_{an}$ | 2.24 × 10$^{-19}$ | J | [6, 22] | Activation energy for anode decomposition |
| $E_{ca}$ | 2.64 × 10$^{-19}$ | J | [22] | Activation energy for cathode decomposition |
| $E_{SEI}$ | 2.24 × 10$^{-19}$ | J | [6, 22] | Activation energy for SET decomposition |
| $h_{an}$ | 1714 | J g$^{-1}$ | [6, 22] | Enthalpy of anode decomposition |
| $h_{ca}$ | 790 | J g$^{-1}$ | [22] | Enthalpy of cathode decomposition |
| $h_{SEI}$ | 257 | J g$^{-1}$ | [6, 22] | Enthalpy of SET decomposition |
| $M_{an}$ | 19.107 | g | Measured | Mass of anode |
| $m_{ca}$ | 36.56 | g | Measured | Mass of cathode |
| $m_{cell}$ | 103.75 | g | Measured | Total mass of cell |
| $m_{core}$ | 1.038 | g | Fitted | Mass of battery core |
| $m_{fix}$ | 1100 | g | Measured | Mass of Aluminum fixture |
| $m_{mid}$ | 4.67 | g | Fitted | Mass of battery middle layer |
| $m_{surf}$ | 98.04 | g | Estimated* | Mass of battery surface layer |
| $r_{c2m}$ | 3.18 | K · W$^{-1}$ | Estimated* | Thermal resistance between core and middle layer |
| $r_{m2s}$ | 1.61 | K · W$^{-1}$ | Estimated* | Thermal resistance between middle layer and surface |
| $r_{s2a}$ | 1.00 | K · W$^{-1}$ | Estimated | Thermal resistance between surface layer and fixture |
| $r_{fix}$ | 1.73 | K · W$^{-1}$ | Estimated | Thermal resistance between fixture and ambient air |
| $R_{1kHz}$ | 4.76 | mΩ | Measured | 1 kHz cell impedance at 20° C. |
| $R_{e,ref}$ | 0.0246 | mΩ | Approximated | Reference electrical resistance |
| $R_{short}$ | 3.68 | mΩ | Estimated* | Short circuit resistance |
| $SOC_0$ | 1 | — | Approximated | Initial State of Charge |
| $T_{amb}$ | 63 | ° C. | Measured | Ambient temperature |
| $T_{ref}$ | 1543 | K | [21] | Reference temperature |
| $x_{an,0}$ | 0.75 | — | [6, 22] | Initial fraction of Li in anode for fully charged cells |
| $x_{SEI,0}$ | 0.15 | — | [6, 22] | Initial fraction of Li in SEI |
| $z_0$ | 0.033 | — | [6, 22] | Initial dimensionless SEI thickness |
| $\alpha_0$ | 0.04 | — | [6, 22] | Initial degree of conversion of cathode decomposition |

*Thermal resistance $r_{c2m}$, $r_{m2s}$ are estimated by Eq. 31.
*$R_{short}$ is estimated by Eq. 12.
*$m_{surf}$ is estimated by conservation of mass ($m_{core}$ + $m_{mid}$ + $m_{surf}$ = $m_{cell}$).

Thus, the invention provides an electrical device including a battery cell and a battery management system that detects the risk or existence an internal short circuit in a battery cell, at least in part, on a pressure reading from a pressure sensor adjacent or contacting the battery cell. We have demonstrated that mechanical measurements can be used for early detection of thermal runaway induced by an internal short circuit in a battery cell.

Although the invention has been described in considerable detail with reference to certain embodiments, one skilled in the art will appreciate that the present invention can be practiced by other than the described embodiments, which have been presented for purposes of illustration and not of limitation. Therefore, the scope of the appended claims should not be limited to the description of the embodiments contained herein.

The citation of any document is not to be construed as an admission that it is prior art with respect to the present invention.

What is claimed is:

1. An electrical device comprising:
    a battery cell;
    a pressure sensor for measuring swelling forces of the battery cell, the pressure sensor converting levels of pressure into electrical signals, each electrical signal having a value corresponding to one of the levels of pressure, each of the levels of pressure corresponding to a swelling force of the battery cell sensed by the pressure sensor; and
    a battery management system including a controller in electrical communication with the pressure sensor, the controller being configured to execute a program stored in the controller to:
    (i) determine a reference swelling force corresponding to a reference electrical signal received from the pressure sensor at a reference time,
    (ii) determine a second swelling force corresponding to a second electrical signal received from the pressure sensor at a second time, the second time being later than the reference time, and
    (iii) determine whether a risk of internal short circuit of the battery cell exists by comparing a reference level of the reference electrical signal and a signal representative of the second electrical signal.

2. The device of claim 1 wherein:
    the controller is configured to execute the program stored in the controller to determine that a risk of internal short circuit of the battery cell exists when the signal representative of the second electrical signal exceeds the reference level of the reference electrical signal by a threshold amount.

3. The device of claim 1 further comprising:
    a voltage sensor wired to measure a voltage level of the battery cell, the controller being in electrical communication with the voltage sensor,
    a temperature sensor wired to measure a temperature level of the battery cell, the controller being in electrical communication with the temperature sensor, and
    a current sensor wired to measure a current level of the battery cell, the controller being in electrical communication with the current sensor,
    wherein the controller executes the program stored in the controller to determine whether a risk of internal short circuit of the battery cell exists by comparing a reference voltage level received from the voltage sensor at the reference time and a second voltage level received from the voltage sensor at the second time, wherein the controller executes the program stored in the controller to determine whether a risk of internal short circuit of the battery cell exists by comparing a reference temperature level received from the temperature sensor at the reference time and a second temperature level received from the temperature sensor at the second time, and wherein the controller executes the program stored in the controller to determine whether a risk of internal short circuit of the battery cell exists by comparing a reference current level received from the current sensor at the reference time and a second current level received from the current sensor at the second time.

4. An electrical device comprising:

a battery cell;

a pressure sensor for measuring swelling forces of the battery cell, the pressure sensor converting levels of pressure into electrical signals, each electrical signal having a value corresponding to one of the levels of pressure, each of the levels of pressure corresponding to a swelling force of the battery cell sensed by the pressure sensor; and a battery management system including a controller in electrical communication with the pressure sensor, the controller being configured to execute a program stored in the controller to:

(i) receive the electrical signals from the pressure sensor, (ii) compare a swelling force corresponding to each electrical signal received from the pressure sensor to a characteristic curve of measured or model predicted swelling forces of a reference battery cell of equal capacity and chemistry to the battery cell, the measured or model predicted swelling forces ranging from a first swelling force whenever the reference battery cell is at a first state of charge to a second swelling force whenever the reference battery cell is at a second state of charge, and (iii) determine a risk of internal short circuit of the battery cell based on the comparison of each electrical signal received from the pressure sensor to the characteristic curve.

5. The device of claim 4 wherein:

the controller is configured to execute the program stored in the controller to determine that a risk of internal short circuit of the battery cell exists based on receiving an electrical signal indicating that a swelling force of the battery cell exceeds a measured or model predicted swelling force on the characteristic curve of measured or model predicted swelling forces of the reference battery cell.

6. The device of claim 4 wherein:

a plurality of characteristic curves of measured or model predicted swelling forces corresponding to a plurality of different reference battery cells are stored in the controller, and the controller is configured to execute the program stored in the controller to compare a swelling force corresponding to each electrical signal received from the pressure sensor to one of the plurality of characteristic curves of measured or model predicted swelling forces of one of the plurality of different reference battery cells.

7. The device of claim 4 further comprising:

a voltage sensor wired to measure a voltage level of the battery cell, the controller being in electrical communication with the voltage sensor, a temperature sensor wired to measure a temperature level of the battery cell, the controller being in electrical communication with the temperature sensor, and a current sensor wired to measure a current level of the battery cell, the controller being in electrical communication with the current sensor, wherein the controller executes the program stored in the controller to determine whether a risk of internal short circuit of the battery cell exists by comparing a reference voltage level received from the voltage sensor at the reference time and a second voltage level received from the voltage sensor at the second time, wherein the controller executes the program stored in the controller to determine whether a risk of internal short circuit of the battery cell exists by comparing a reference temperature level received from the temperature sensor at the reference time and a second temperature level received from the temperature sensor at the second time, and wherein the controller executes the program stored in the controller to determine whether a risk of internal short circuit of the battery cell exists by comparing a reference current level received from the current sensor at the reference time and a second current level received from the current sensor at the second time.

8. A method for determining whether a risk of internal short circuit of a battery cell exists, the method comprising:

(a) using a pressure sensor to measure a reference level of pressure of the battery cell at a reference time, the pressure sensor converting the reference level of pressure into a reference electrical signal corresponding to a reference swelling force;

(b) using the pressure sensor to measure a second level of pressure of the battery cell at a second time, the pressure sensor converting the second level of pressure into a second electrical signal corresponding to a second swelling force, the second time being later than the reference time;

(c) comparing a reference level of the reference electrical signal and a signal representative of the second electrical signal; and (d) when the signal representative of the second electrical signal exceeds the reference level of the reference electrical signal by a threshold amount, determining that a risk of internal short circuit of the battery cell exists.

9. A method for determining whether a risk of internal short circuit of a battery cell exists, the method comprising:

(a) using a pressure sensor to measure swelling forces of the battery cell, the pressure sensor converting levels of pressure into electrical signals, each electrical signal having a value corresponding to one of the levels of pressure, each of the levels of pressure corresponding to a swelling force of the battery cell sensed by the pressure sensor; and (b) comparing a swelling force corresponding to each electrical signal from the pressure sensor to a characteristic curve of measured or model predicted swelling forces of a reference battery cell of equal capacity and chemistry to the battery cell, the measured or model predicted swelling forces ranging from a first swelling force whenever the reference battery cell is at a first state of charge to a second swelling force whenever the reference battery cell is at a second state of charge, and (c) when a swelling force of the battery cell exceeds a measured or model predicted swelling force on the characteristic curve of measured or model predicted swelling forces of the reference battery cell, determining that a risk of internal short circuit of the battery cell exists.

10. The method of claim 9 wherein the characteristic curve is measured swelling forces of the reference battery cell.

11. An electrical device comprising:
a battery cell;
a pressure sensor for measuring swelling forces of an electrode of the battery cell, the pressure sensor converting levels of pressure into electrical signals, each electrical signal having a value corresponding to one of the levels of pressure, each of the levels of pressure corresponding to a swelling force of the electrode of the battery cell sensed by the pressure sensor; and
a battery management system including a controller in electrical communication with the pressure sensor, the controller being configured to execute a program stored in the controller to:
(i) determine a reference swelling force corresponding to a reference electrical signal received from the pressure sensor at a reference time,
(ii) determine a second swelling force corresponding to a second electrical signal received from the pressure sensor at a second time, the second time being later than the reference time, and
(iii) determine whether gas generation by the battery cell exists by comparing a reference level of the reference electrical signal and a signal representative of the second electrical signal.

12. The device of claim 11 wherein:
the controller is configured to execute the program stored in the controller to determine that gas generation by the battery cell exists when the signal representative of the second electrical signal exceeds the reference level of the reference electrical signal by a threshold amount.

13. The device of claim 11 further comprising:
a voltage sensor wired to measure a voltage level of the battery cell, the controller being in electrical communication with the voltage sensor,
a temperature sensor wired to measure a temperature level of the battery cell, the controller being in electrical communication with the temperature sensor, and
a current sensor wired to measure a current level of the battery cell, the controller being in electrical communication with the current sensor,
wherein the controller executes the program stored in the controller to determine whether gas generation by the battery cell exists by comparing a reference voltage level received from the voltage sensor at the reference time and a second voltage level received from the voltage sensor at the second time,
wherein the controller executes the program stored in the controller to determine whether gas generation by the battery cell exists by comparing a reference temperature level received from the temperature sensor at the reference time and a second temperature level received from the temperature sensor at the second time, and
wherein the controller executes the program stored in the controller to determine whether gas generation by the battery cell exists by comparing a reference current level received from the current sensor at the reference time and a second current level received from the current sensor at the second time.

14. An electrical device comprising:
a battery cell;
a pressure sensor for measuring swelling forces of an electrode of the battery cell, the pressure sensor converting levels of pressure into electrical signals, each electrical signal having a value corresponding to one of the levels of pressure, each of the levels of pressure corresponding to a swelling force of the electrode of the battery cell sensed by the pressure sensor; and
a battery management system including a controller in electrical communication with the pressure sensor, the controller being configured to execute a program stored in the controller to:
(i) receive the electrical signals from the pressure sensor,
(ii) compare a swelling force corresponding to each electrical signal received from the pressure sensor to a characteristic curve of measured or model predicted swelling forces of a reference battery cell of equal capacity and chemistry to the battery cell, the measured or model predicted swelling forces ranging from a first swelling force whenever the reference battery cell is at a first state of charge to a second swelling force whenever the reference battery cell is at a second state of charge, and
(iii) determine whether gas generation by the battery cell exists based on the comparison of each electrical signal received from the pressure sensor to the characteristic curve.

15. The device of claim 14 wherein:
the controller is configured to execute the program stored in the controller to determine whether gas generation by the battery cell exists based on receiving an electrical signal indicating that a swelling force of the battery cell exceeds a measured or model predicted swelling force on the characteristic curve of measured or model predicted swelling forces of the reference battery cell.

16. The device of claim 14 wherein:
a plurality of characteristic curves of measured or model predicted swelling forces corresponding to a plurality of different reference battery cells are stored in the controller, and
the controller is configured to execute the program stored in the controller to compare a swelling force corresponding to each electrical signal received from the pressure sensor to one of the plurality of characteristic curves of measured or model predicted swelling forces of one of the plurality of different reference battery cells.

17. The device of claim 14 further comprising:
a voltage sensor wired to measure a voltage level of the battery cell, the controller being in electrical communication with the voltage sensor,
a temperature sensor wired to measure a temperature level of the battery cell, the controller being in electrical communication with the temperature sensor, and
a current sensor wired to measure a current level of the battery cell, the controller being in electrical communication with the current sensor,
wherein the controller executes the program stored in the controller to determine whether gas generation by the battery cell exists by comparing a reference voltage level received from the voltage sensor at the reference time and a second voltage level received from the voltage sensor at the second time, wherein the controller executes the program stored in the controller to determine whether gas generation by the battery cell exists by comparing a reference temperature level received from the temperature sensor at the reference time and a second temperature level received from the temperature sensor at the second time, and wherein the controller executes the program stored in the controller to determine whether gas generation by the battery cell exists by comparing a reference current level received from the current sensor at the reference time and a second current level received from the current sensor at the second time.

18. A method for detecting gas generation by a battery cell, the method comprising:
   (a) using a pressure sensor to measure a reference level of pressure of an electrode of the battery cell at a reference time, the pressure sensor converting the reference level of pressure into a reference electrical signal corresponding to a reference swelling force;
   (b) using the pressure sensor to measure a second level of pressure of the electrode of the battery cell at a second time, the pressure sensor converting the second level of pressure into a second electrical signal corresponding to a second swelling force, the second time being later than the reference time;
   (c) comparing a reference level of the reference electrical signal and a signal representative of the second electrical signal; and
   (d) when the signal representative of the second electrical signal exceeds the reference level of the reference electrical signal by a threshold amount, determining that gas generation by the battery cell exists.

19. A method for detecting gas generation by a battery cell, the method comprising:
   (a) using a pressure sensor to measure swelling forces of an electrode of the battery cell, the pressure sensor converting levels of pressure into electrical signals, each electrical signal having a value corresponding to one of the levels of pressure, each of the levels of pressure corresponding to a swelling force of the electrode of the battery cell sensed by the pressure sensor; and
   (b) comparing a swelling force corresponding to each electrical signal from the pressure sensor to a characteristic curve of measured or model predicted swelling forces of a reference battery cell of equal capacity and chemistry to the battery cell, the measured or model predicted swelling forces ranging from a first swelling force whenever the reference battery cell is at a first state of charge to a second swelling force whenever the reference battery cell is at a second state of charge, and
   (c) when a swelling force of the battery cell exceeds a measured or model predicted swelling force on the characteristic curve of measured or model predicted swelling forces of the reference battery cell, determining that gas generation by the battery cell exists.

20. The method of claim 19 wherein the characteristic curve is measured swelling forces of the reference battery cell.

* * * * *

UNITED STATES PATENT AND TRADEMARK OFFICE
CERTIFICATE OF CORRECTION

PATENT NO. : 11,355,824 B2
APPLICATION NO. : 16/410714
DATED : June 7, 2022
INVENTOR(S) : Stefanopoulou et al.

It is certified that error appears in the above-identified patent and that said Letters Patent is hereby corrected as shown below:

In the Specification

Column 22, Line 16, "addition" should be --additional--.

Column 22, Line 18, "tire" should be --fire--.

Column 22, Line 44, "the cell" should be --the whole cell--.

Column 22, Line 45, "stowed" should be --showed--.

Column 22, Line 56, "of ISC" should be --of the ISC--.

Column 23, Line 4, "read" should be --reaction--.

Column 23, Line 20, "During stage" should be --During the early stage--.

Column 23, Line 51, "w ax" should be --with--.

Column 23, Line 64, "Smith" should be --with--.

Column 23, Line 66, "title" should be --fine--.

Column 26, Line 63, "a an it current" should be --a unit current--.

Column 27, Line 35, "diffusivity ion" should be --diffusivity of ion--.

Column 28, Line 12, "Assumption" should be --Assumptions--.

Column 28, Line 52, "temperature layer" should be --temperature in layer--.

Signed and Sealed this
Eighteenth Day of October, 2022

Katherine Kelly Vidal
*Director of the United States Patent and Trademark Office*

CERTIFICATE OF CORRECTION (continued)
U.S. Pat. No. 11,355,824 B2

Column 30, Line 29, "(SEI) layer" should be --2.5 Gas--.

Column 30, Line 32, "react ion" should be --reaction--.

Column 30, Line 36, "Lainmer" should be --Lammer--.

Column 30, Line 36, "veining" should be --venting--.

Column 30, Line 40, "the gas" should be --the initial gas--.

Column 30, Line 41, "which important" should be --which is important--.

Column 30, Lines 41-42, "of potential" should be --of a potential--.

Column 31, Line 56, "the e volumes" should be --the relative volumes--.

Column 31, Line 63, "#45" should be --#5--.

Column 32, Line 2, "heat conduct conductivity" should be --heat conductivity--.

Column 32, Line 13, "is thermal" should be --is the thermal--.

Column 32, Line 23, "which correspond" should be --which will correspond--.

Column 32, Line 62, "drop out recovering" should be --drop without recovering--.

Column 32, Line 66, "caused a ISC" should be --caused a massive ISC--.

Column 33, Line 8, "tinge" should be --time--.

Column 33, Line 27, "gill" should be --will--.

Column 33, Line 31, "temper" should be --temperature--.

Column 34, Line 8, "recommended the" should be --recommended if the--.

Column 34, Line 8, "point" should be --points--.

Column 34, Line 26, "Compared the with" should be --Compared with the--.

Column 34, Line 37, "front" should be --from--.

Column 34, Line 55, "care" should be --core--.

Column 34, Line 64, "processed" should be --progressed--.

Column 36, Line 7, "addition" should be --additional--.

Column 36, Line 65, "every" should be --even--.

Column 37, Line 43, "temper at" should be --temperature--.

Column 37, Line 61, "Tale" should be --The--.

Column 38, Line 16, "halter" should be --higher--.